(12) United States Patent
Cheng et al.

(10) Patent No.: US 12,713,661 B2
(45) Date of Patent: Aug. 18, 2026

(54) TRANSISTOR, SEMICONDUCTOR DEVICE, AND SEMICONDUCTOR STRUCTURE WITH 2D INTERMEDIATE CONTACT PATTERN

(71) Applicant: Taiwan Semiconductor Manufacturing Company, Ltd., Hsinchu (TW)

(72) Inventors: Chao-Ching Cheng, Hsinchu City (TW); Jui-Chien Huang, Hsinchu City (TW); Yi-Tse Hung, Hsinchu (TW); Shih Hao Wang, Taipei City (TW); Han Wang, Hsinchu (TW); Szuya Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 98 days.

(21) Appl. No.: 18/782,034

(22) Filed: Jul. 24, 2024

(65) Prior Publication Data

US 2024/0379874 A1 Nov. 14, 2024

Related U.S. Application Data

(62) Division of application No. 17/574,555, filed on Jan. 13, 2022.

(60) Provisional application No. 63/219,833, filed on Jul. 9, 2021.

(51) Int. Cl.

*H10D 30/67* (2025.01)
*H10D 86/00* (2025.01)
*H10D 86/01* (2026.01)

(52) U.S. Cl.

CPC ..... *H10D 30/6757* (2025.01); *H10D 30/6729* (2025.01); *H10D 86/00* (2025.01); *H10D 86/01* (2025.01); *H10D 30/673* (2025.01)

(58) Field of Classification Search

CPC .......... H10D 30/6757; H10D 30/6708; H10D 30/6729; H10D 86/00; H10D 86/01; H10D 30/673; H10D 30/6755; H10D 30/675; H10D 30/47; H10D 62/82; H10D 64/685; H10D 99/00; H10D 84/02; H10D 84/85

See application file for complete search history.

(56) References Cited

U.S. PATENT DOCUMENTS 10,872,973 B2 * 12/2020 Lin .................... H10D 48/362
2018/0012962 A1 * 1/2018 Yeh .................... H10D 62/151
2021/0057558 A1 * 2/2021 Pritchard .......... H10D 30/0275

* cited by examiner

*Primary Examiner* — Chad M Dicke
*Assistant Examiner* — Jeremy Daniel Watts
(74) *Attorney, Agent, or Firm* — JCIPRNET

(57) ABSTRACT

A transistor includes a gate structure, a spacer laterally surrounding the gate structure. a channel layer underlying the gate structure and comprising a two-dimensional (2D) material, and a source/drain contact laterally separated from the gate structure by the spacer and laterally coupled to the channel layer.

20 Claims, 61 Drawing Sheets

1031
1021
1011
12
11
920T
111
112'
922
11P
11N

910'
914
111
112'
922
112'
111
914
914t
1021
12
11
11P
11N
912

9231
920T
111 112' 111
922
112' 111
1021
12
11
11P
11N 104
1022g
1022
12
11
923
920T
112' 111
922
111 112'
11P
112' 111
922
111 112'
920T
9231
1021
12
11
11N 104
1022
12
11
920T
111
112'
922
11P
11N
1021

9251
920T
111
112'
922
104
1022
12
11
11P
11N
1021

910
910T'
1111
9231'
2032
2042
201
12
11
11P
11N 910
910T'
1111
232T
201a
204s
203s
2032
2042
201
232
12
11
11P
9231'
11N 910
232
2032
2042
201
12
11
910T'
1111
9231"
11P
11N 914
912
2032
2042
201
232
12
11
11P
11N
910'
914t
111
112'
922

100H
230D
232
233'
234'
236'
232a
232
203
204
201
12
11
111 112
236'
233' 234'
220N
11N
220P
11P

TRANSISTOR, SEMICONDUCTOR DEVICE, AND SEMICONDUCTOR STRUCTURE WITH 2D INTERMEDIATE CONTACT PATTERN

CROSS-REFERENCE TO RELATED APPLICATION

This application is a divisional application of U.S. application Ser. No. 17/574,555, filed on Jan. 13, 2022, now pending. The application Ser. No. 17/574,555 claims the priority benefit of U.S. provisional applications Ser. No. 63/219,833, filed on Jul. 9, 2021. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
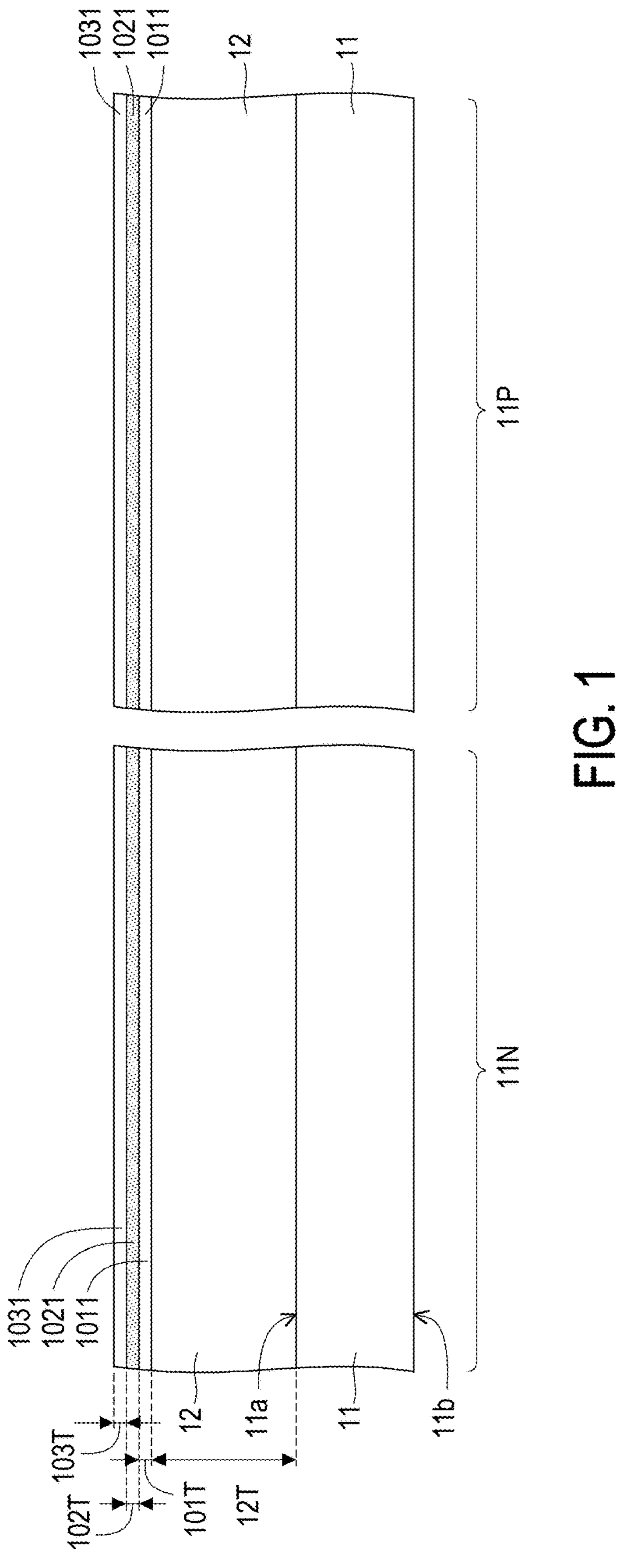
FIGS. 1-18 are cross-sectional views schematically illustrating various stages of a manufacturing method of a semiconductor device over a semiconductor substrate according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-18 are cross-sectional views schematically illustrating various stages of a manufacturing method of a semiconductor device over a semiconductor substrate according to some embodiments. Referring to FIG. 1, a semiconductor substrate 11 including a first region 11N and a second region 11P is provided. In some embodiments, the first region 11N is for forming n-type devices (e.g., n-type field effect transistors (FETs)) thereover, while the second region 11P is for forming p-type devices (e.g., p-type FETs) thereover. Alternatively, both the first region 11N and the second region 11P are used to form the same type of devices, such as both regions being for n-type devices or p-type devices. In some embodiments, the semiconductor substrate 11 includes silicon substrate (doped or undoped) or an active layer of a semiconductor-on-insulator (SOI) substrate. The semiconductor substrate 11 may include other semiconductor materials (e.g., germanium), a compound semiconductor material (e.g., SiC, GaAs, GaP, InP, InAs, and/or InSb), alloy semiconductor material (e.g., SiGe, GaAsP, AlInAs, AlGaAs, GaInAs, GaInP, and/or GaInAsP), or combinations thereof. Other substrate (e.g., a multi-layered substrate or a gradient substrate) may be used.

In some embodiments, a bottom dielectric layer 12 is formed on the semiconductor substrate 11 on both of the first region 11N and the second region 11P. The semiconductor substrate 11 may have a first surface 11*a* and a second surface 11*b* opposite to each other, and the bottom dielectric layer 12 may be formed on the first surface 11*a*. The bottom dielectric layer 12 may provide isolation between the semiconductor substrate 11 and the overlying device structure. In some embodiments, the bottom dielectric layer 12 includes a nitride (e.g., SiN), an oxide (e.g., $SiO_2$), an oxynitride (e.g., silicon oxynitride), high-k dielectrics (e.g., $Al_2O_3$, $HfO_2$, or the like), combinations thereof, and/or the like, and may be formed by chemical vapor deposition (CVD), physical vapor deposition (PVD), atomic layer deposition (ALD), or the like. A thickness of the bottom dielectric layer 12 may be chosen to optimize the contrast of the overlying layer with respect to the underlying semiconductor substrate 11. For example, the thickness 12T of the bottom dielectric layer 12 is in a range of about 10 nm to about 10 μm.

In some embodiments, a layer of an intermediate contact material 1021 is formed over the bottom dielectric layer 12 overlying the semiconductor substrate 11 on both of the first region 11N and the second region 11P. For example, layers of a lower insulating material 1011, the intermediate contact material 1021, and an upper insulating material 1031 are sequentially formed over the semiconductor substrate 11 on both of the first region 11N and the second region 11P. Alternatively, the lower insulating material 1011 and/or the upper insulating material 1031 may be omitted as will be described later in other embodiments.

In some embodiments, the lower insulating material 1011 has insulating property to electrically separate the underlying layer from the overlying layer. The lower insulating material 1011 may be formed on the bottom dielectric layer 12 to enhance or improve the adhesion of the overlying layer (e.g., the intermediate contact material 1021). For example, the lower insulating material 1011 includes oxide-based material (e.g., $SiO_x$, $AlO_x$, etc.), insulating two-dimensional (2D) material (e.g., boron nitride (BN) or the like), or other suitable insulating material(s). The lower insulating material 1011 may be formed by CVD, PVD, ALD, or the like. The thickness 101T of the lower insulating material 1011 may be in a range of about 0.5 nm to about 50 nm. In some embodiments, the material of the upper insulating material 1031 may be similar to that of the lower insulating material 1011 and may have insulating property to electrically separate the intermediate contact material 1021 from the subsequently-formed structure. For example, the upper insulating material 1031 includes a crystalline layer (e.g., BN) and may be produced through the transfer process. In some embodiments, the upper insulating material 1031 includes a dielectric material (e.g., aluminum oxide ($Al_2O_3$)) and may be formed through ALD or other suitable deposition process. The thickness 103T of the upper insulating material 1031 may be in a range of about 0.5 nm to about 50 nm.

In some embodiments, the intermediate contact material 1021 overlying the lower insulating material 1011 is capped with the upper insulating material 1031. The intermediate contact material 1021 may be (or include) 2D material(s) with Dirac cones, such as monolayer(s) of graphene, monolayer(s) of $Be_3C_2$, and/or the like. It is understood that 2D materials are monolayers of material held together by chemical bonds. For example, one or a few monolayers of graphene may be produced by a variety of methods such as epitaxial growth, CVD-growth, and mechanical exfoliation, among others. In some embodiments, the grown graphene layer is transferred (e.g., from a growth substrate or from the bulk graphite source) onto the lower insulating material 1011 to become the intermediate contact material 1021 overlying the lower insulating material 1011. For example, the intermediate contact material 1021 extends over an upper surface of the lower insulating material 1011 at a wafer level. The thickness 102T of the intermediate contact material 1021 may be in a range of about 0.5 nm to about 5 nm.

Figure 2:
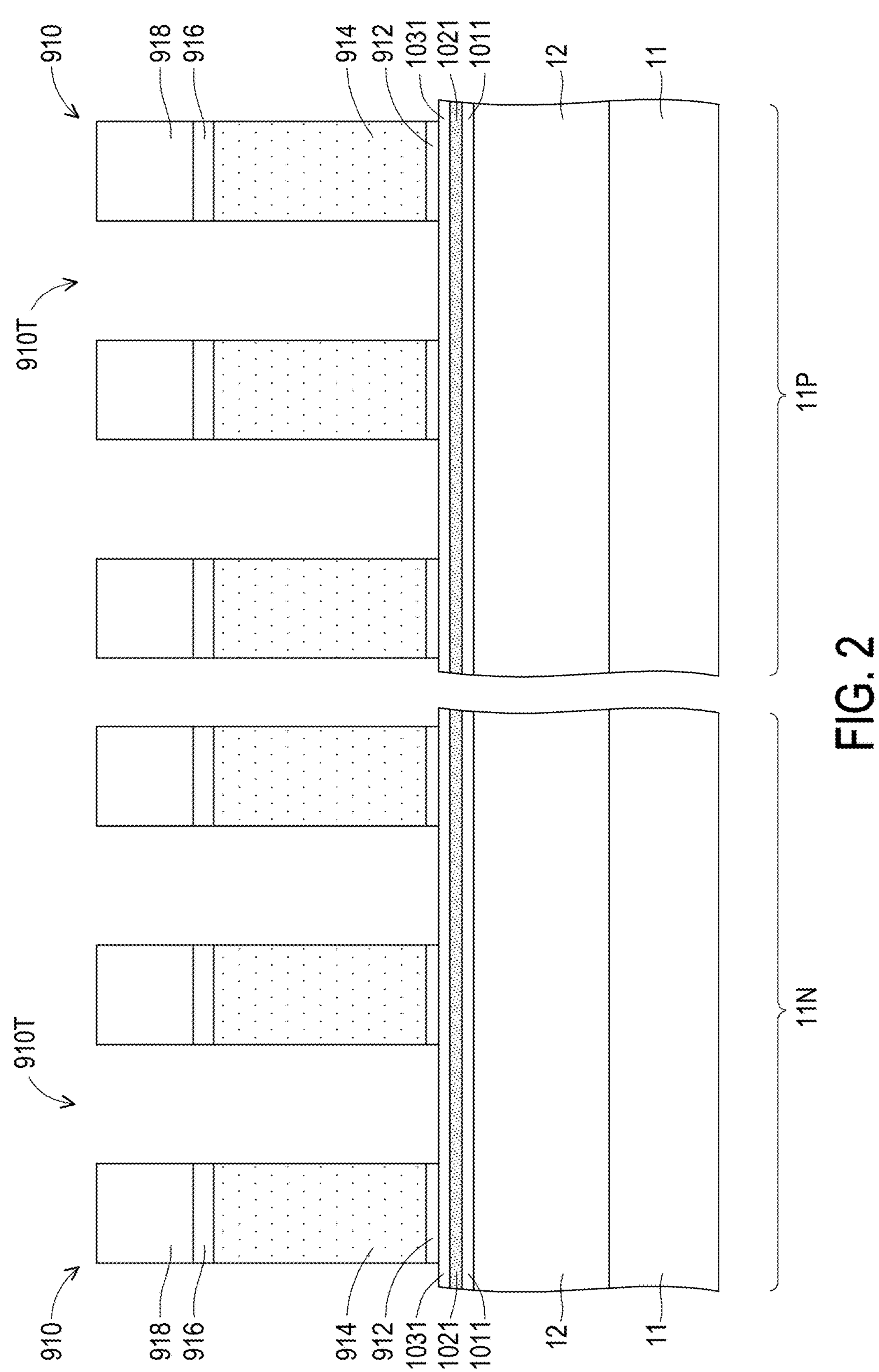

Referring to FIG. 2 and with reference to FIG. 1, a plurality of dummy structures 910 may be formed over the semiconductor substrate 11 on the first region 11N and the second region 11P. For example, the dummy structures 910 exhibit fin-shaped structures, and a plurality of first trenches 910T may separate the dummy structures 910 from one another. In some embodiments, the respective dummy structure 910 includes a first dielectric layer 912 overlying the upper insulating material 1031, a semiconductor layer 914 overlying the first dielectric layer 912, and an etch stop layer 916 overlying the semiconductor layer 914, and a second dielectric layer 918 overlying the etch stop layer 916.

The dummy structures 910 may be formed by suitable fabrication techniques. For example, layers of first dielectric material, semiconductor material, etch stop material, and second dielectric material are sequentially deposited over the intermediate contact material 1021 though any suitable deposition process such as CVD, PVD, ALD, or the like. For example, the first dielectric material and the second dielectric material may include an oxide or other suitable dielectric material(s). In some embodiments, before the deposition of the first dielectric material, additional layer of etch stop material (e.g., SiON) may be formed on the upper insulating material 1031 to separate the upper insulating material 1031 made of oxide-based material from the first dielectric material. The semiconductor material overlying the first dielectric material may include any suitable semiconductor material (e.g., polysilicon or the like). The etch stop material may include SIN, SiCN, SiCO, a combination thereof, etc. Next, a portion of the layers of second dielectric material, etch stop material, semiconductor material, and first dielectric material may be removed to form the first trenches 910T which spatially separates two adjacent dummy structures 910 from one another. For example, the first trenches 910T may be formed by one or a few etching processes such as a dry etch (e.g., reactive ion etch (RIE), inductively coupled plasma (ICP) etch, electron cyclotron resonance (ECR) etch, neutral beam etch (NBE), and/or the like. Other suitable patterning process may be used to form the first trenches 910T.

Figure 3:
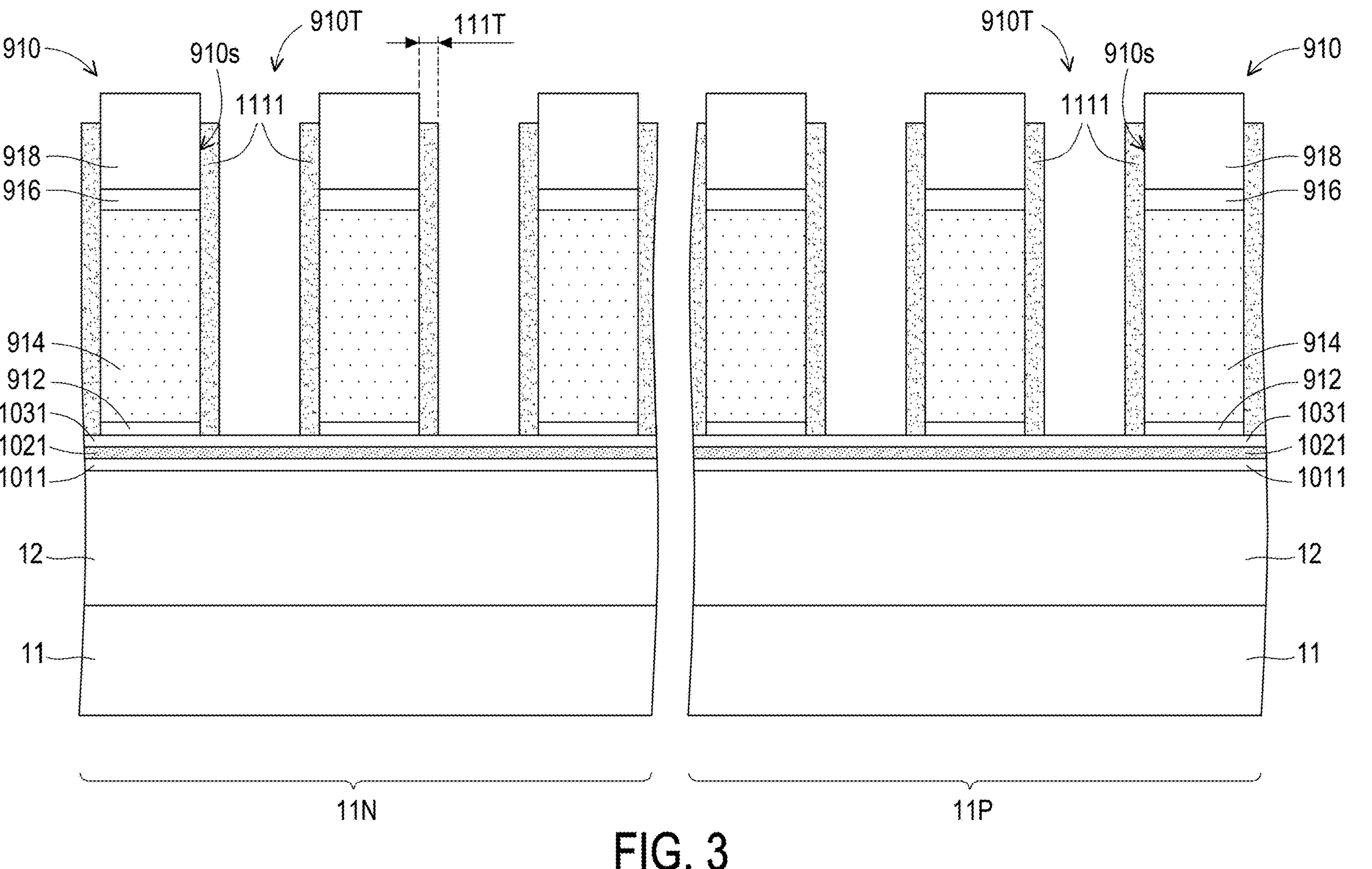

Referring to FIG. 3 and with reference to FIG. 2, a plurality of spacer films 1111 may be formed to extend along sidewalls 910*s* of the dummy structures 910. The spacer films 1111 may include oxide-based material(s) (e.g., SiON, SiCON, or the like). In some embodiments, the spacer films 1111 include low-k dielectric material(s) such as SiOCN, SiCN, and/or the like. The spacer films 1111 may have a dielectric constant (k) value of lower than about 3.5, and more lower than about 3.2, or even lower than 2.5. In some embodiments, the spacer films 1111 are referred to as low-k spacers. Other suitable spacer material(s) may be used. In some embodiments, the respective spacer film 111 formed on the sidewall 910*s* of the corresponding dummy structure 910 may have a thickness 1111T ranging from about 2 nm to about 10 nm.

The spacer films 1111 may be formed by depositing the spacer material on the dummy structures 910 and in the first trenches 910T on the first region 11N and the second region 11P, and removing a portion of the spacer material within each first trench 910T to form the spacer films 1111 at least partially covering the sidewalls 910*s* of the dummy structures 910. For example, the etching process (e.g., a dry etch) is performed to remove the portion of the spacer material. In some embodiments, a top portion of the sidewall 910*s* of the respective dummy structure 910 (e.g., a top portion of the sidewall of the second dielectric layer 918) may be accessibly revealed after the etching process. In some embodiments, portions of the top surface of the upper insulating material 1031 may remain accessibly exposed by the first trenches 910T.

Figure 4:
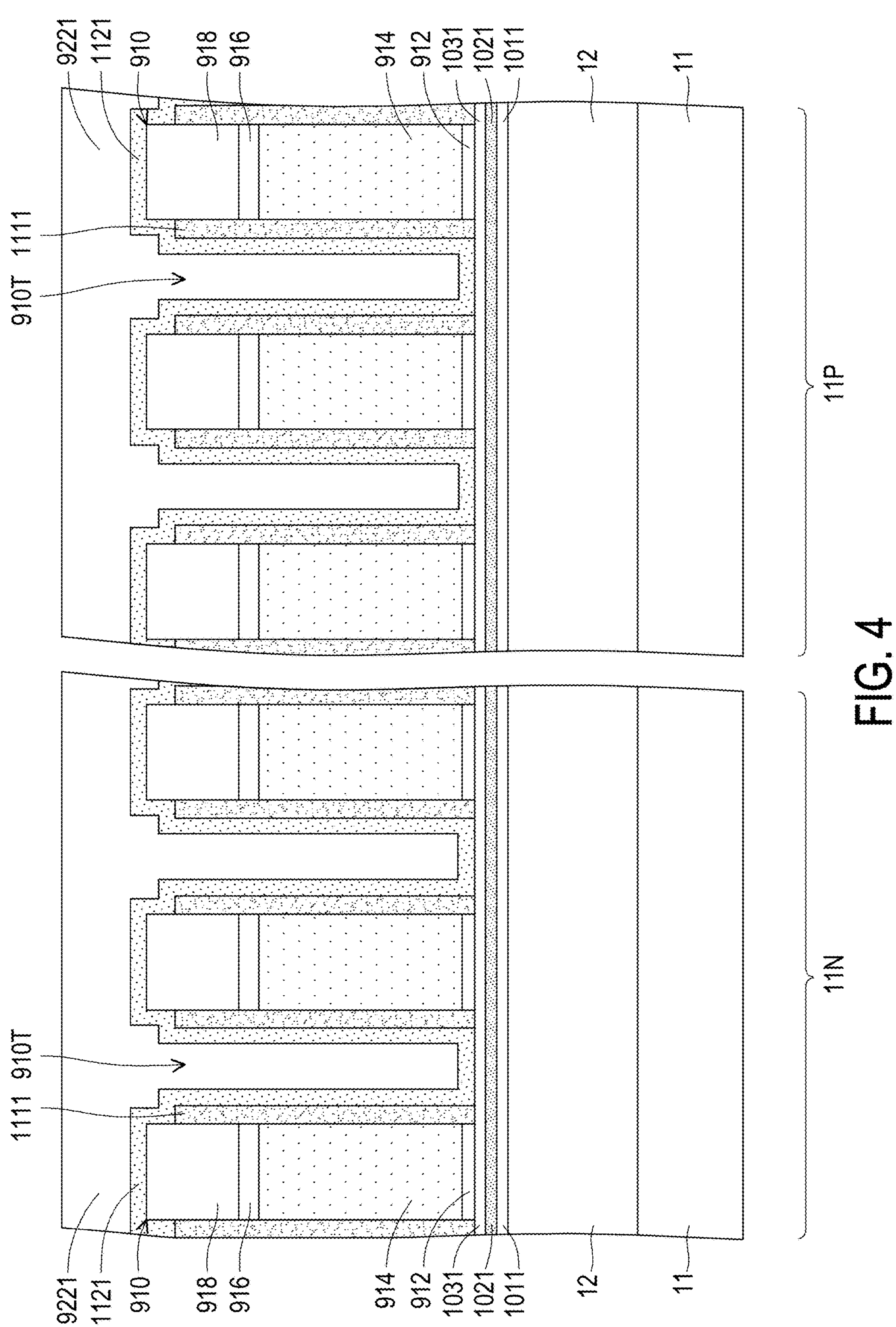

Referring to FIG. 4 and with reference to FIG. 3, a contact etch stop material 1121 may be formed on the dummy structures 910 and the spacer films 1111. The contact etch stop material 1121 may also be formed on the upper insulating material 1031 within the first trenches 910T. For example, the contact etch stop material 1121 includes nitride-based material (e.g., SiN, SiCN, or the like), a carbide (e.g., SiC), a combination thereof, or other suitable etch stop material(s). The contact etch stop material 1121 may blanketly cover the portions of the dummy structures which are unmasked by the spacer films 1111 and may be blanketly formed in the first trenches 910T. For example, the contact etch stop material 1121 extends to cover the top surfaces and the sidewalls of the spacer films 1111 and may further cover the portion of the top surface of the upper insulating material 1031 which is not covered by the spacer films 1111 in the respective first trench 910T. Next, a first sacrificial material 9221 may be formed on the contact etch stop material 1121. For example, the first sacrificial material 9221 includes an oxide (e.g., silicon oxide), a nitride (e.g., silicon nitride), and/or any suitable electrically insulting material. The first sacrificial material 9221 may be considered sacrificial in the sense that it may be ultimately removed, according to some embodiments.

Figure 5:
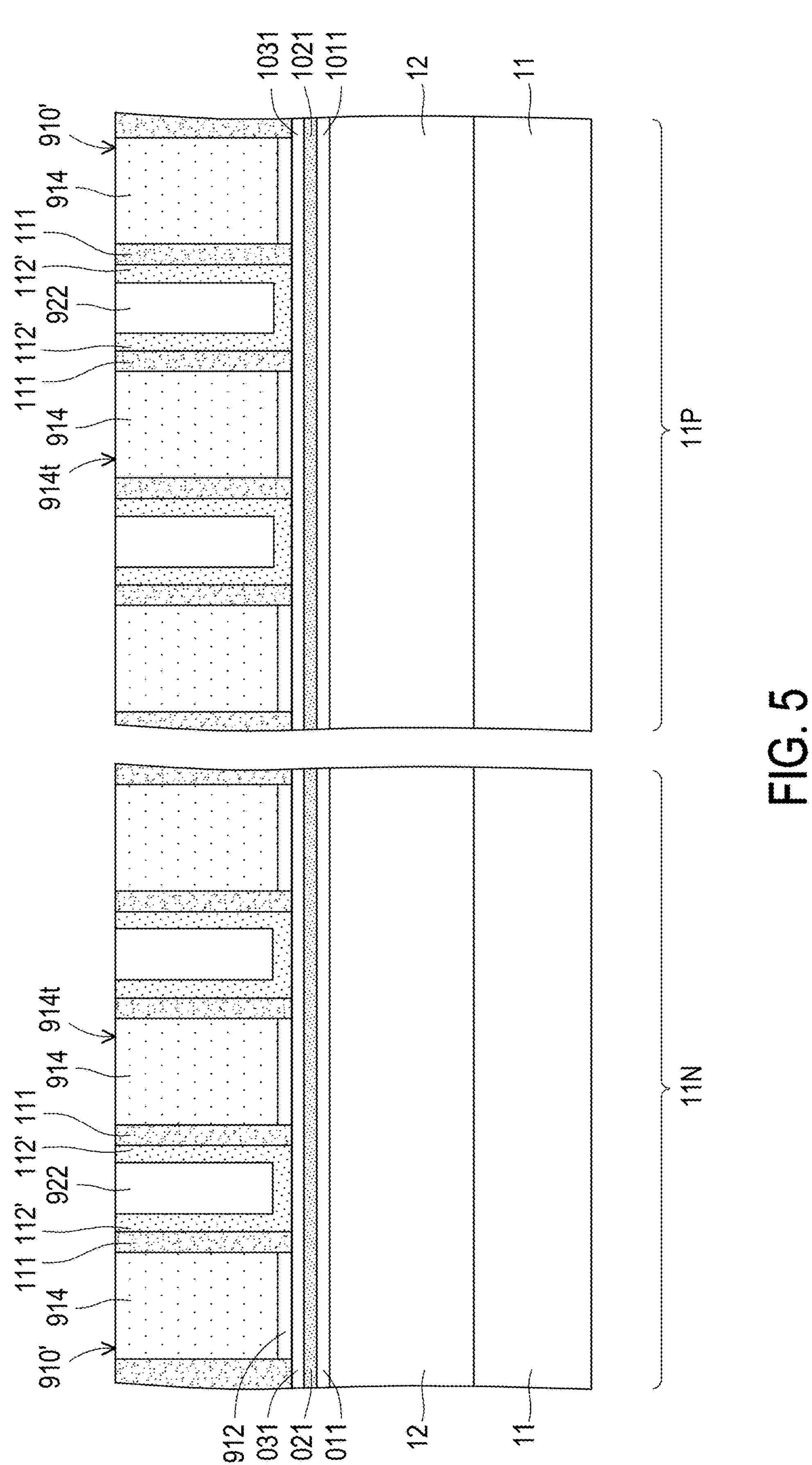

Referring to FIG. 5 and with reference to FIG. 4, one or a few planarization processes may be performed to form the respective dummy structure 910' having the semiconductor layer 914 with the accessibly exposed top surface 914*t*. For example, the planarization process includes a chemical mechanical polishing (CMP) process, a mechanical grinding process, an etching process, a combination thereof, or the like. In some embodiments, a first planarization process is performed on the first sacrificial material 9221 until the top surface of the etch stop layer 916 is accessibly revealed. For example, the second dielectric layer 918 overlying the etch stop layer 916, the spacer films 1111 covering the sidewalls of the second dielectric layer 918, and portions of the contact etch stop material 1121 and the first sacrificial material 9221 which sequentially overlying the second dielectric layer 918 may be removed during the first planarization process.

In some embodiments, a second planarization process may be performed on the etch stop layer 916 until the top surface 914*t* of the semiconductor layer 914 of the respective dummy structure 910' is accessibly revealed. For example, the etch stop layer 916 and a portion of the spacer films 1111 which covers the sidewall of the etch stop layer 916 may be removed during the second planarization process. The remaining portions of the spacer films 1111, the contact etch stop material 1121, and the first sacrificial material 9221 may be respectively viewed as a spacer 111, a contact etch stop film 112', and a first sacrificial layer 922. In some embodiments, top surfaces of the spacer 111, the contact etch stop film 112', and the first sacrificial layer 922 are substantially leveled (e.g., coplanar) with the top surface 914*t* of the semiconductor layer 914, within process variations.

Figure 6:
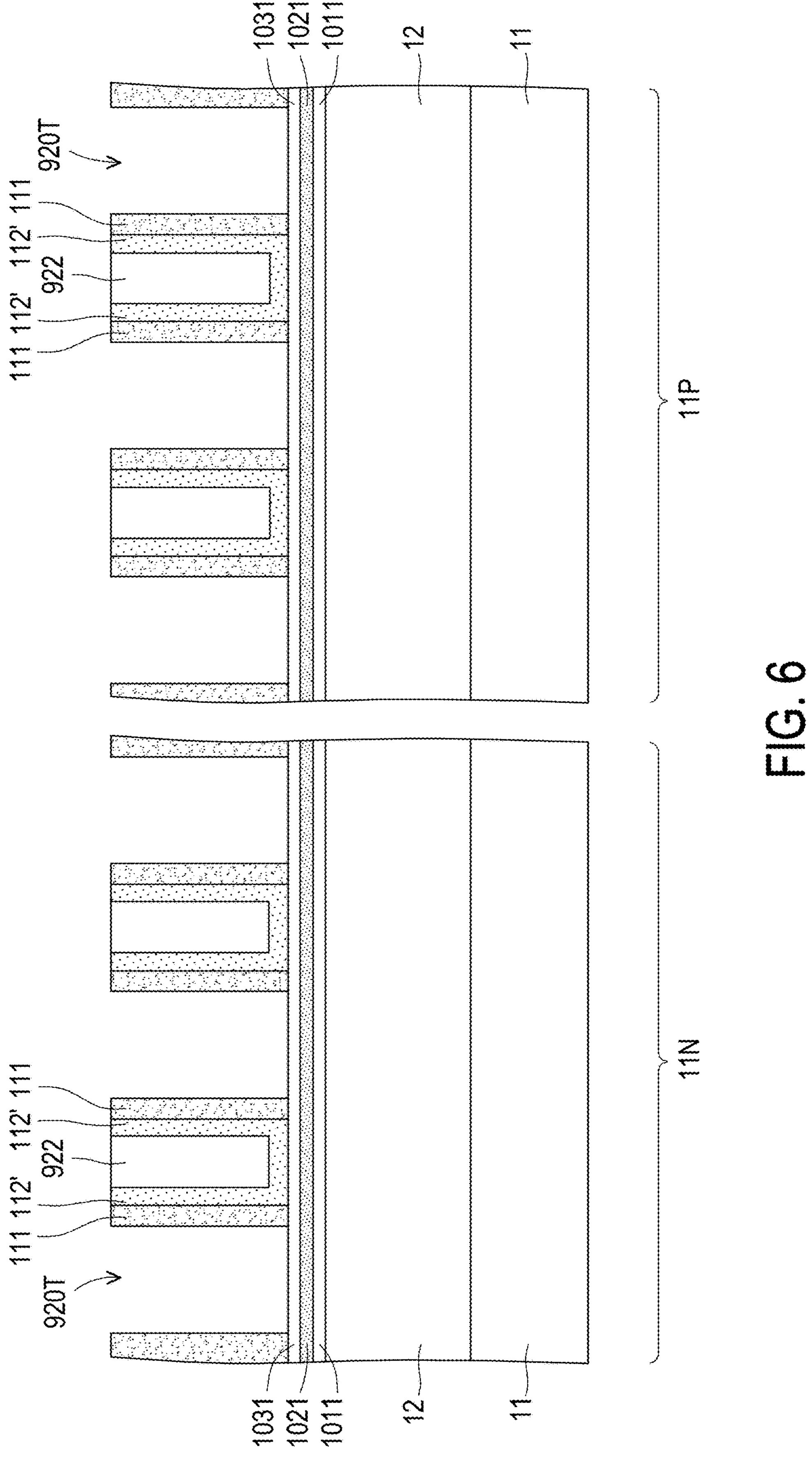

Referring to FIG. 6 and with reference to FIG. 5, the dummy structures 910' may be removed to form second trenches 920T. For example, one or a few etching processes may be performed to remove the semiconductor layer 914 and the underlying first dielectric layer 912. For example, the etching process includes an anisotropic etching process (e.g., dry etch) or an isotropic etching process (e.g., wet etch). In some embodiments, a dry etch process is first performed to remove the most part of the semiconductor layer 914, and then a wet etch process is performed to remove the residues of the semiconductor layer 914. Subsequently, the first dielectric layer 912 may be removed by the etching process until the upper insulating material 1031 is accessibly revealed.

Figure 7:
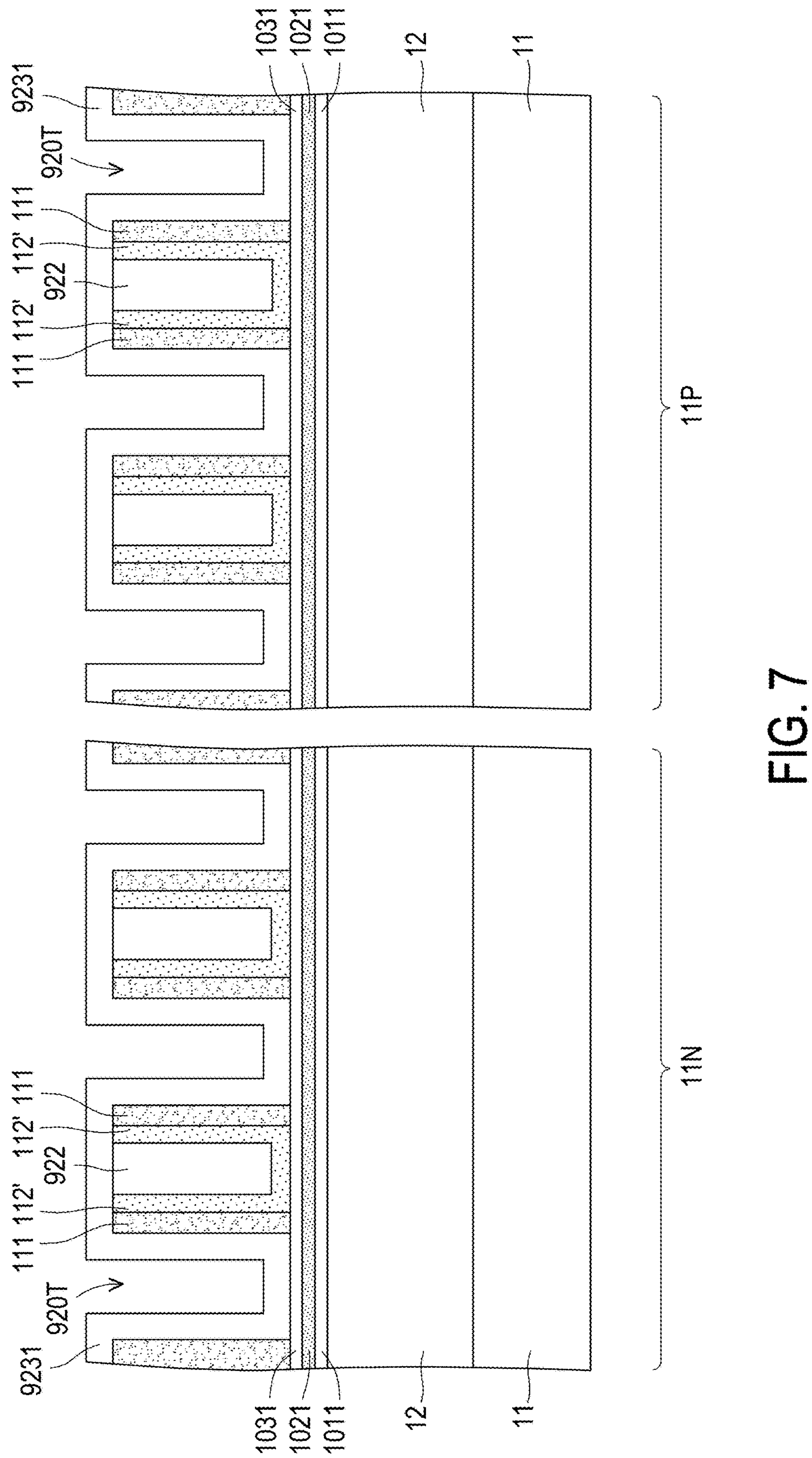

Referring to FIG. 7 and with reference to FIG. 6, a second sacrificial material 9231 may be formed on the remaining structures on both of the first region 11N and the second region 11P. In some embodiments, the second sacrificial material 9231 is blanketly formed on the remaining structures and in the second trenches 920T. The second sacrificial material 9231 may cover the sidewalls of the spacers 111 and the top surface of the upper insulating material 1031. In some embodiments, the second sacrificial material 9231 may also cover top surfaces of the spacers 111, the contact etch stop film 112', and the first sacrificial layer 922. For example, the second sacrificial material 9231 includes suitable dielectric material, metal oxide material, and/or the like, and may be formed by CVD, PVD, ALD, or any suitable deposition process.

Figure 8:
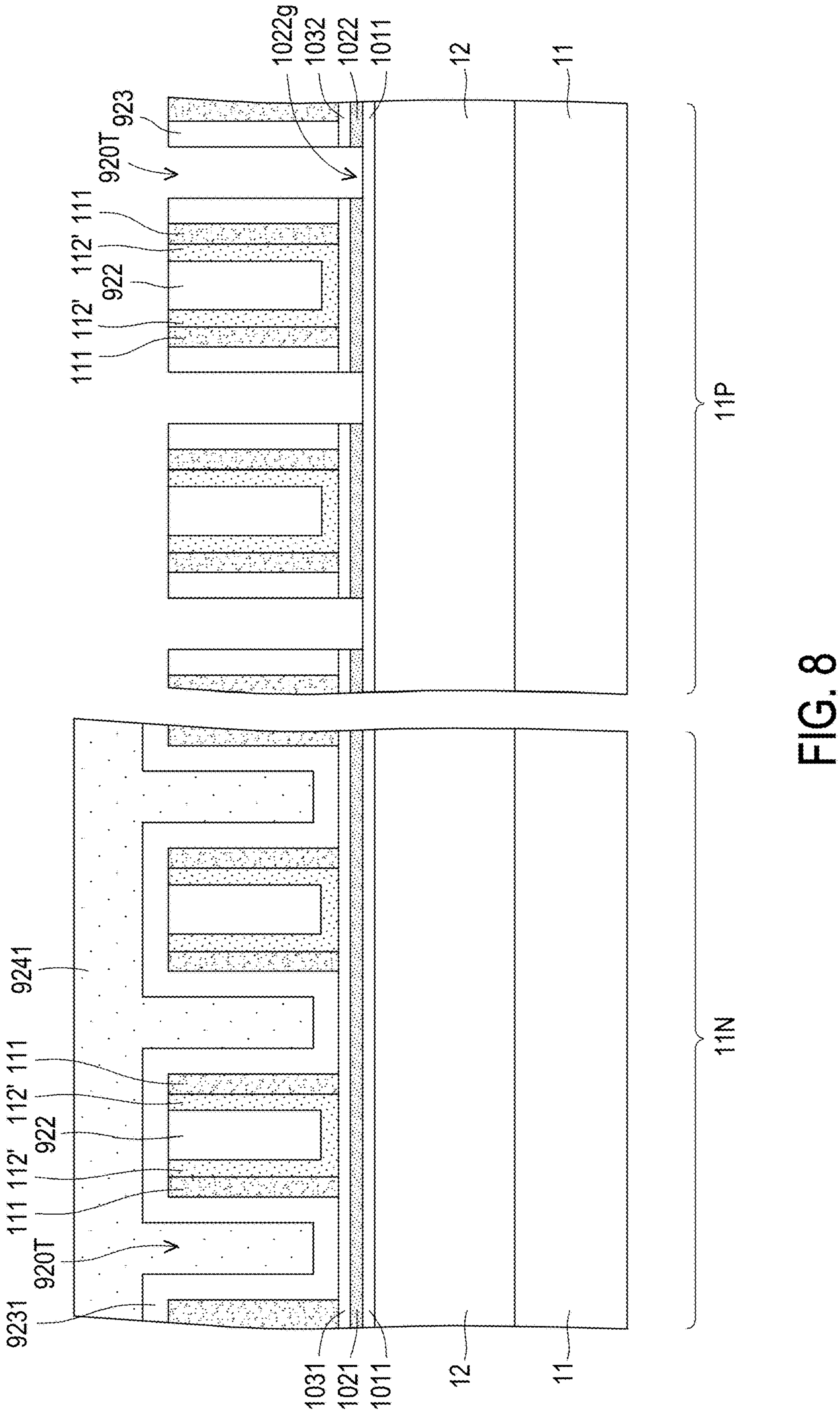

Referring to FIG. 8 and with reference to FIG. 7, a first sacrificial mask layer 9241 may be formed on a portion of the second sacrificial material 9231 that is disposed on the first region 11N. For example, the first sacrificial mask layer 9241 is deposited on the second sacrificial material 9231 and fills the second trenches 920T on the first region 11N. In some embodiments, the first sacrificial mask layer 9241 includes a photoresist material which may protect the underlying structures on the first region 11N from the subsequent processing steps (e.g., etching). Next, portions of the second sacrificial material 9231 on the second region 11P may be removed to form the second sacrificial films 923 through one or a few etching processes (e.g., a dry etch, a wet etch, a combination thereof, or the like). For example, a bottom portion of the second sacrificial material 9231 formed within the second trenches 920T corresponding to the second region 11P may be removed through the dry etching process. In some embodiments, an upper portion of the second sacrificial material 9231 formed on the top surfaces of the spacers 111, the contact etch stop film 112', and the first sacrificial layer 922 may be removed during the etching. A portion of the upper insulating material 1031 underlying the bottom portion of the second sacrificial material 9231 and a portion of the intermediate contact material 1021 underlying the portion of the upper insulating material 1031 within the second trenches 920T may also be etched to respectively form an upper insulating material pattern 1032 and an intermediate contact material pattern 1022 on the second region 11P. The intermediate contact material pattern 1022 may have gaps 1022*g* which accessibly reveal portions of the top surface of the lower insulating material 1011 on the second region 11P.

Figure 9:
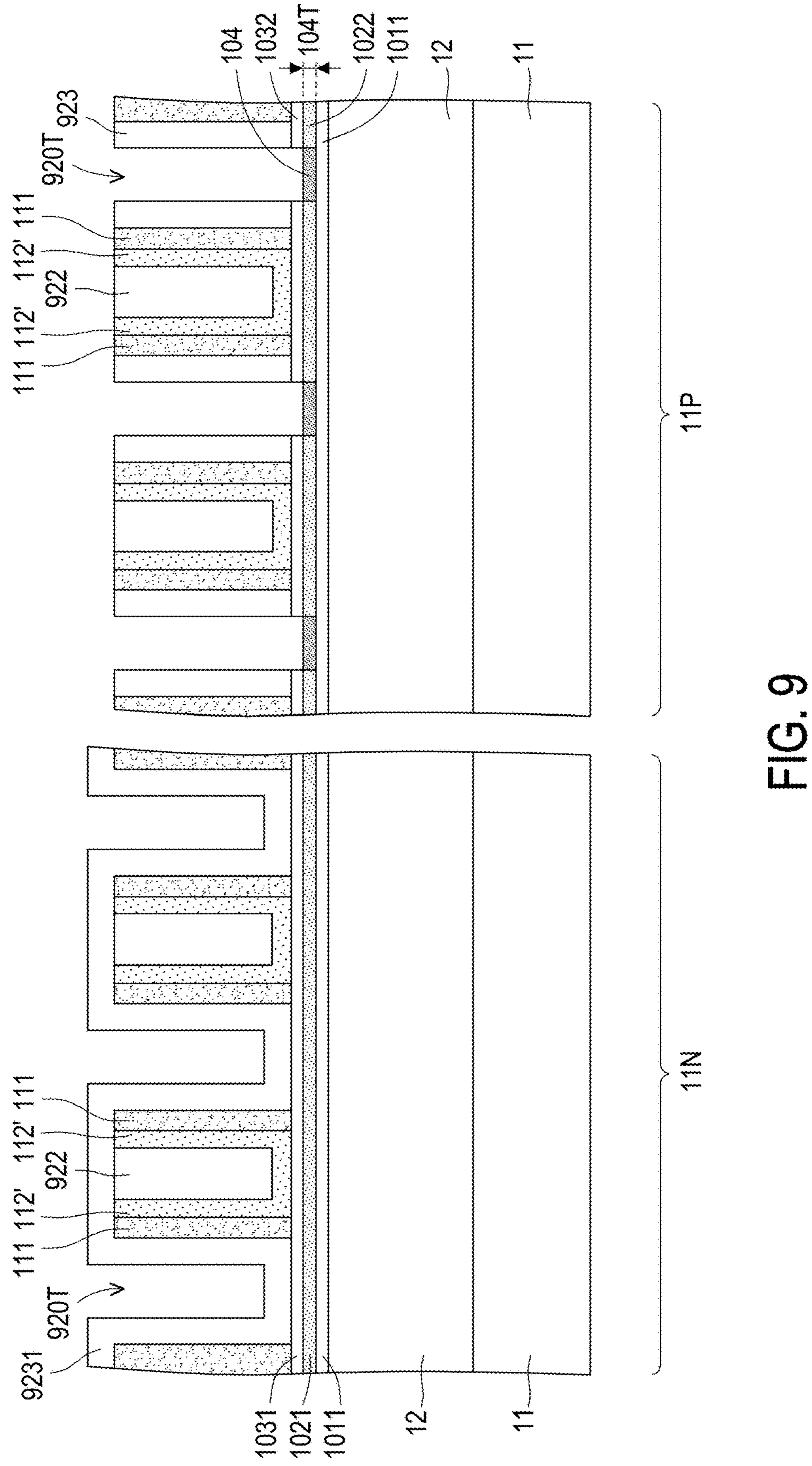

Referring to FIG. 9 and with reference to FIG. 8, the first sacrificial mask layer 9241 on the first region 11N may be removed to reveal the second sacrificial material 9231 using an ashing process followed by a wet clean process. Other suitable removal techniques may be used depending on the material property of the first sacrificial mask layer 9241. Next, a channel layer 104 may be formed on the lower insulating material 1011 within the respective gap 1022*g* of the intermediate contact material pattern 1022 on the second region 11P. The channel layer 104 may be formed using a selective growth process or other suitable deposition techniques. In some embodiments, the growth of the channel layer 104 may be selective without the formation of the channel layer 104 on the other materials. In some embodiments, the intermediate contact material pattern 1022 is connected to the sidewall of the channel layer 104, while the upper insulating material 1031 overlying the intermediate contact material pattern 1022 is not connected to the channel layer 104. For example, the intermediate contact material pattern 1022 may surround the channel layer 104 from a lateral side thereof.

In some embodiments, the channel layer 104 includes 2D material(s). The material of the channel layer 104 may be different from that of the intermediate contact material pattern 1022 which is immediately adjacent the channel layer 104. Examples of suitable channel layer 104 include one to a few monolayers of transition metal dichalcogenide (TMD), such as $MoS_2$, $WS_2$, $WSe_2$, or the like. 2D materials are known as substances with a thickness of a few nanometers or less. For example, the channel layer 104, which is made of 2D material (e.g., TMD), has a thickness 104T ranging from about 0.5 nm to about 10 nm. The thicknesses the channel layer 104 the intermediate contact material pattern 1022 which surrounds the channel layer 104 may be substantially equal, within process variations. By employing the selective growth process, the step of transferring wafer-scale of the TMD material may be replaced, thereby lowering associated costs. In alternative embodiments, the channel layer 104 includes oxide semiconductor material such as $InGaZnO_x$ (IGZO), $In_2O_3$, $InWO_x$(IWO), $InTiO_x$(ITO), etc. In such embodiments, the channel layer 104, which is made of oxide semiconductor material, has a thickness ranging from about 0.5 nm to about 20 nm.

Figure 10:
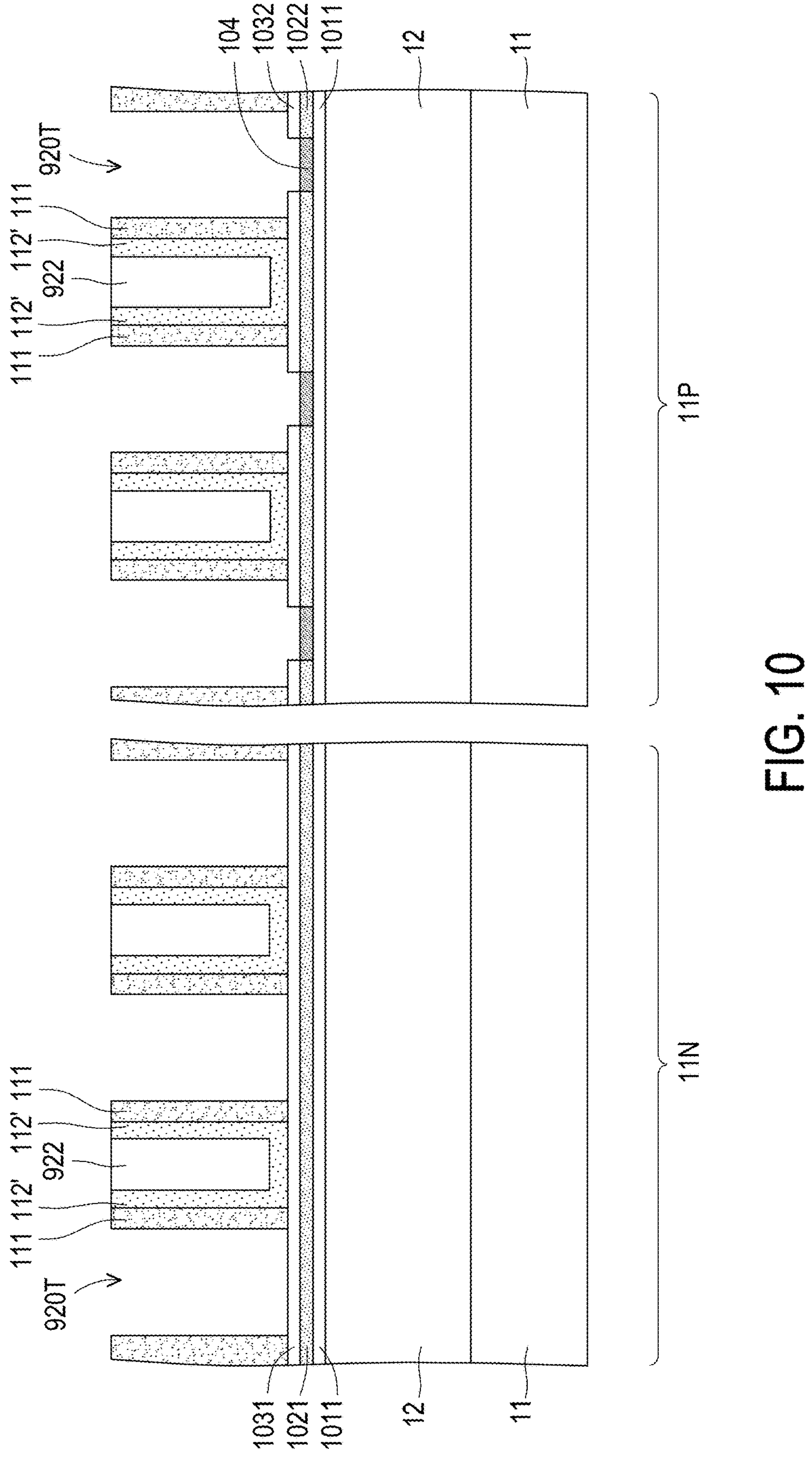

Referring to FIG. 10 and with reference to FIG. 9, the second sacrificial material 9231 on the first region 11N and the second sacrificial films 923 on the second region 11P may be removed. For example, one or a few etching process (e.g., a dry etch, a wet etch, or the like) may be performed to remove the second sacrificial material 9231 on the protruding structures over the upper insulating material 1031 and within the second trenches 920T. In some embodiments, an etchant for the wet etch includes a combination of hydrogen fluoride (HF) and ammonia ($NH_3$), a combination of HF and tetramethylammonium hydroxide (TMAH), or the like. For example, the dry etch process includes RIE, ICP etch, ECR etch, NBE, and/or the like. As shown in FIG. 10, layers (e.g., the upper insulating material 1031, the spacers 111, the contact etch stop film 112', and the first sacrificial layer 922) on the first region 11N that were covered by the second sacrificial material 9231 and layers (e.g., the upper insulating material pattern 1032, the spacers 111, the contact etch stop film 112', and the first sacrificial layer 922) on the second region 11P that were covered by the second sacrificial films 923 may be accessibly exposed after the removal of the second sacrificial material 9231 and the second sacrificial films 923.

Figure 11:
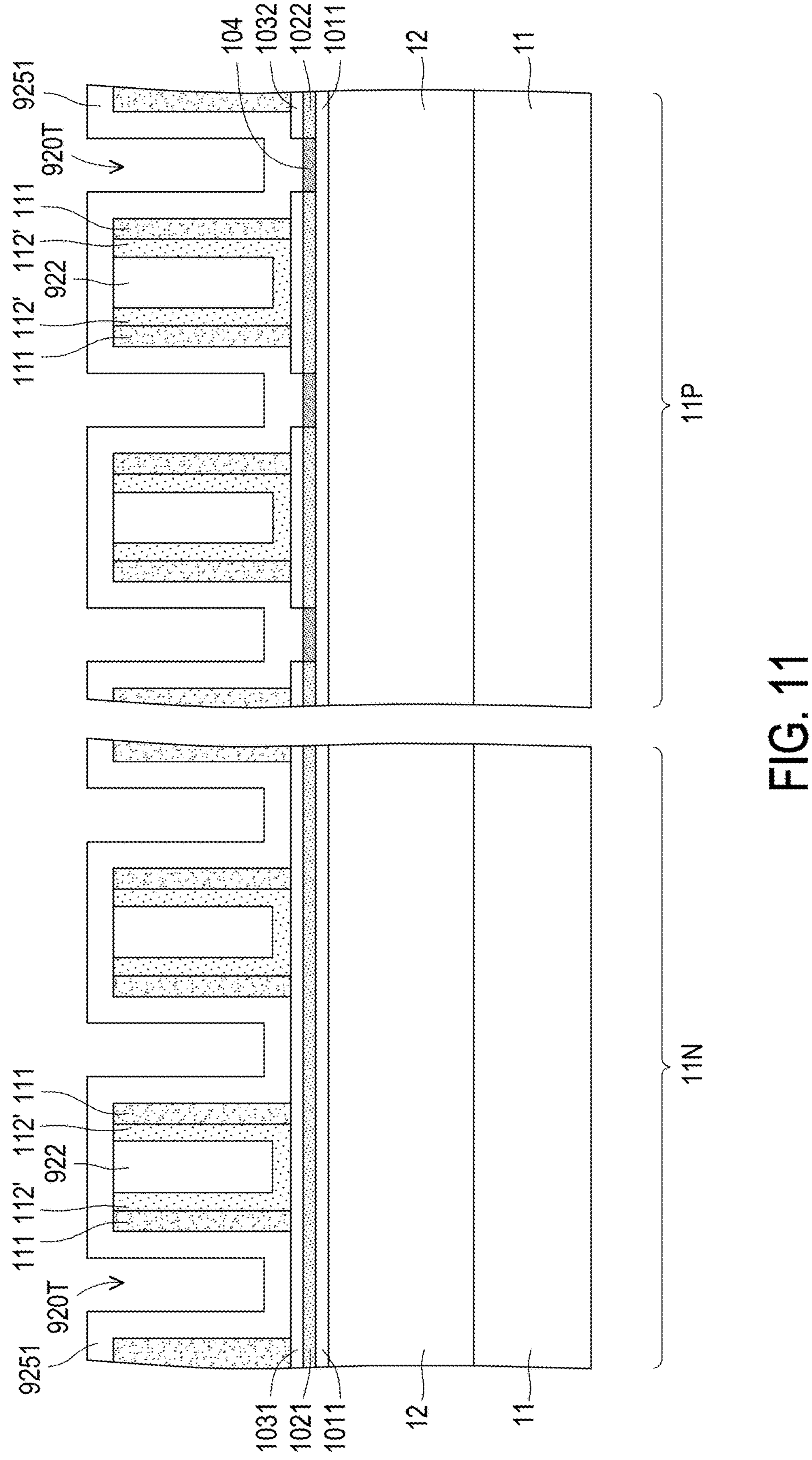

Referring to FIG. 11 and with reference to FIG. 10, a third sacrificial material 9251 may be formed on the remaining structures on both of the first region 11N and the second region 11P. The material and the forming process of the third sacrificial material 9251 may be similar to those of the second sacrificial material 9231 described in FIG. 7. In some embodiments, the third sacrificial material 9251 may be blanketly formed on the remaining structures and within the second trenches 920T. For example, the third sacrificial material 9251 formed in the second trenches 920T on the first region 11P may be in physical contact with the sidewalls of the spacers 111 and the top surfaces of the upper insulating material 1031. The third sacrificial material 9251 formed in the second trenches 920T on the second region 11P may be in physical contact with the sidewalls of the spacers 111 and the top surfaces of the upper insulating material pattern 1032 and the channel layer 104.

Figure 12:
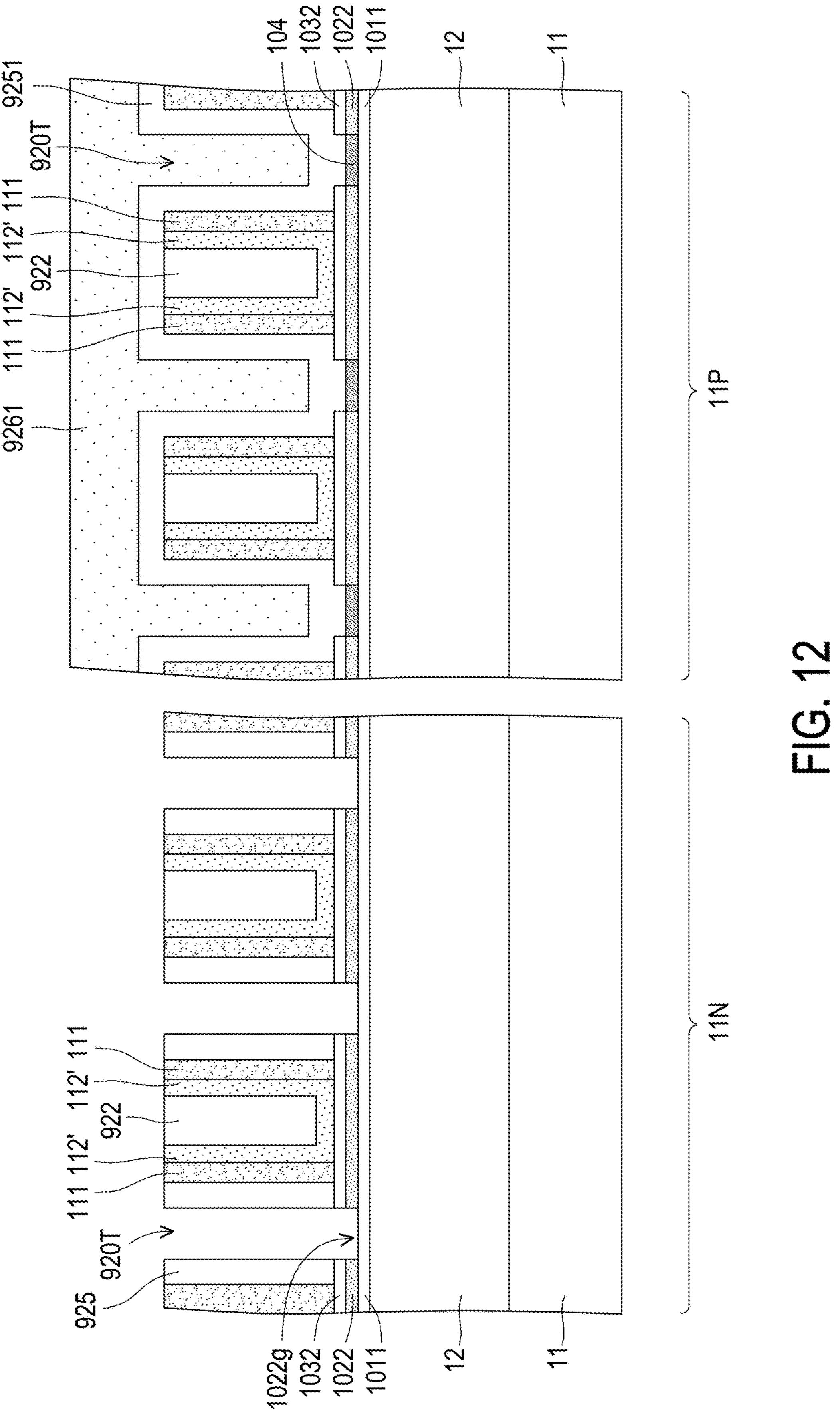

Referring to FIG. 12 and with reference to FIG. 11, a second sacrificial mask layer 9261 may be formed on a portion of the third sacrificial material 9251 which is formed on the second region 11P. For example, the second sacrificial mask layer 9261 is deposited on the third sacrificial material 9251 and fills the second trenches 920T on the second region 11P. The material and the forming process of the second sacrificial mask layer 9261 may be similar to those of the first sacrificial mask layer 9241 described in FIG. 8. Next, portions of the third sacrificial material 9251 on the first region 11N may be removed to form the third sacrificial films 925 through one or a few etching processes (e.g., a dry etch, a wet etch, a combination thereof, or the like). For example, an upper portion of the third sacrificial material 9251 formed on the top surfaces of the spacers 111, the contact etch stop film 112', and the first sacrificial layer 922 may be removed. A bottom portion of the third sacrificial material 9251 formed within the second trenches 920T corresponding to the first region 11N may also be removed through, for example, the dry etching process. In some embodiments, a portion of the upper insulating material 1031 underlying the bottom portion of the third sacrificial material 9251 and a portion of the intermediate contact material 1021 underlying the portion of the upper insulating material 1031 within the second trenches 920T on the first region 11N may be removed to respectively form the upper insulating material pattern 1032 and the intermediate contact material pattern 1022 with gaps 1022$g$ on the first region 11N. For example, the gaps 1022$g$ of the intermediate contact material pattern 1022 accessibly expose portions of the top surface of the lower insulating material 1011 on the first region 11N.

Figure 13:
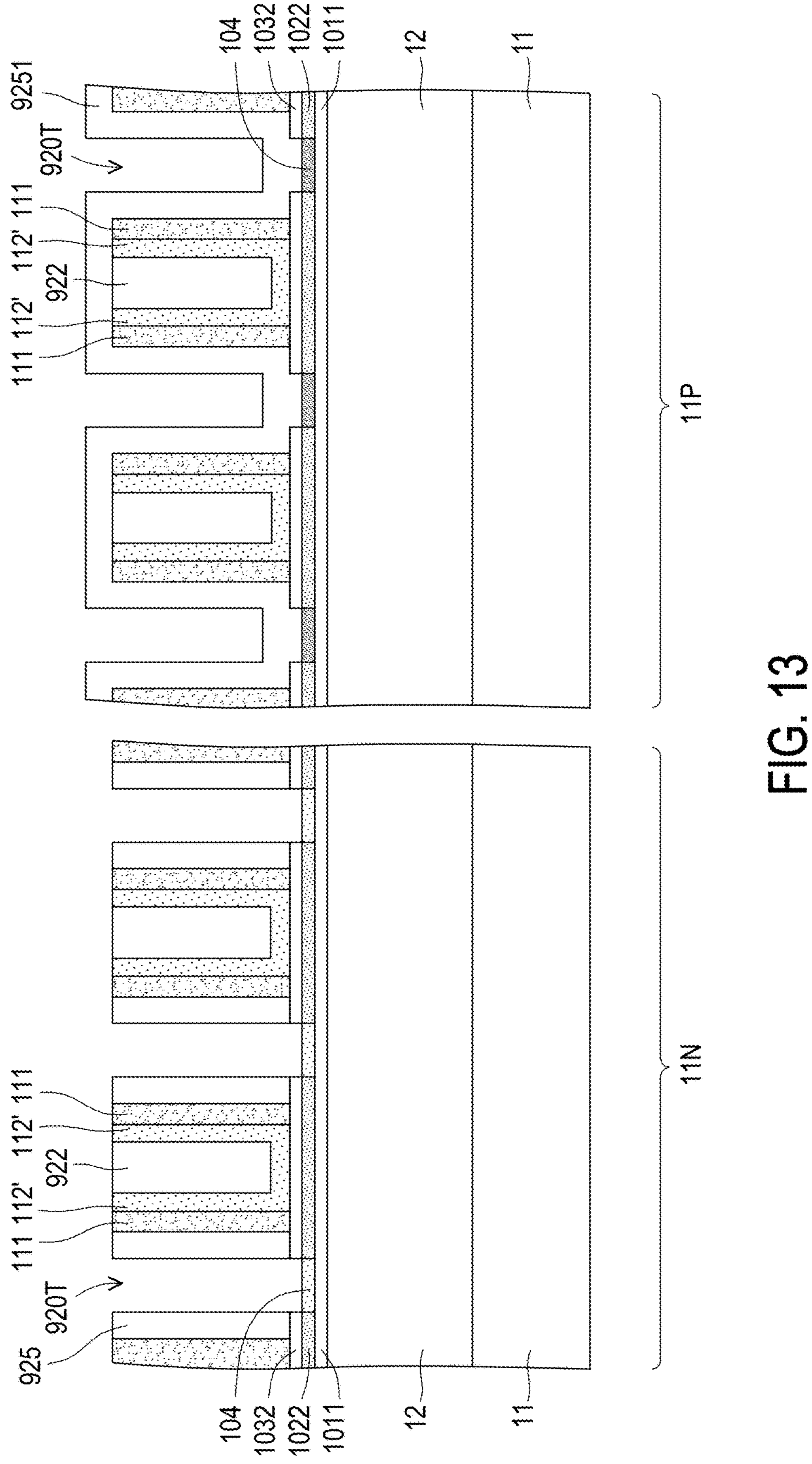

Referring to FIG. 13 and with reference to FIG. 12, the channel layer 104 may be formed on the lower insulating material 1011 and within the respective gap 1022$g$ of the intermediate contact material pattern 1022 on the first region 11N. In some embodiments, after forming the third sacrificial films 925 and before forming the channel layer 104 on the first region 11N, the second sacrificial mask layer 9261 capping on the second region 11P may be removed through, for example, an ashing process followed by a wet clean process or other suitable removal techniques. The material and the forming process of the channel layer 104 formed on the first region 11N may be similar to those of the channel layer 104 formed on the second region 11P described in FIG. 9. For example, the growth of the channel layer 104 may be selective without the formation of the channel layer 104 on the other materials. The channel layer 104 may be formed on the lower insulating material 1011 on the first region 11N, and the intermediate contact material pattern 1022 may surround the channel layer 104 from a lateral side thereof. The channel layer 104 may not extend to be connected to the upper insulating pattern 1032 overlying the intermediate contact material pattern 1022. By forming the 2D material (e.g., TMD) as the channel layer 104 on both of the first region 11N and the second region 11P through area-selective growth techniques, it allows for site-specified synthesis of n-type and p-type 2D channel materials over the semiconductor substrate 11, in accordance with some embodiments.

Figure 14:
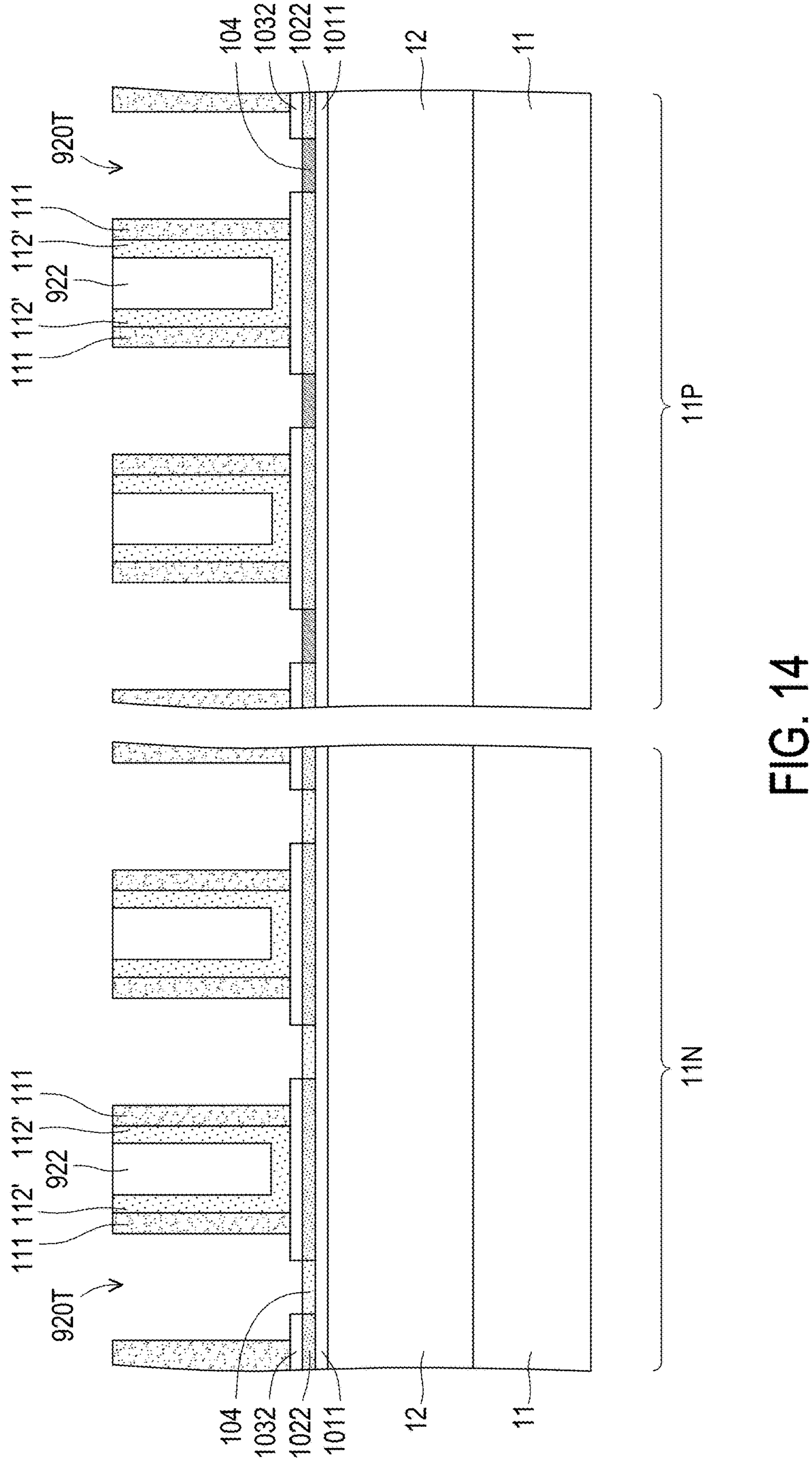

Referring to FIG. 14 and with reference to FIG. 13, the third sacrificial films 925 on the first region 11N and the third sacrificial material 9251 on the second region 11P may be removed to accessibly expose those layers which were covered by the third sacrificial films 925 and the third sacrificial material 9251. In some embodiments, one or a few etching process (e.g., a dry etch, a wet etch, or the like) is performed to remove the third sacrificial films 925 and the third sacrificial material 9251. For example, the sidewalls of the spacers 111 that define the second trenches 920T and the top surface of the channel layer 104 in the second trenches 920T on both of the first region 11N and the second region 11P may be accessibly revealed after the removal of the third sacrificial films 925 and the third sacrificial material 9251.

Figure 15:
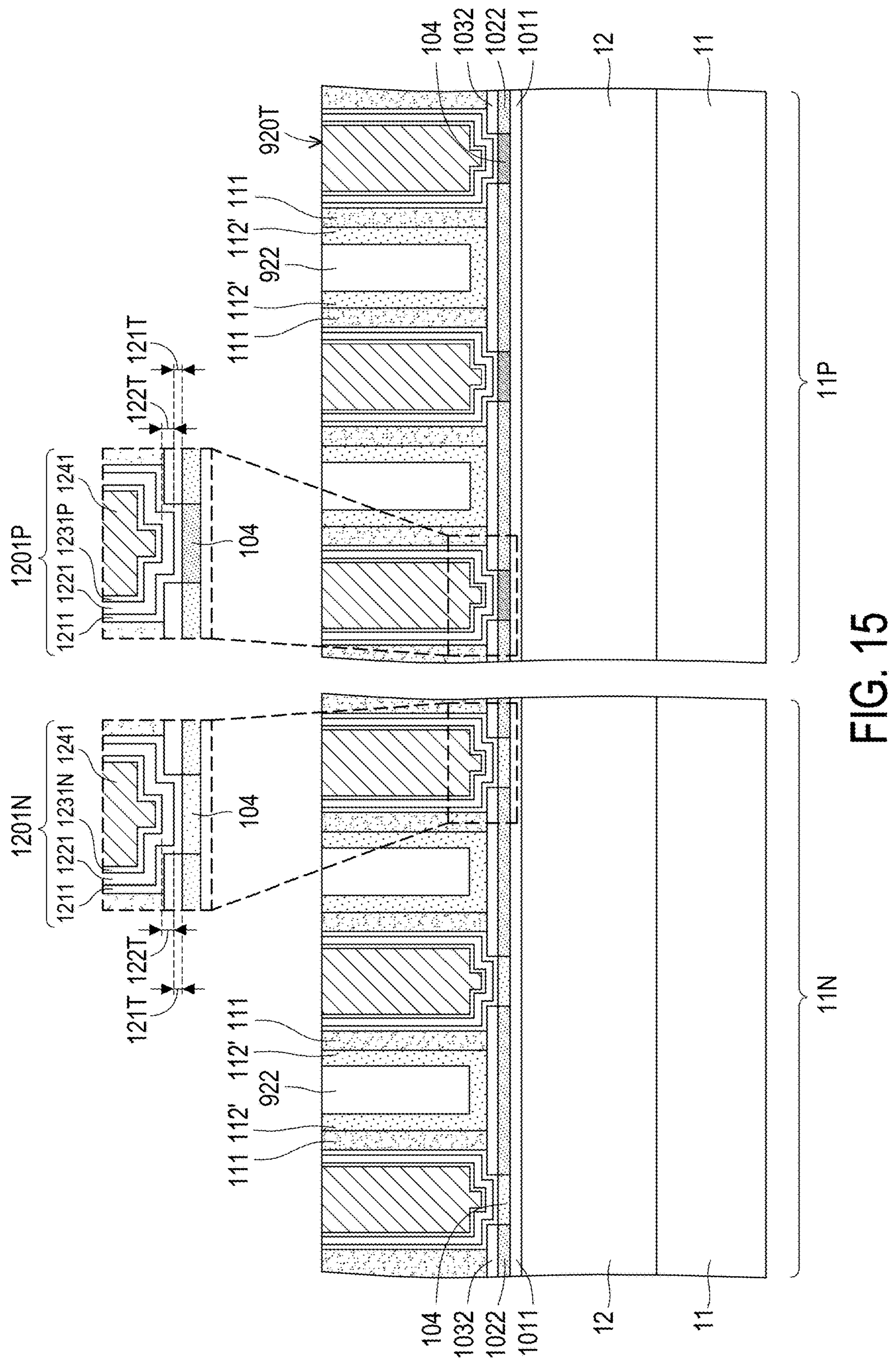

Referring to FIG. 15 and with reference to FIG. 14, a plurality of gate material structures (1201N and 1201P) may be formed in the second trenches 920T on the first region 11N and the second region 11P, respectively. The respective gate material structure (1201N or 1201P) may include several layers. For example, the respective gate material structure (1201N or 1201P) includes an interfacial material 1211 formed in a conformal manner in the corresponding second trench 920T and lining the sidewall of the spacer 111, the top surface and the sidewall of the upper insulating material pattern 1032, and the top surface of the channel layer 104. For example, the interfacial material 1211 includes insulating 2D materials (e.g., hexagonal boron nitride (h-BN)), oxide-based materials (e.g., $SiO_x$, $AlO_x$, etc.), and/or the like. The interfacial material 1211 may be blanketly formed in the respective second trench 920T with the substantially uniform thickness. The thickness 121T of the interfacial material 1211 may be in the range of about 0.5 nm to about 2.0 nm. In some embodiments, the respective gate material structure (1201N or 1201P) includes a gate dielectric material 1221 blanketly formed on the interfacial material 1211. For example, the gate dielectric material 1221 includes an oxide (e.g., silicon oxide), high-k dielectric material (e.g., $AlO_x$, $HfO_x$, $ZrO_x$, $HfZrO_x$), combinations thereof, and/or the like. The thickness 122T of the gate dielectric material 1221 may be in the range of about 1 nm to about 10 nm.

In some embodiments, the respective gate material structure 1201N on the first region 11N includes a first work function material 1231N blanketly formed on the gate dielectric material 1221. For example, the first work function material 1231N is the n-type work function metal material including Ti, Al, TiAl, TiAlN, TiAlC, Ta, TaC, TaCN, TaSiN, the like, or a combination thereof. In some embodiments, the first work function material 1231N includes multi-sublayers of TiN, TaN, and TiAl, depending on the design requirements. In some embodiments, the respective gate material structure 1201P on the second region 11P includes a second work function material 1231P blanketly formed on the gate dielectric material 1221. The second work function material 1231P may be different from the first work function material 1231N. For example, the second work function material 1231P is the p-type work function metal material including TiN, TaN, Ru, Mo, Al, WN, $ZrSi_2$, $MoSi_2$, $TaSi_2$, $NiSi_2$, WN, the like, or a combination thereof. In some embodiments, the second work function material 1231P includes multi-sublayers of TIN, TaN, TiN, and TiAl, depending on the design requirements. In some embodiments, the respective gate material structure 1201N (or 1201P) includes a gate material 1241 formed on the first work function material 1231N (or the second work function material 1231P) and filling the corresponding second trench 920T. The gate material 1241 may include Cu, Al, W, alloy, the like, or a combination thereof.

Figure 16:
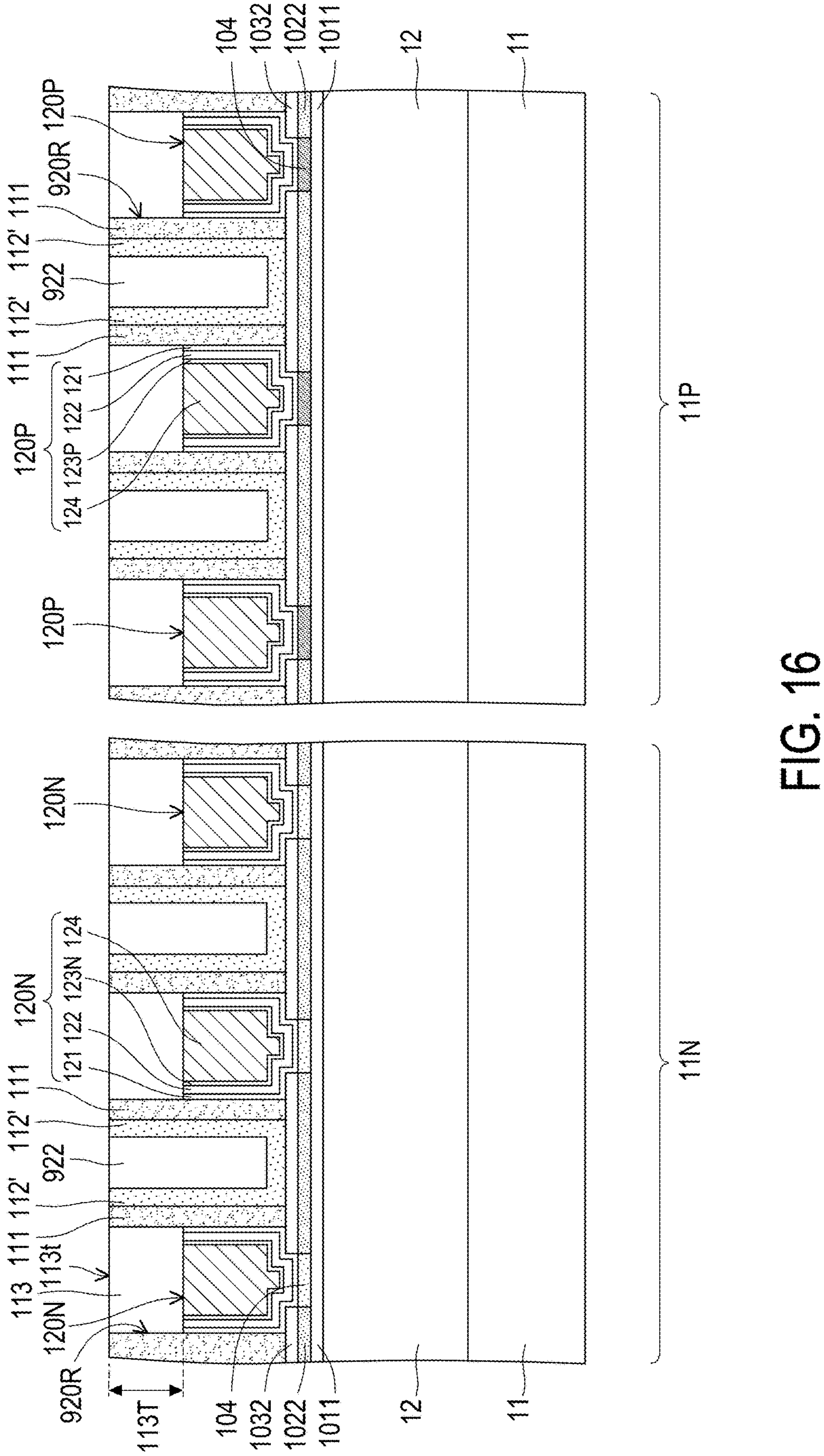

Referring to FIG. 16 and with reference to FIG. 15, the respective gate material structure (1201N and 1201P) may be partially removed to form a gate structure (120N and 120P). The respective gate structure 120N on the first region 11N may include a interfacial layer 121, a gate dielectric layer 122 conformally lining the interfacial layer 121, a first work function layer 123N conformally lining the gate dielectric layer 122, and a gate metal layer 124 formed on the first work function layer 123N. The respective gate structure 120P on the second region 11P may be similar to the gate structure 120N on the first region 11N, except that the first work function layer 123N is replaced with the second work function layer 123P. For example, a top portion of the respective gate material structure (1201N and 1201P) is removed to form a recess 920R through one or a few etching process. For example, the inner sidewalls of the spacer 111 and the top surface of the corresponding gate structure (1201N or 1201P) define the recess 920R.

After forming the recesses 920R, a dielectric layer 113 may be formed on the top surface of the respective gate structure (120N and 120P) and fill the recess 920R. The dielectric layer 113 may act as the capping layer for protecting the underlying gate structure from subsequent processes. In some embodiments, the formation of the dielectric layer 113 includes depositing suitable dielectric material in the recesses 920R and on the top surfaces of the protruding structures on both of the first region 11N and the second region 11P, and performing a planarization process (e.g., CMP, a mechanical grinding process, an etching process, a combination thereof, or the like) on the dielectric material until the top surfaces of the protruding structures are accessibly revealed. For example, the dielectric layer 113 includes nitride-based material (e.g., SiCN, SiN, etc.) or other suitable dielectric material. In some embodiments, the top surface 113*t* of the dielectric layer 113 is substantially leveled (e.g., coplanar) with the top surfaces of the spacer 111, the contact etch stop film 112', and the first sacrificial layer 922. In some embodiments, the thickness 113T of the dielectric layer 113 is in a range of about 10 nm to about 100 nm.

Figure 17:
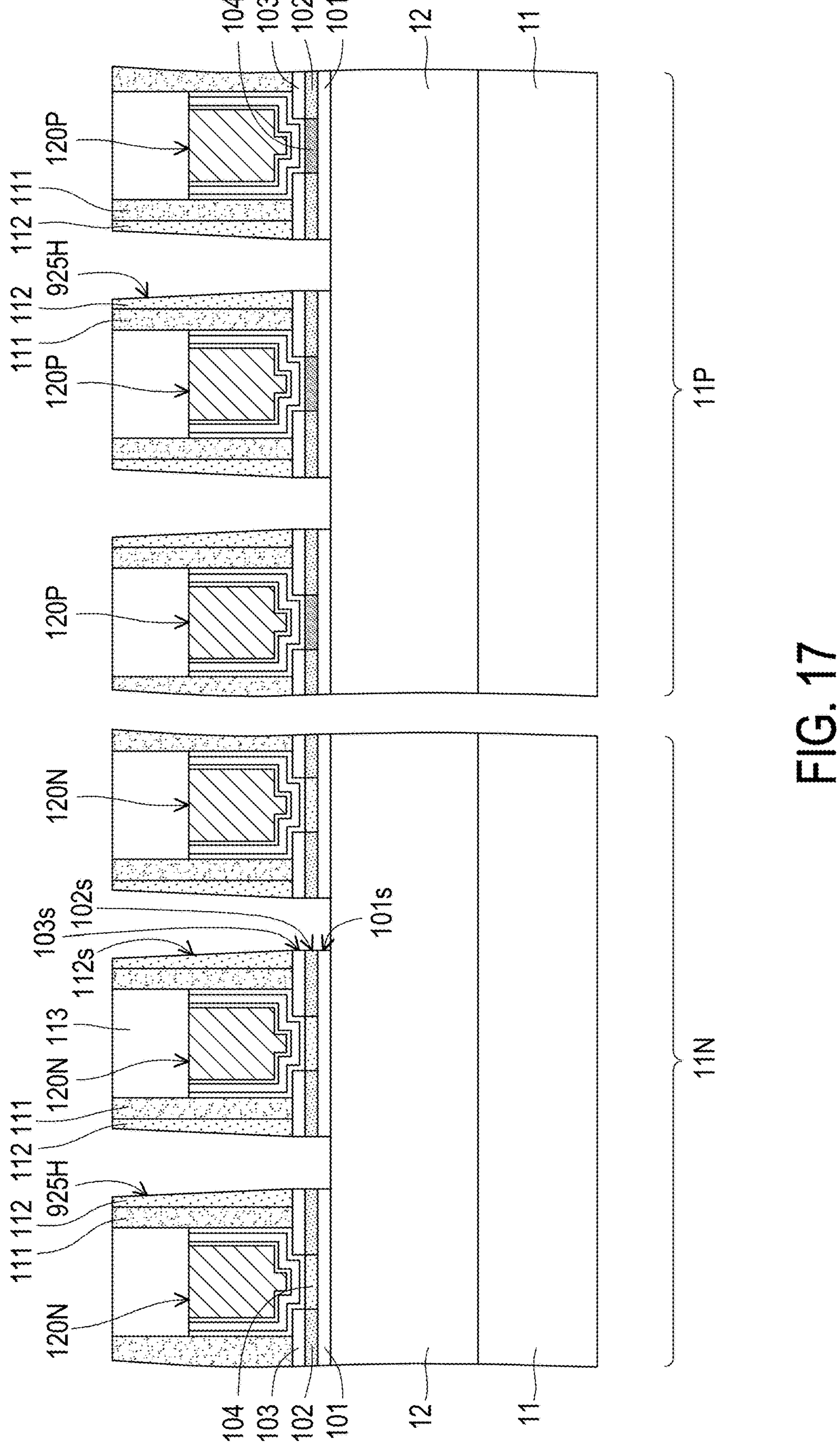

Referring to FIG. 17 and with reference to FIG. 16, a plurality of contact holes 925H may be formed at the intended locations for the subsequently-formed source/drain contacts. For example, the first sacrificial layer 922 on both of the first region 11N and the second region 11P may be removed through one or a few etching process. During the etching, a bottom portion of the contact etch stop film 112' underlying the first sacrificial layer 922 may be removed to form a contact etch stop layer 112. In some embodiments, the sidewall 112*s* of the contact etch stop layer 112 is tilted, and the thickness of the contact etch stop layer 112 on the sidewall of the spacer 111 may gradually increase from the top surface of the spacer 111 to the bottom surface of the spacer 111. For example, the thickness of the contact etch stop layer 112 is in a range of about 3 nm to about 50 nm. In some embodiments, a stack of the upper insulating material pattern 1032, the intermediate contact material pattern 1022, and the lower insulating material 1011 underlying the bottom portion of the contact etch stop film 112' may be removed during the etching to respectively form an upper insulating pattern 103, an intermediate contact pattern 102, and a lower insulating layer 101. For example, the contact holes 925H may accessibly expose portions of the top surface of the bottom dielectric layer 12 and may accessibly expose the outer sidewalls 101*s* of the lower insulating layer 101, the outer sidewalls 102*s* of the intermediate contact pattern 102, and the outer sidewalls 103*s* of the upper insulating pattern 103.

Figure 18:
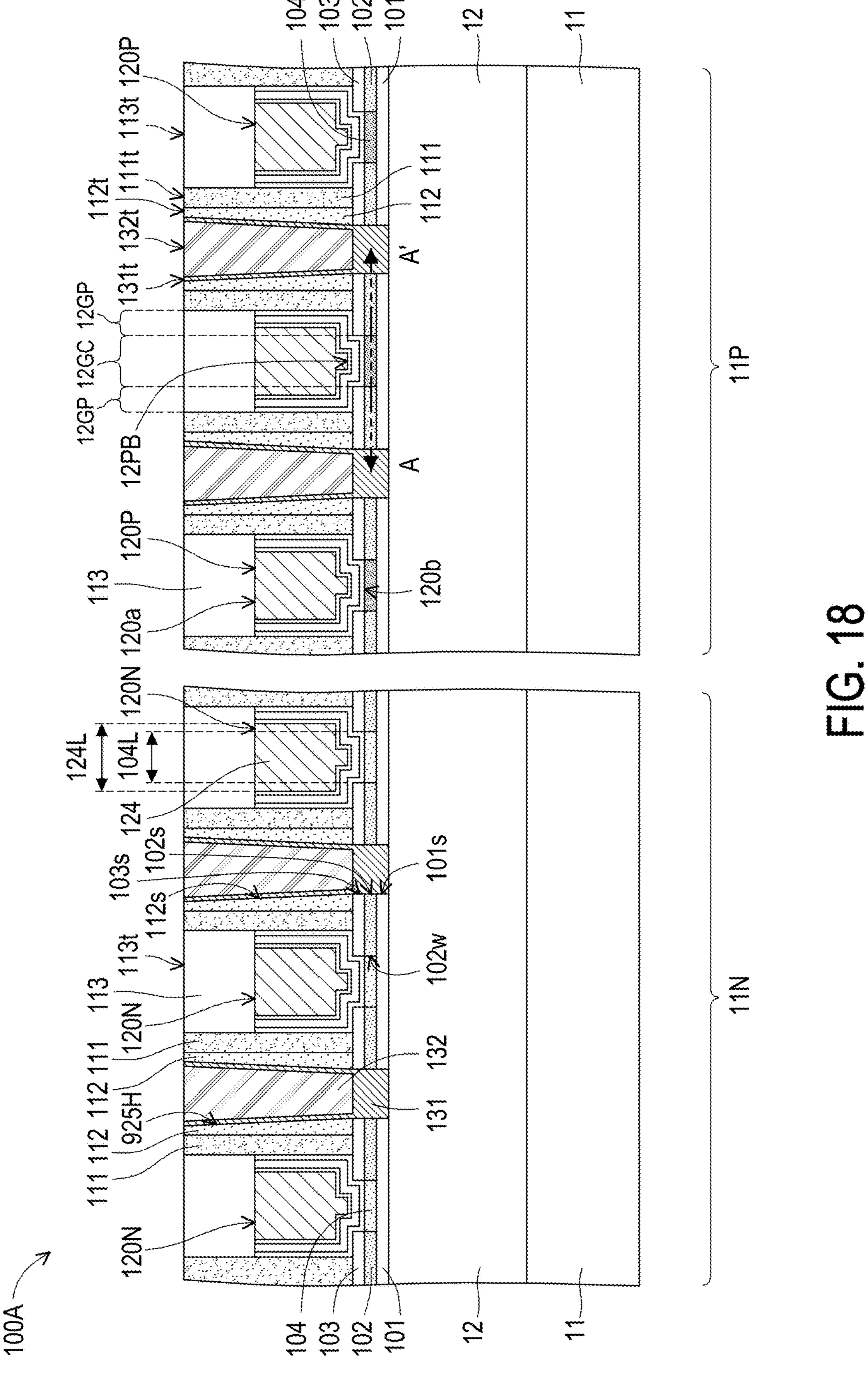

Referring to FIG. 18 and with reference to FIG. 17, a plurality of contact metals 131 may be formed in the contact holes 925H on both of the first region 11N and the second region 11P. The contact metals 131 may include Ni, Ti, TiN, Cr, Ru, etc., and may be formed in a conformal manner in the contact holes 925H. For example, the respective contact metal 131 in each contact hole 925H is formed on the top surface of the bottom dielectric layer 12 and extends to cover the outer sidewalls (112*s*, 103*s*, 102*s*, and 101*s*) of the contact etch stop layer 112, the upper insulating pattern 103, the intermediate contact pattern 102, and the lower insulating layer 101. In some embodiments, a bottom portion of the contact metal 131 overlying the bottom dielectric layer 12 may be thicker than a sidewall portion of the contact metal 131 formed on the contact etch stop layer 112. Alternatively, the contact metal 131 has a uniform thickness on the contact etch stop layer 112 and the bottom dielectric layer 12. For example, the thickness of the contact metal 131 is in a range of about 2 nm to about 20 nm.

In some embodiments, a contact plug 132 is formed on the contact metal 131 and filling the corresponding contact hole 925H. For example, the contact plug 132 includes W, Cu, Ru, a combination thereof, or the like. In some embodiments, a planarization process (e.g., CMP, a mechanical grinding process, an etching process, a combination thereof, or the like) is performed to remove excess materials. For example, the top surfaces (131*t* and 132*t*) of the contact metal 131 and the contact plug 132 are substantially leveled (or coplanar) with the top surface 113*t* of the dielectric layer 113, the top surface 111*t* of the spacer 111, and the top surface 112*t* of the contact etch stop layer 112. The thickness of the contact plug 132 is in a range of about 10 nm to about 100 nm, depending on the thickness of the underlying bottom portion of the contact metal 131. The contact metal 131 and the contact plug 132 may be collectively viewed as a contact structure. As the process proceeds up to here, a plurality of semiconductor devices (e.g., transistors) 100A is formed over the semiconductor substrate 11. In some embodiments, additional features and/or layers may be formed on the semiconductor devices 100A to form a semiconductor structure as will be described later in accompanying with FIG. 39.

With continued reference to FIG. 18, the semiconductor device 100A includes the gate structure (120N or 120P) formed between the contact metals 131, where the contact metals 131 may act as source/drain metals. The gate structure (120N or 120P) may be positioned over the channel layer 104 and the intermediate contact pattern 102 which laterally surrounds the channel layer 104. For example, the outer sidewall 102*s* of the intermediate contact pattern 102 is in direct contact with the contact metals 131, and the inner sidewall 102*w* of the intermediate contact pattern 102 is in direct contact with the channel layer 104. In some embodiments, a straight sectional line A-A' in the semiconductor device 100A is sequentially across the contact metal 131, the intermediate contact pattern 102, the channel layer 104, the intermediate contact pattern 102, and the contact metal 131. The intermediate contact pattern 102 and the channel layer 104 may be formed at a same level and made of different materials (e.g., monolayers of graphene and TMD or a monolayer of graphene and an oxide semiconductor material). By configuring the intermediate contact pattern 102 made of monolayer of graphene between the channel layer 104 and the contact metal 131, the contact resistance (Rc) in the semiconductor device 100A caused by the Fermi level pinning between the contact metal and the channel layer may be reduced by giving the bias at the gate metal layer 124 to modulate the Fermi level in monolayer of graphene for electrical doping purpose.

In some embodiments, the gate structure (120N or 120P) of the semiconductor device 100A has an inner portion 12GC and an outer portion 12GP surrounding the inner portion 12GC, where the inner portion 12GC is disposed right on and overlaps the channel layer 104, and the outer portion 12GP is disposed right on and overlaps the intermediate contact pattern 102. In this manner, electrical doping caused by generating potential drop may be employed from the gate electrode, and thus the step of chemical doping may be omitted. The gate structure (120N or 120P) of the respective semiconductor device 100A may have a maximum lateral dimension (e.g., a top width) greater than a lateral dimension 104L (e.g., a top width) of the channel layer 104. In some embodiments, a maximum lateral dimension 124L (e.g., the top width) of the gate metal layer 124 is greater than the lateral dimension 104L of the channel layer 104. The lateral dimension 104L may be considered as a spacing of the intermediate contact pattern 102. In some embodiments, the gate structure (120N or 120P) includes a top side 120*a* connecting the dielectric layer 113 and a bottom side 120*b* connecting the channel layer 104, where the top side 120*a* is substantially wider than the bottom side 120*b*. For example, a cross section of the gate structure (120N or 120P) is T-shaped, where the protruding bottom portion 12PB of the gate structure (120N or 120P) lands on the channel layer 104. In some embodiments, a lateral dimension of the bottom side 120*b* of the gate structure (120N or 120P) is substantially equal to the lateral dimension 104L of the channel layer 104.

FIGS. 19-36 are cross-sectional views schematically illustrating various stages of a manufacturing method of a semiconductor device over a semiconductor substrate according to some embodiments. Unless specified otherwise, the materials and the formation methods of the components in these embodiments are essentially the same as the like components, which are denoted by like reference numerals in the embodiments shown in FIGS. 1-18.

Figure 19:
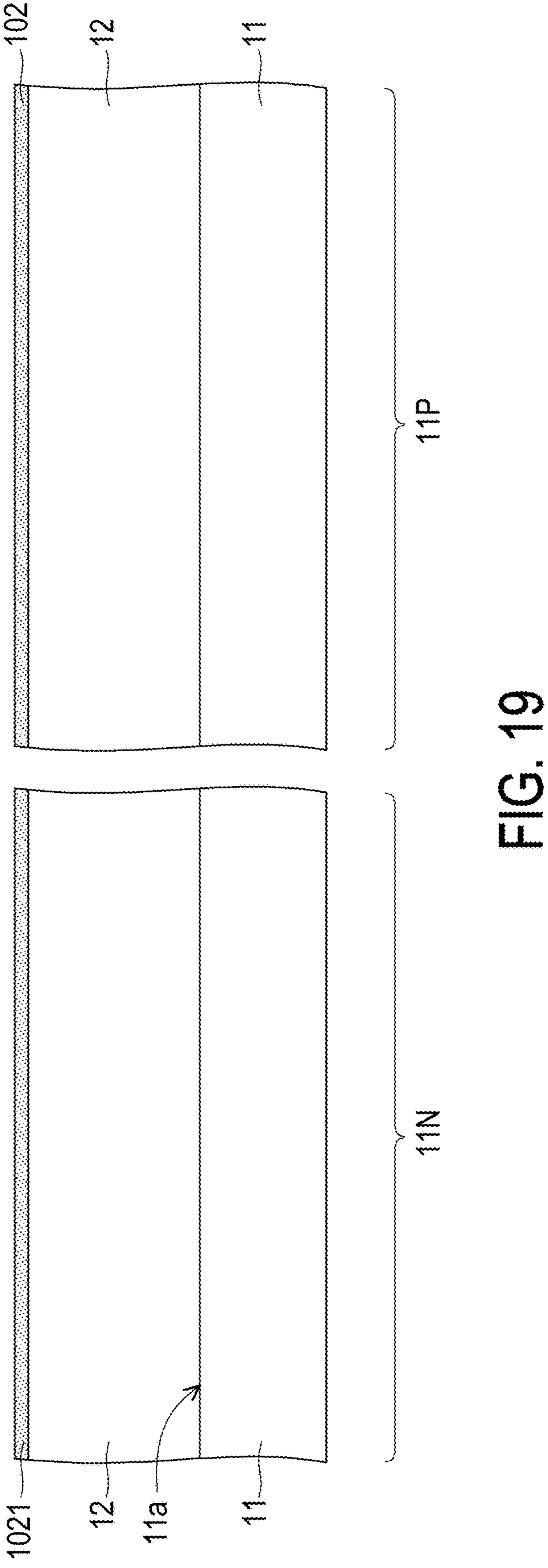
FIGS. 19-36 are cross-sectional views schematically illustrating various stages of a manufacturing method of a semiconductor device over a semiconductor substrate according to some embodiments.

Referring to FIG. 19 and with reference to FIG. 1, the bottom dielectric layer 12 overlies the first surface 11*a* of the semiconductor substrate 11 on both of the first region 11N and the second region 11P. In some embodiments, the intermediate contact material 1021 is directly disposed on the bottom dielectric layer 12. The semiconductor substrate 11, the bottom dielectric layer 12, and the intermediate contact material 1021 may be similar to the semiconductor substrate 11, the bottom dielectric layer 12, and the intermediate contact material 1021 described in FIG. 1. For example, as compared to the structure shown in FIG. 1, the lower insulating material 1011 underlying the intermediate contact material 1021 and the upper insulating material 1031 overlying the intermediate contact material 1021 are omitted.

Figure 20:
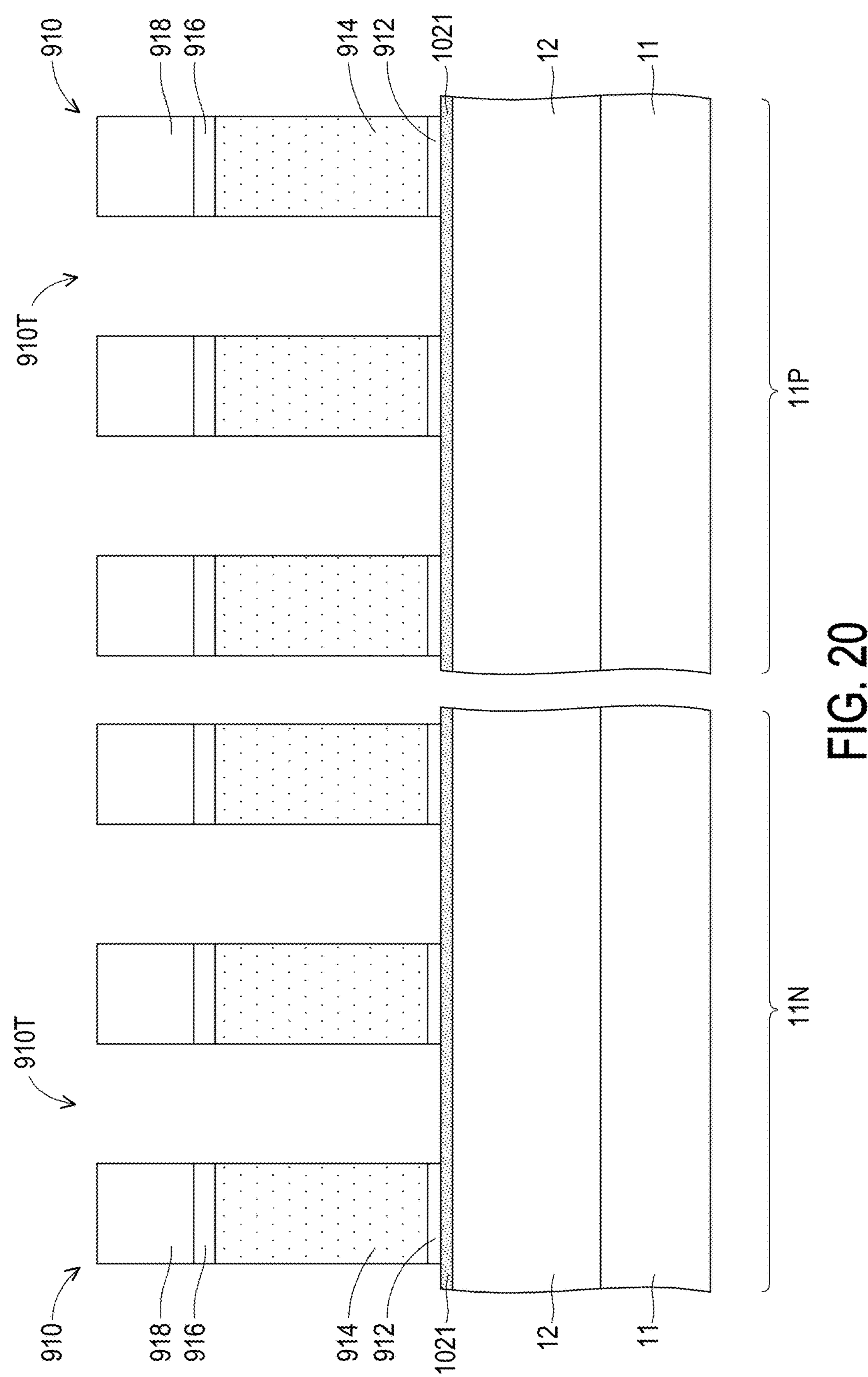

Referring to FIG. 20, the dummy structures 910 may be formed over the semiconductor substrate 11 on both of the first region 11N and the second region 11P, and the first trenches 910T are formed to separate the dummy structures 910 from one another. The dummy structures 910 and the first trenches 910T may be similar to the dummy structures 910 and the first trenches 910T described in FIG. 2. For example, the respective dummy structure 910 includes a stack of the first dielectric layer 912, the semiconductor layer 914, the etch stop layer 916, and the second dielectric layer 918. In some embodiments, the first dielectric layer 912 of the respective dummy structure 910 is in direct contact with the intermediate contact material 1021.

Figure 21:
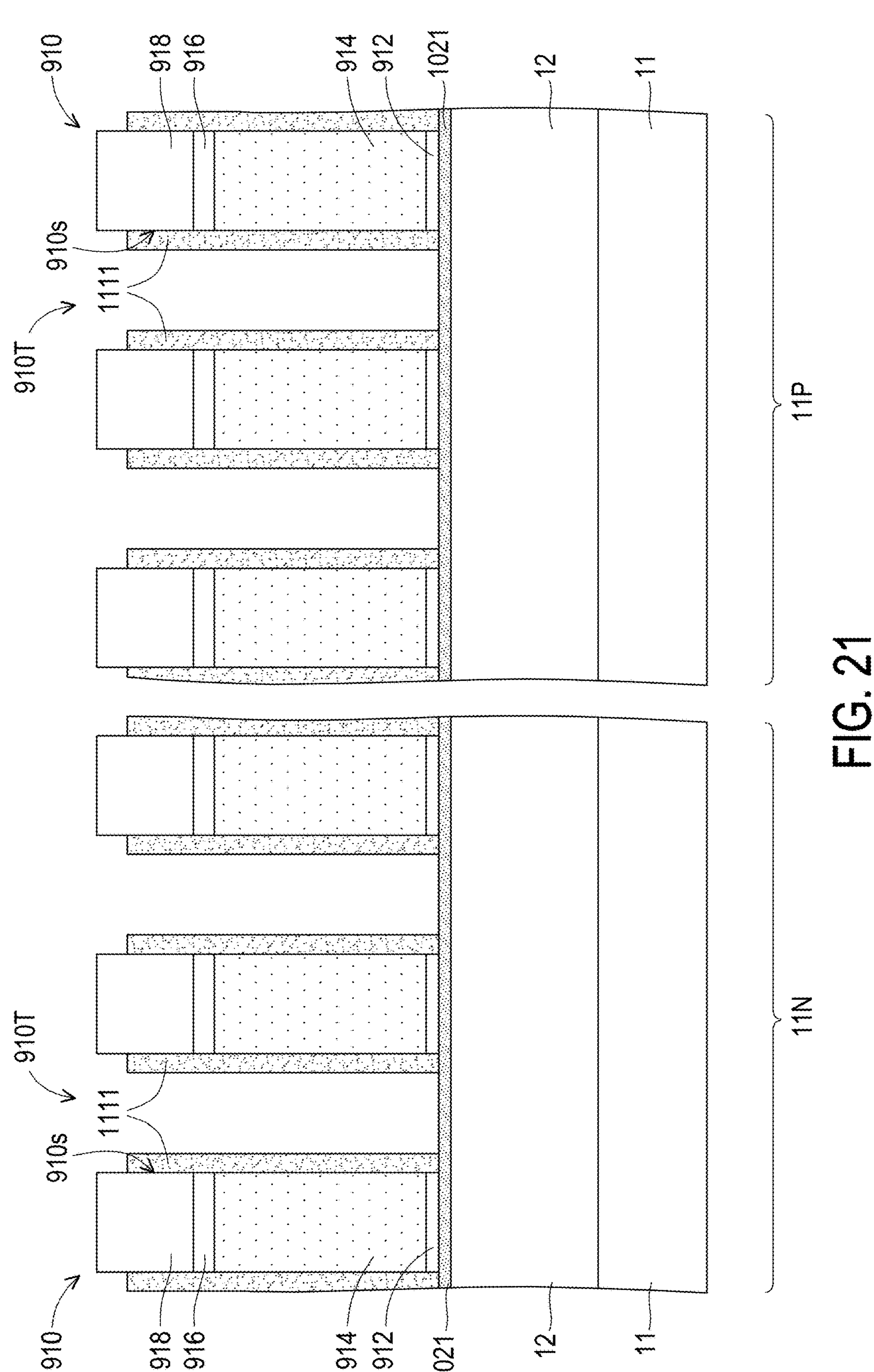
Figure 22:
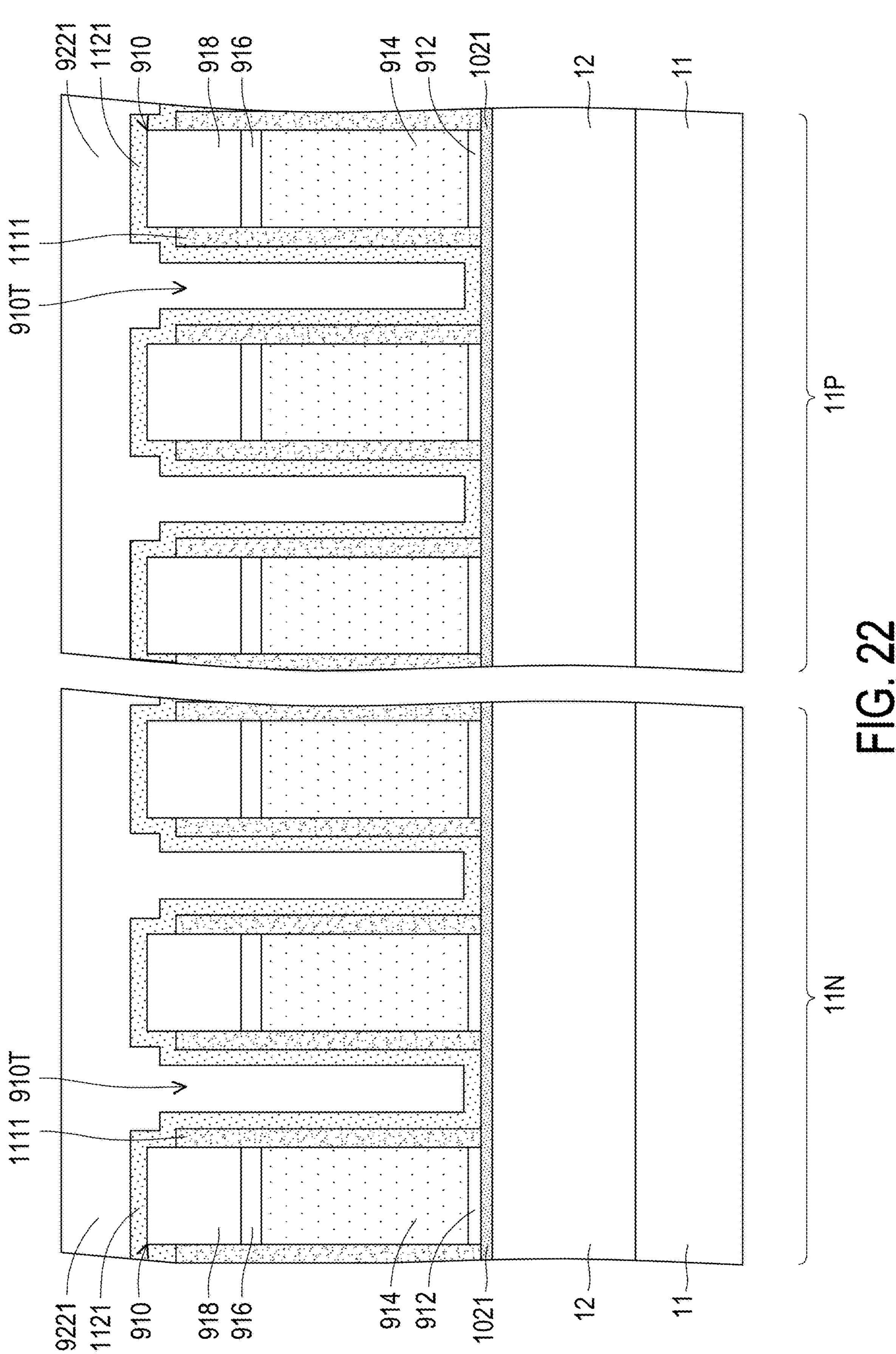

Referring to FIG. 21 and FIG. 22, the spacer films 1111 may be formed on the sidewalls 910*s* of the dummy structures 910 on both of the first region 11N and the second region 11P. For example, the spacer films 1111 are in direct contact with the intermediate contact material 1021. The spacer films 1111 may be similar to the spacer films 1111 described in FIG. 3. Next, the contact etch stop material 1121 may be formed on the dummy structures 910 and the spacer films 1111 and also formed in the first trenches 910T in a conformal manner as shown in FIG. 22. For example, the contact etch stop material 1121 lining the spacer films 1111 may extend to be in direct contact with the intermediate contact material 1021 in the respective first trench 910T. Subsequently, the first sacrificial material 9221 may be formed on the contact etch stop material 1121 and may fill the first trenches 910T on both of the first region 11N and the second region 11P. The contact etch stop material 1121 and the first sacrificial material 9221 may be similar to the contact etch stop material 1121 and the first sacrificial material 9221 described in FIG. 4.

Figure 23:
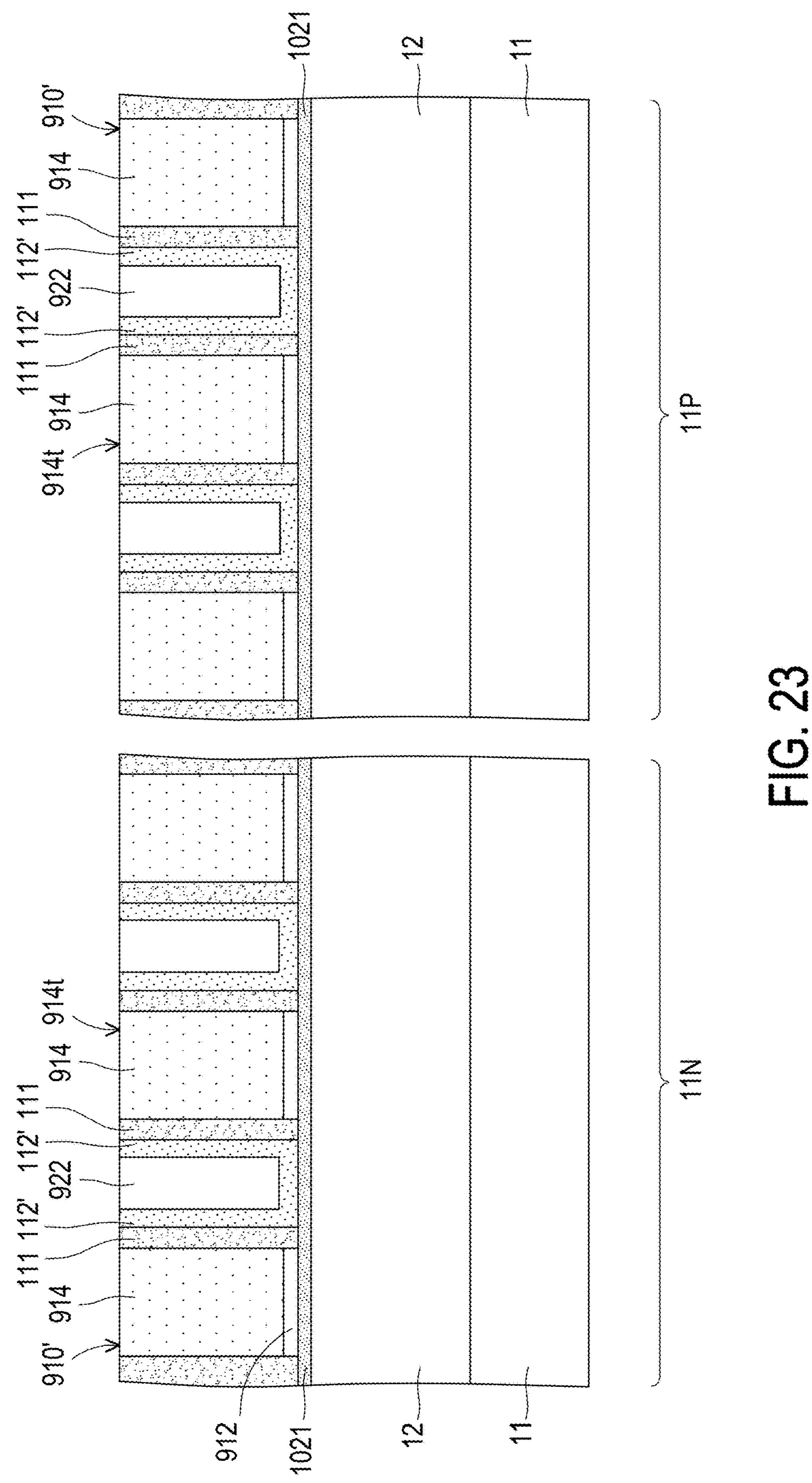

Referring to FIG. 23 and with reference to FIG. 22, portions of the first sacrificial material 9221, the contact etch stop material 1121, the spacer films 1111, and the dummy structures 910 may be removed to respectively form the first sacrificial layer 922, the contact etch stop film 112', the spacers 111, and the dummy structures 910'. For example, the planarization processes may be performed until the semiconductor layer 914 is accessibly revealed. The planarization process may be similar to the process described in FIG. 5. In some embodiments, the top surfaces of the spacer 111, the contact etch stop film 112', and the first sacrificial layer 922 are substantially leveled (e.g., coplanar) with the top surface 914*t* of the semiconductor layer 914, within process variations.

Figure 24:
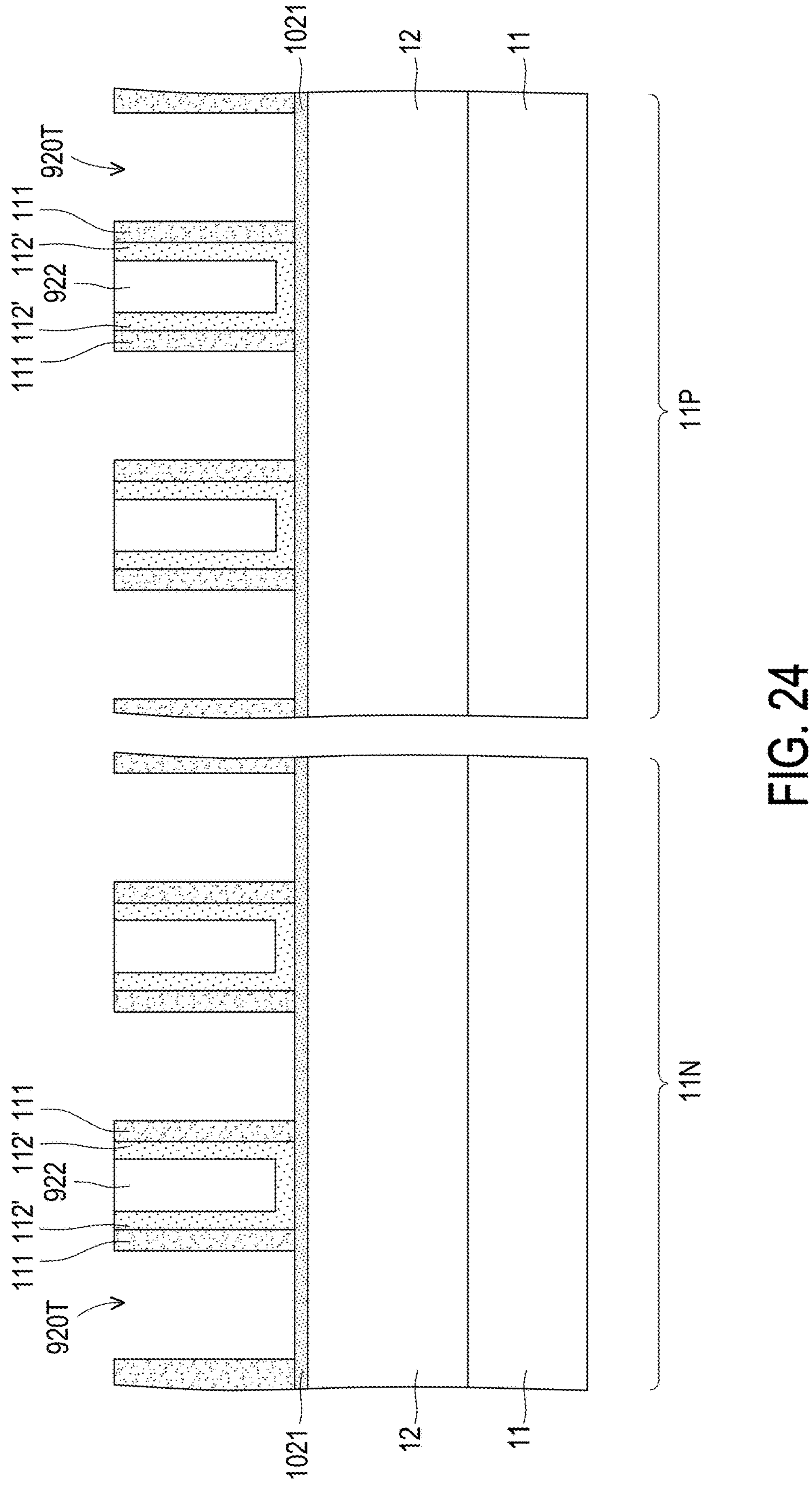
Figure 25:
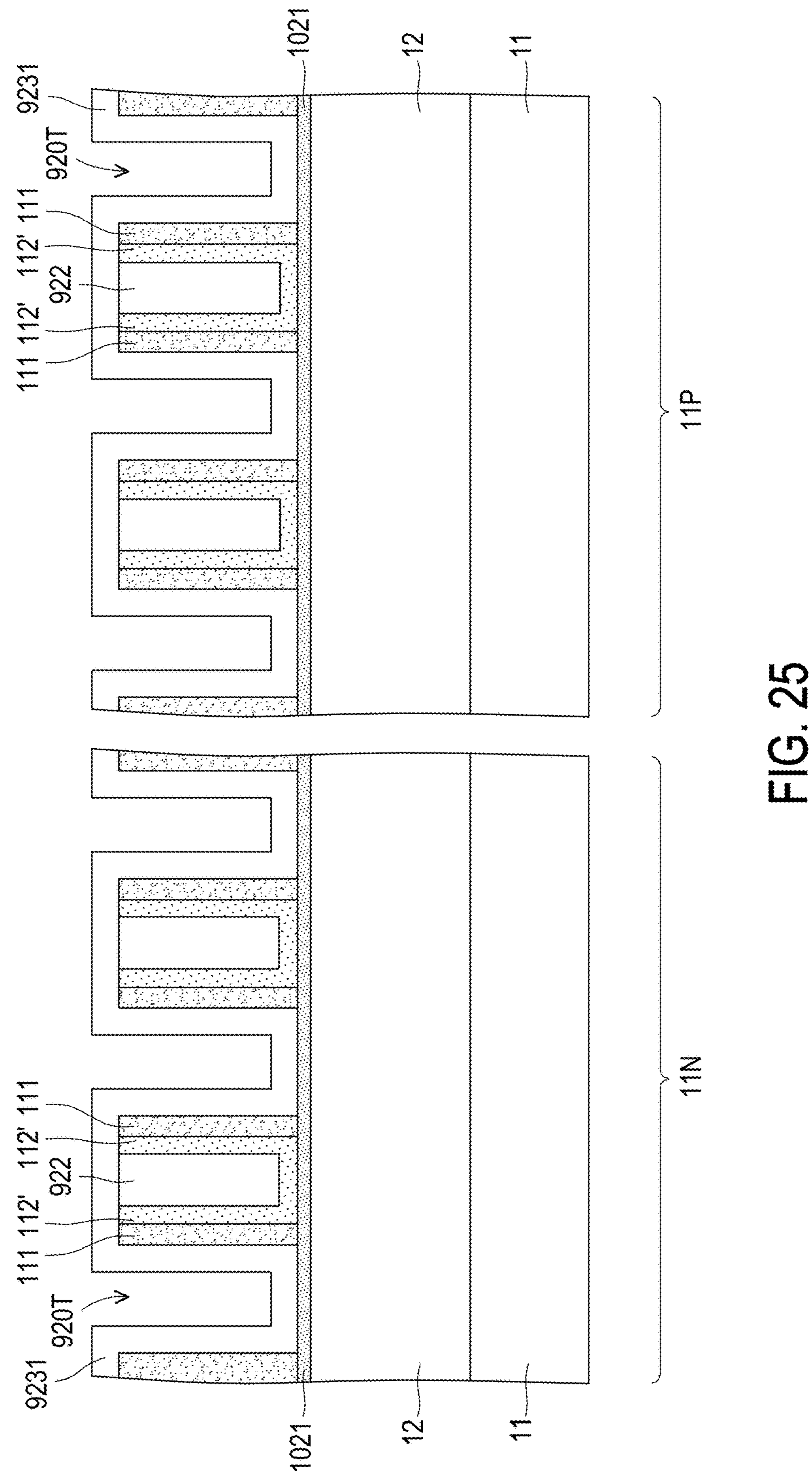

Referring to FIGS. 24-25 and with reference to FIG. 23, the remaining portion of the dummy structure 910' on both of the first region 11N and the second region 11P may be removed to form the second trenches 920T which accessibly expose portions of the intermediate contact material 1021 that were covered by the dummy structures 910'. The removal process of the dummy structures 910' may be similar to the process described in FIG. 6. Next, the second sacrificial material 9231 may be conformally formed on the remaining structures on the intermediate contact material 1021 and also conformally formed in the second trenches 920T on both of the first region 11N and the second region 11P. The formation of the second sacrificial material 9231 may be similar to the process described in FIG. 7. For example, the second sacrificial material 9231 covers the top surfaces of the spacers 111, the contact etch stop film 112', and the first sacrificial layer 922. The second sacrificial material 9231 may extend along sidewalls of the spacers 111 and is in direct contact with the intermediate contact material 1021 in the second trenches 920T.

Figure 26:
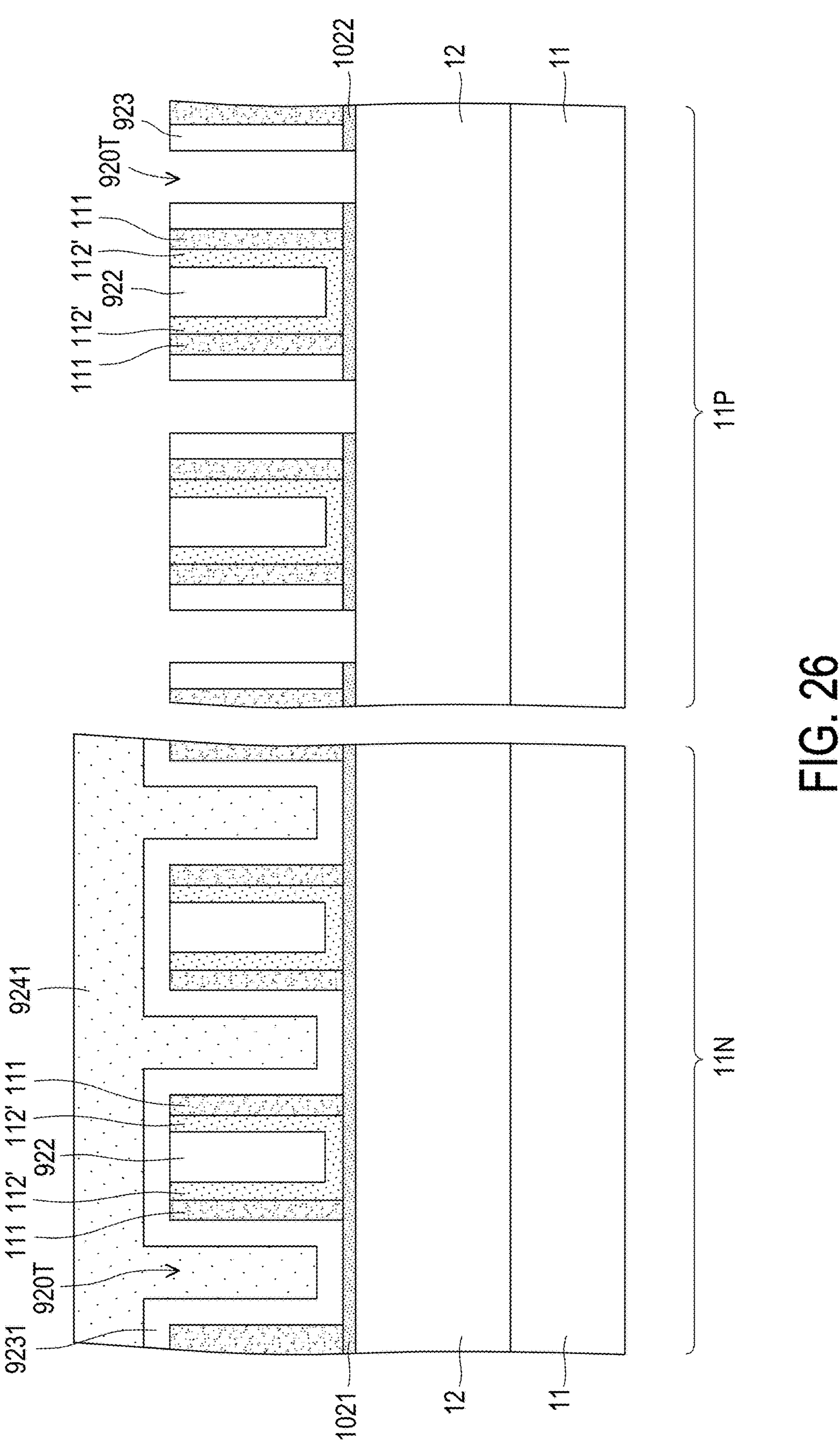

Referring to FIG. 26, the first sacrificial mask layer 9241 may be formed to cover a portion of the second sacrificial material 9231 corresponding to the first region 11N and may also fill the second trenches 920T on the first region 11N. Next, the bottom portion of the second sacrificial material 9231 within the second trenches 920T on the second region 11P may be removed to form the second sacrificial films 923 lining the spacers 111 on the second region 11P, and a portion of the intermediate contact material 1021 underlying the bottom portion of the second sacrificial material 9231 may also be removed to form the intermediate contact material pattern 1022. For example, the etching process may be performed to remove the second sacrificial material 9231 and the intermediate contact material 1021 until the top surface of the bottom dielectric layer 12 within the second trenches 920T on the second region 11P is accessibly revealed. The first sacrificial mask layer 9241 may act as the etching mask when the etching process is performed on the second region 11P. The formation of the first sacrificial mask layer 9241 on the first region 11N and the removal of the second sacrificial material 9231 and the intermediate contact material 1021 within the second trenches 920T on the second region 11P may be similar to the processes described in FIG. 8.

Figure 27:
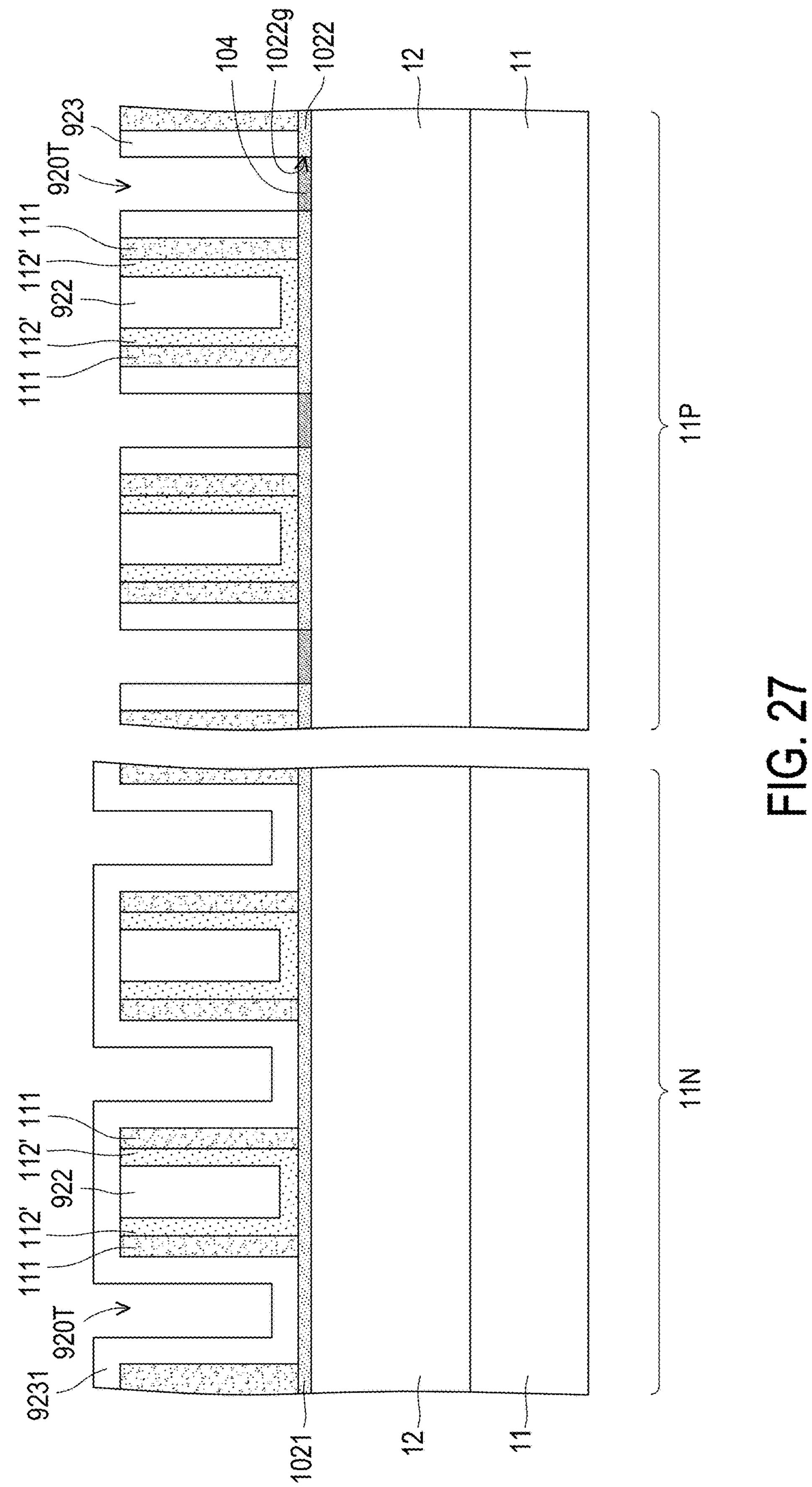

Referring to FIG. 27 and with reference to FIG. 26, the first sacrificial mask layer 9241 formed on the first region 11N may be removed, and then the channel layer 104 may be formed on the exposed surface of the bottom dielectric layer 12 within the second trenches 920T on the second region 11P. For example, the channel layer 104 is formed in the gap 1022*g* of the intermediate contact material pattern 1022 on the second region 11P. In some embodiments, the sidewalls of the channel layer 104 may be in direct contact with the inner sidewall of the intermediate contact material pattern 1022, and the bottom surface of the channel layer 104 may be in direct contact with the top surface of the bottom dielectric layer 12. For example, the growth of the channel layer 104 may be controlled to have a thickness substantially the same as the thickness of the intermediate contact material pattern 1022. The removal of the first sacrificial mask layer 9241 and the formation of the channel layer 104 on the second region 11P may be similar to the processes described in FIG. 9.

Figure 28:
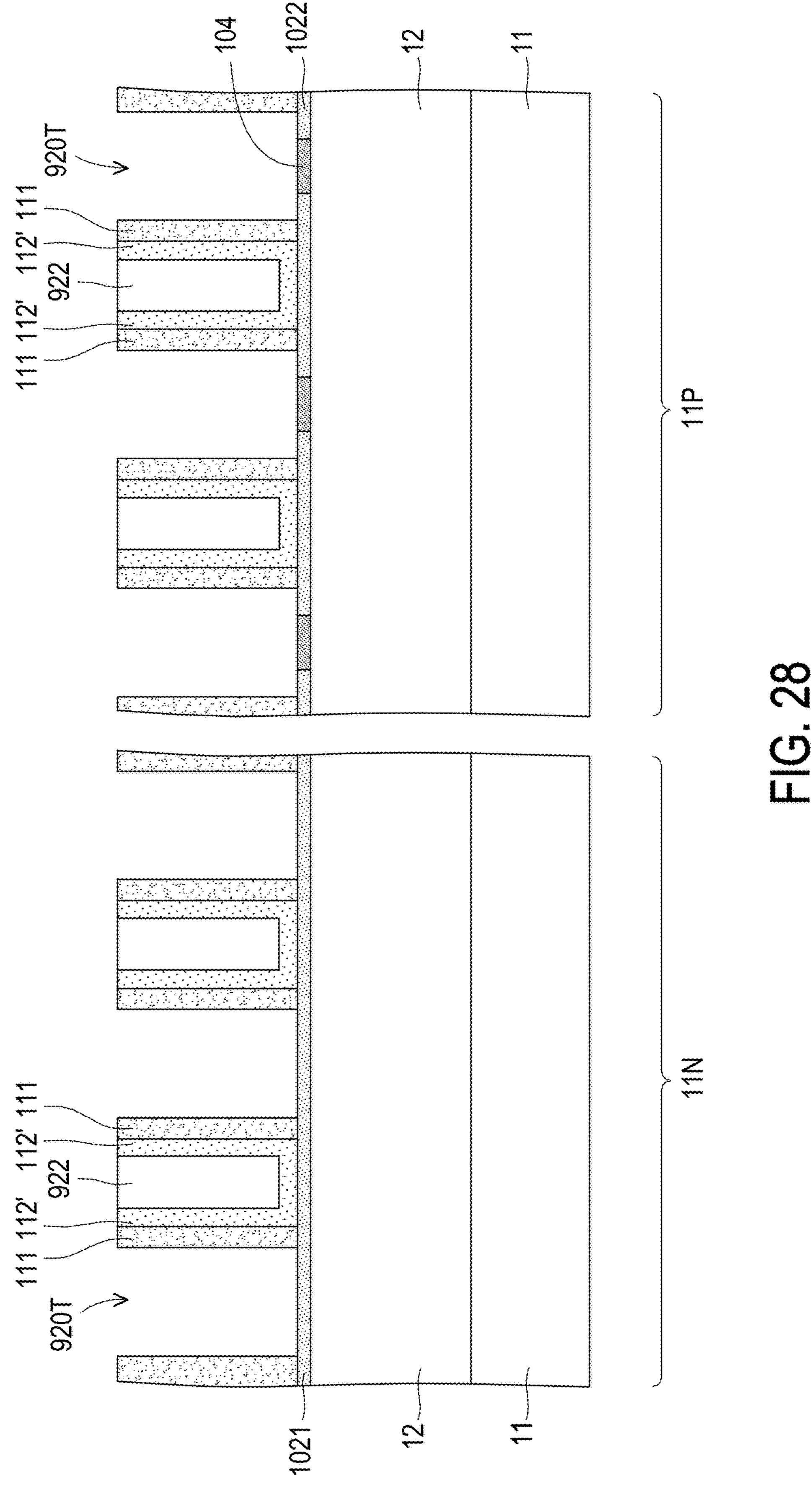
Figure 29:
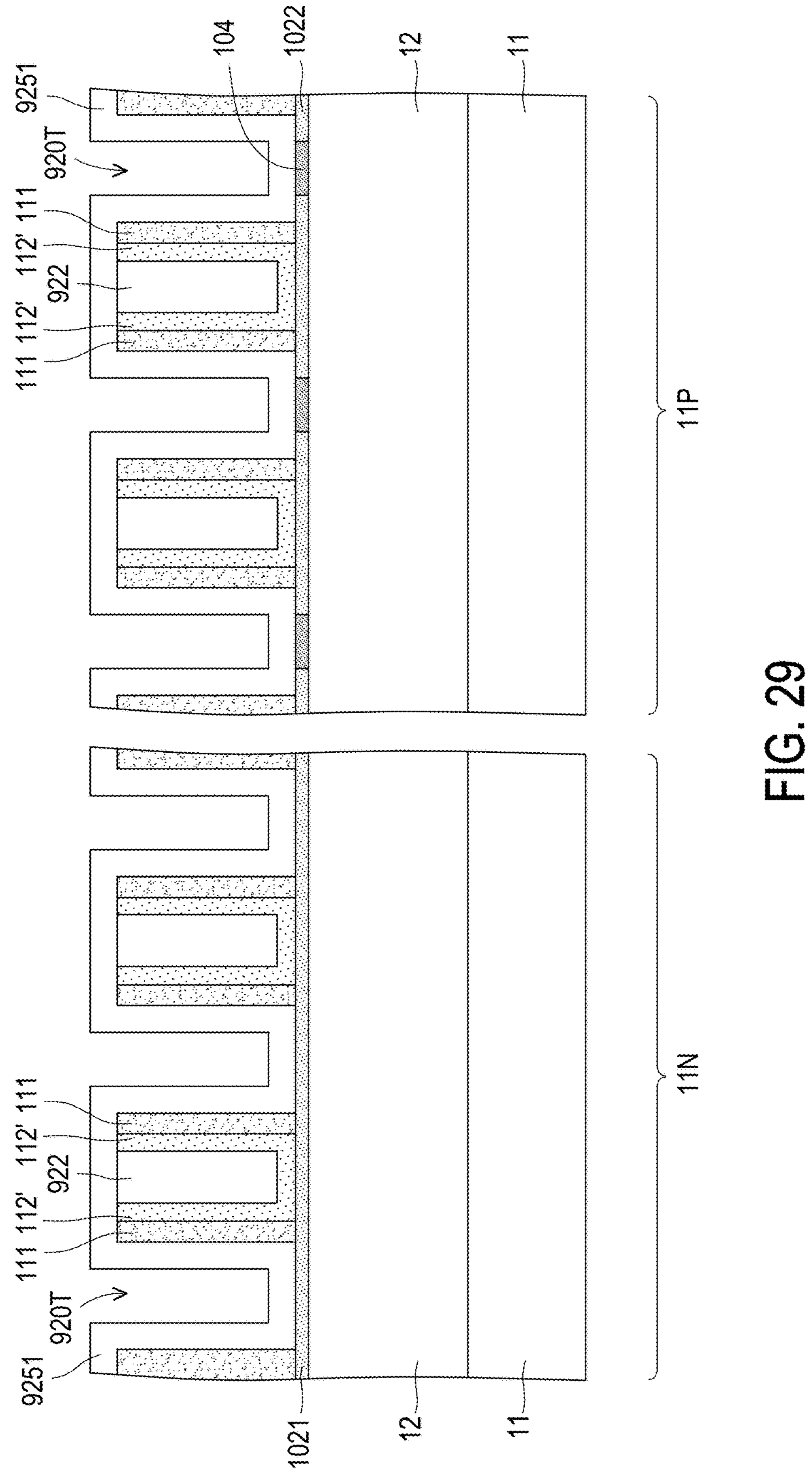

Referring to FIGS. 28-29 and with reference to FIG. 27, the second sacrificial material 9231 left on the first region 11N and the second sacrificial films 923 left on the second region 11P may be removed. The removal process may be similar to the process described in FIG. 10. Next, the third sacrificial material 9251 may be conformally formed on the remaining structures and in the second trenches 920T on both of the first region 11N and the second region 11P. For example, the third sacrificial material 9251 covers the channel layer 104 and the intermediate contact material pattern 1022 laterally adjoining the channel layer 104 for protection. The formation of the third sacrificial material 9251 may be similar to the process described in FIG. 11.

Figure 30:
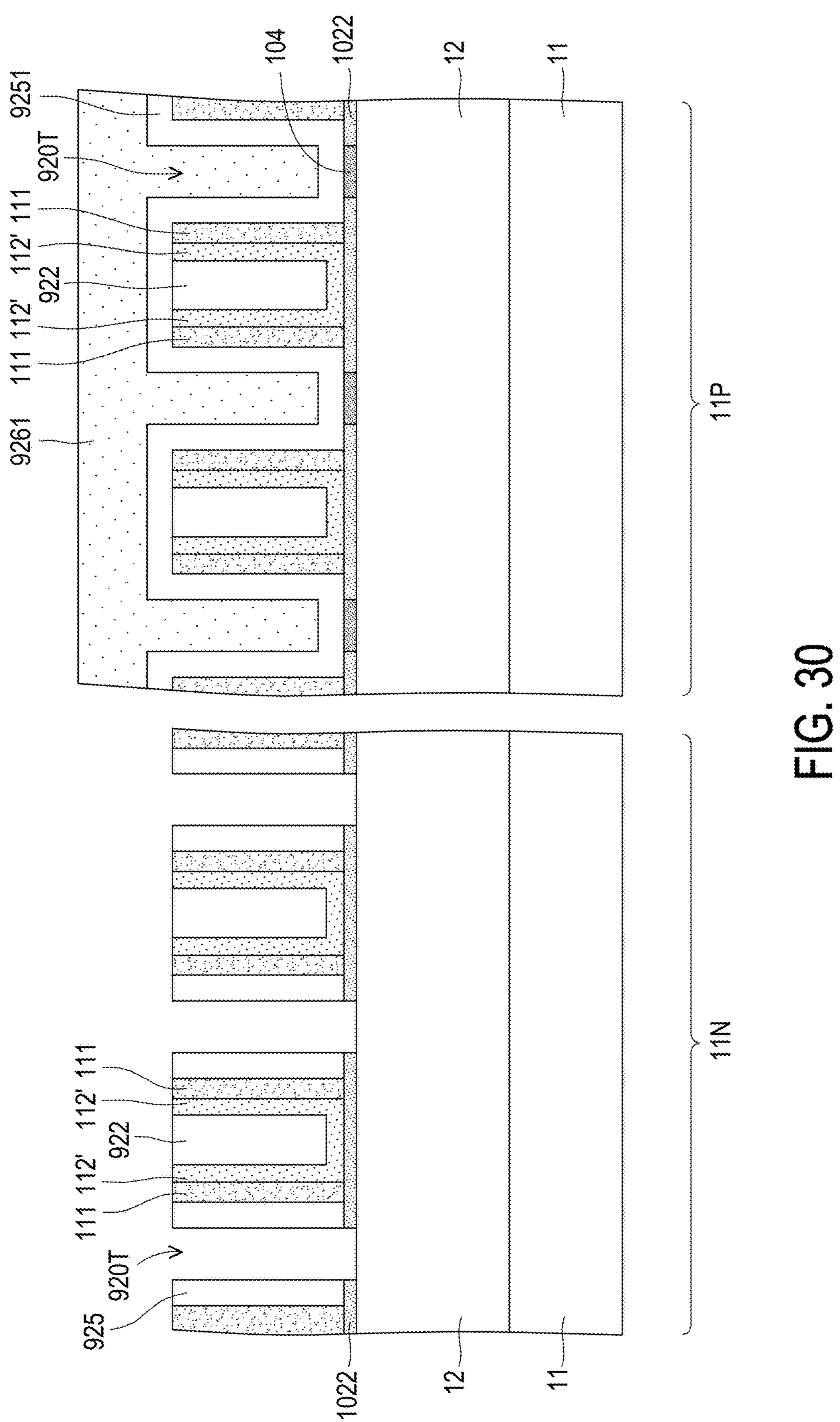

Referring to FIG. 30 and with reference to FIG. 29, the second sacrificial mask layer 9261 may be formed to cover a portion of the third sacrificial material 9251 on the second region 11P and may also fill the second trenches 920T on the second region 11P. Next, the bottom portion of the third sacrificial material 9251 within the second trenches 920T on the first region 11N may be removed to form the third sacrificial films 925 lining the spacers 111 on the first region 11N, and a portion of the intermediate contact material 1021 underlying the bottom portion of the third sacrificial material 9251 may also be removed to form the intermediate contact material pattern 1022 on the first region 11N. For example, one or a few etching process may be performed to remove the third sacrificial material 9251 and the intermediate contact material 1021 until the top surface of the bottom dielectric layer 12 within the second trenches 920T on the first region 11N is accessibly revealed. The second sacrificial mask layer 9261 may act as the etching mask when the etching process is performed on the first region 11N. The formation of the second sacrificial mask layer 9261 on the second region 11P and the removal of the third sacrificial material 9251 and the intermediate contact material 1021 within the second trenches 920T on the first region 11N may be similar to the processes described in FIG. 12.

Figure 31:
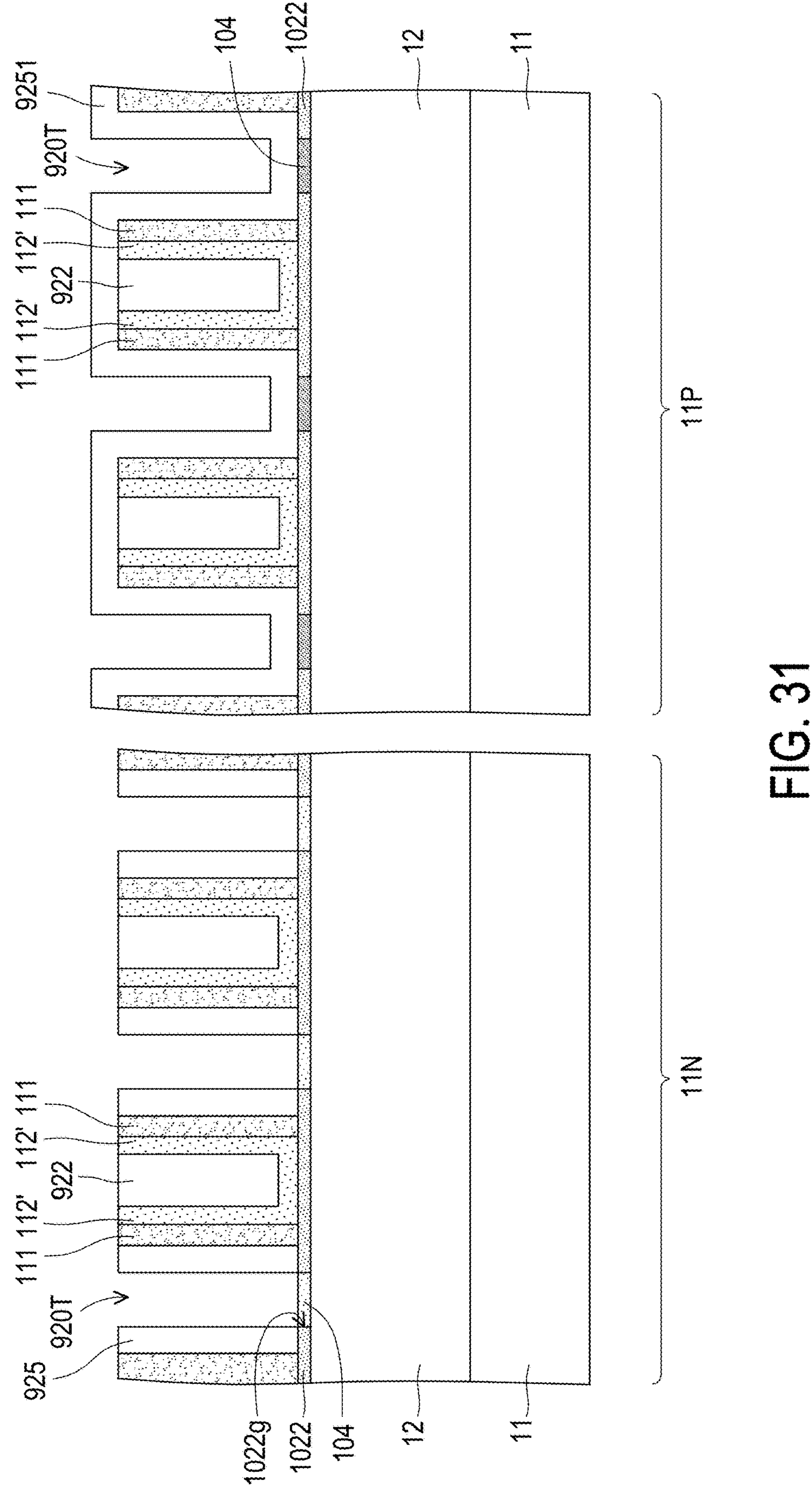

Referring to FIG. 31 and with reference to FIG. 30, the second sacrificial mask layer 9261 formed on the second region 11P may be removed, and then the channel layer 104 may be formed on the exposed surface of the bottom dielectric layer 12 within the second trenches 920T on the first region 11N. For example, the channel layer 104 is formed in the gap 1022*g* of the intermediate contact material pattern 1022. In some embodiments, the sidewalls of the channel layer 104 may be in direct contact with the intermediate contact material pattern 1022, and the bottom surface of the channel layer 104 may be in direct contact with the bottom dielectric layer 12. For example, the growth of the channel layer 104 may be controlled so that the top surface of the channel layer 104 is substantially leveled with the top surface of the intermediate contact material pattern

1022. The removal of the second sacrificial mask layer 9261 and the formation of the channel layer 104 on the first region 11N may be similar to the processes described in FIG. 13.

Figure 32:
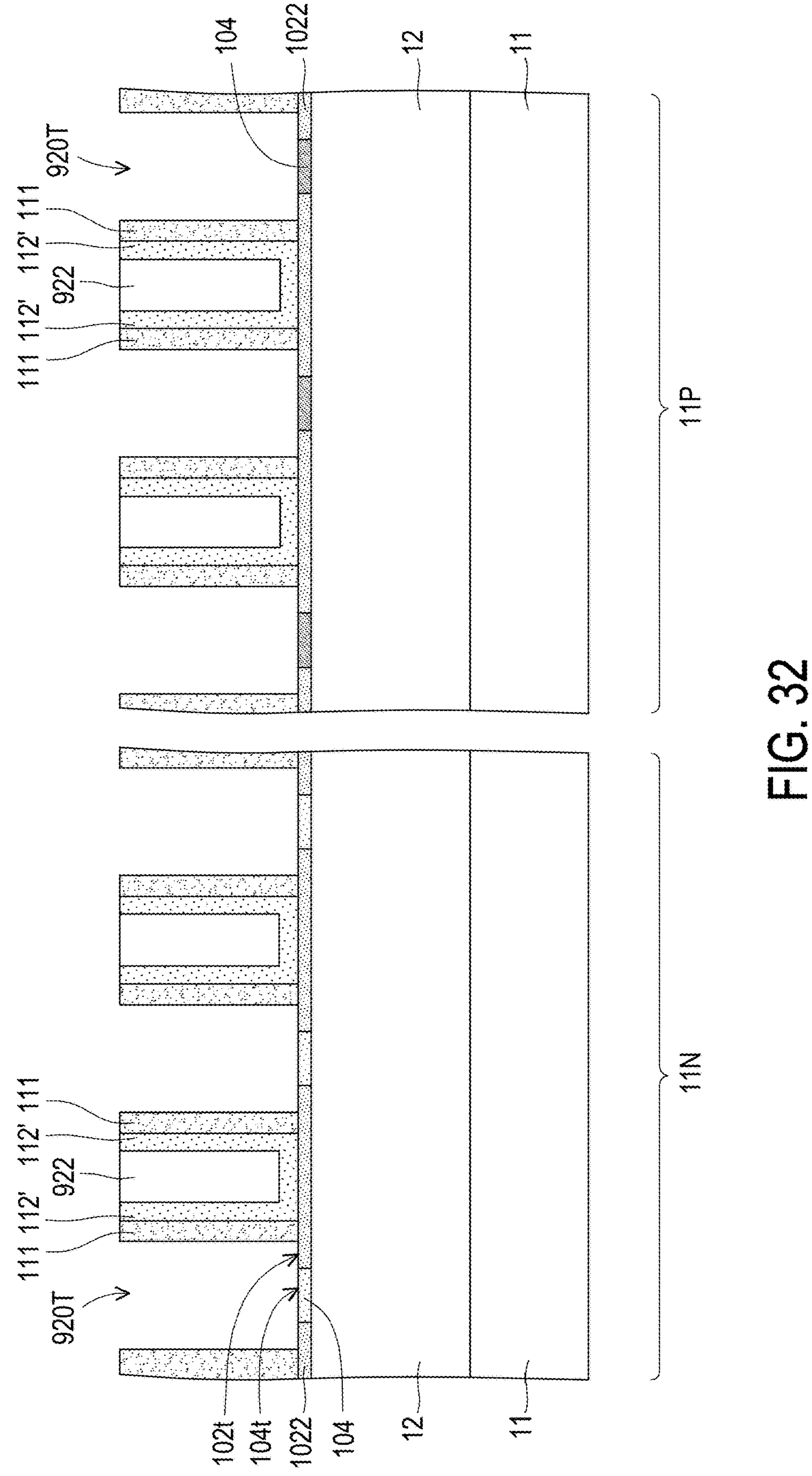

Referring to FIG. 32 and with reference to FIG. 31, the third sacrificial films 925 left on the first region 11N the third sacrificial material 9251 left on the second region 11P may be removed. The removal process may be similar to the process described in FIG. 14. The top surfaces of the channel layer 104 and a portion of the intermediate contact material pattern 1022 laterally adjoining the channel layer 104 may be accessibly revealed in the respective second trench 920T on both of the first region 11N and the second region 11P. In some embodiments, the top surface 104*t* of the channel layer 104 and the top surface 102*t* of the intermediate contact material pattern 1022 laterally adjoining the top surface 104*t* are substantially leveled and planar.

Figure 33:
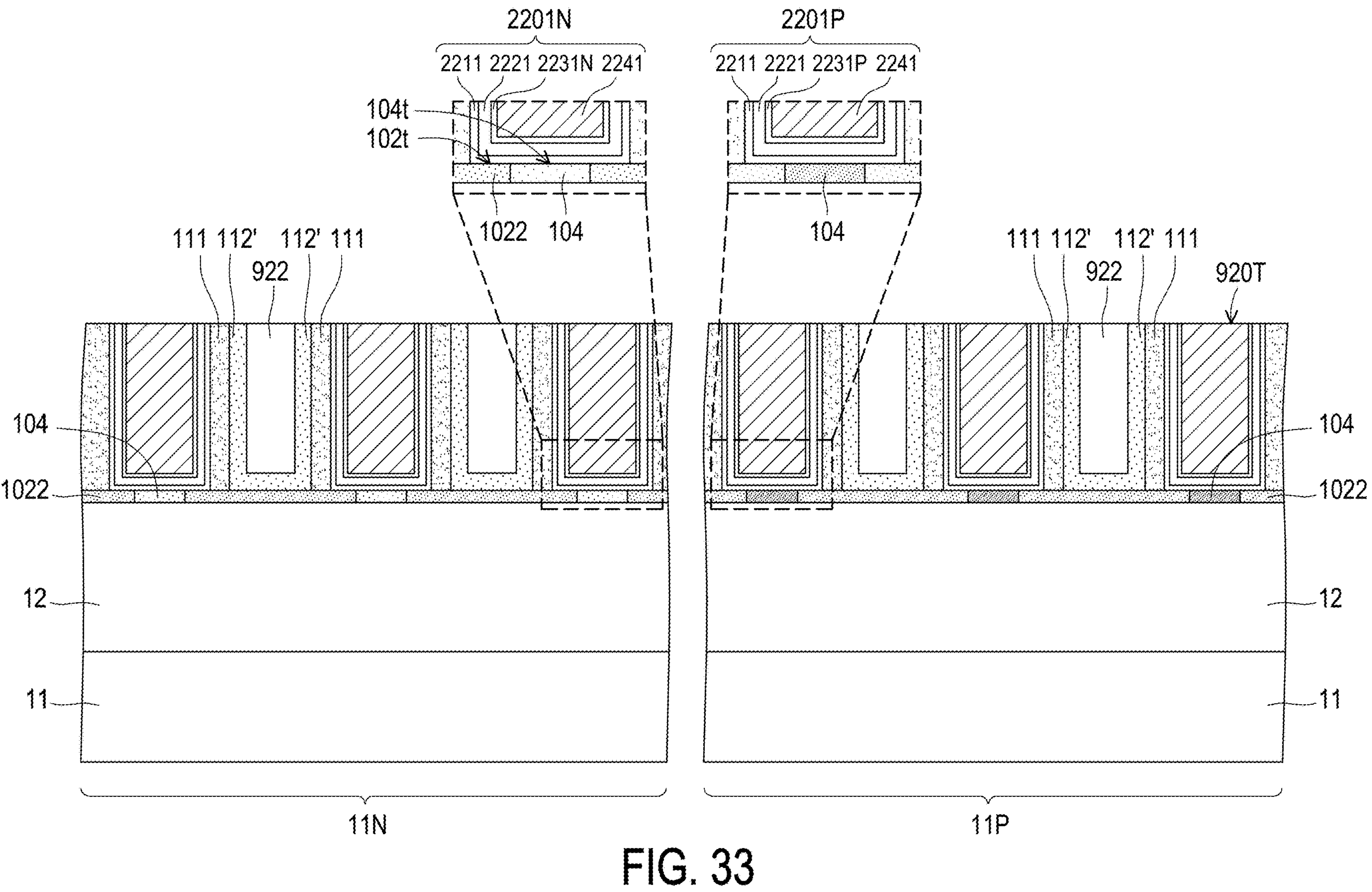

Referring to FIG. 33 and with reference to FIG. 32, the gate material structures (2201N and 2201P) may be formed in the second trenches 920T on the first region 11N and the second region 11P, respectively. For example, the respective gate material structure 2201N on the first region 11N includes the interfacial material 2211 lining the sidewall of the spacer 111 and the top surfaces (102*t* and 104*t*) of the intermediate contact material pattern 1022 and the channel layer 104. The respective gate material structure 2201N may include the gate dielectric material 2221 blanketly formed on the interfacial material 2211, the first work function material 2231N blanketly formed on the gate dielectric material 2221, and the gate material 2241 formed on the first work function material 2231N and filling the corresponding second trench 920T. The respective gate material structure 2201P on the second region 11P may be similar to the gate material structure 2201N on the first region 11N, except that the first work function material 2231N is replaced with the second work function material 2231P which is different from the first work function material 2231N. The materials and the formation of the gate material structures (2201N and 2201P) may be similar to the materials and the formation of the gate material structures (1201N and 1201P) described in FIG. 15.

Figure 34:
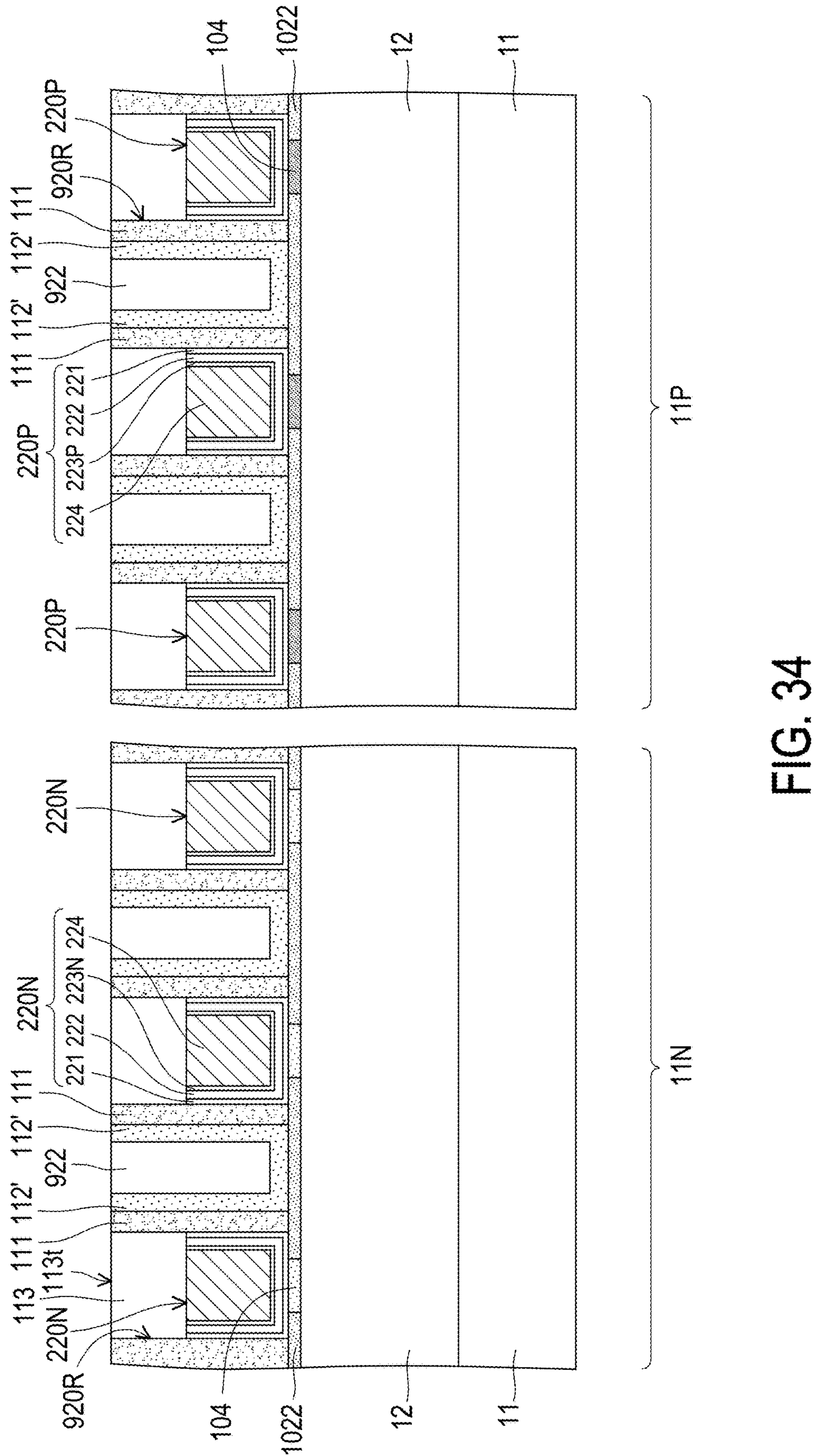

Referring to FIG. 34 and with reference to FIG. 33, the top portion of the respective gate material structure (2201N and 2201P) may be partially removed to form a gate structure (220N and 220P), and the removed region may become the recess 920R surrounded by the spacer 111. The respective gate structure 220N on the first region 11N may include the interfacial layer 221 lining the sidewall of the spacer 111 and the planar top surfaces of the channel layer 104 and the intermediate contact material pattern 1022, the gate dielectric layer 222 lining the interfacial layer 221, the first work function layer 223N lining the gate dielectric layer 222, and the gate metal layer 224 disposed on the first work function layer 223N. The respective gate structure 220P on the second region 11P may be similar to the gate structure 220N on the first region 11N, except that the first work function layer 223N is replaced with the second work function layer 223P. Next, the dielectric layer 113 may be formed on the top surface of the respective gate structure (220N and 220P) and fill the recess 920R. In some embodiments, the top surface 113*t* of the dielectric layer 113 is substantially leveled (e.g., coplanar) with the top surfaces of the spacer 111, the contact etch stop film 112', and the first sacrificial layer 922. The formation of the gate structures (220N and 220P) and the formation of the dielectric layer 113 may be similar to the processes described in FIG. 16.

Figure 35:
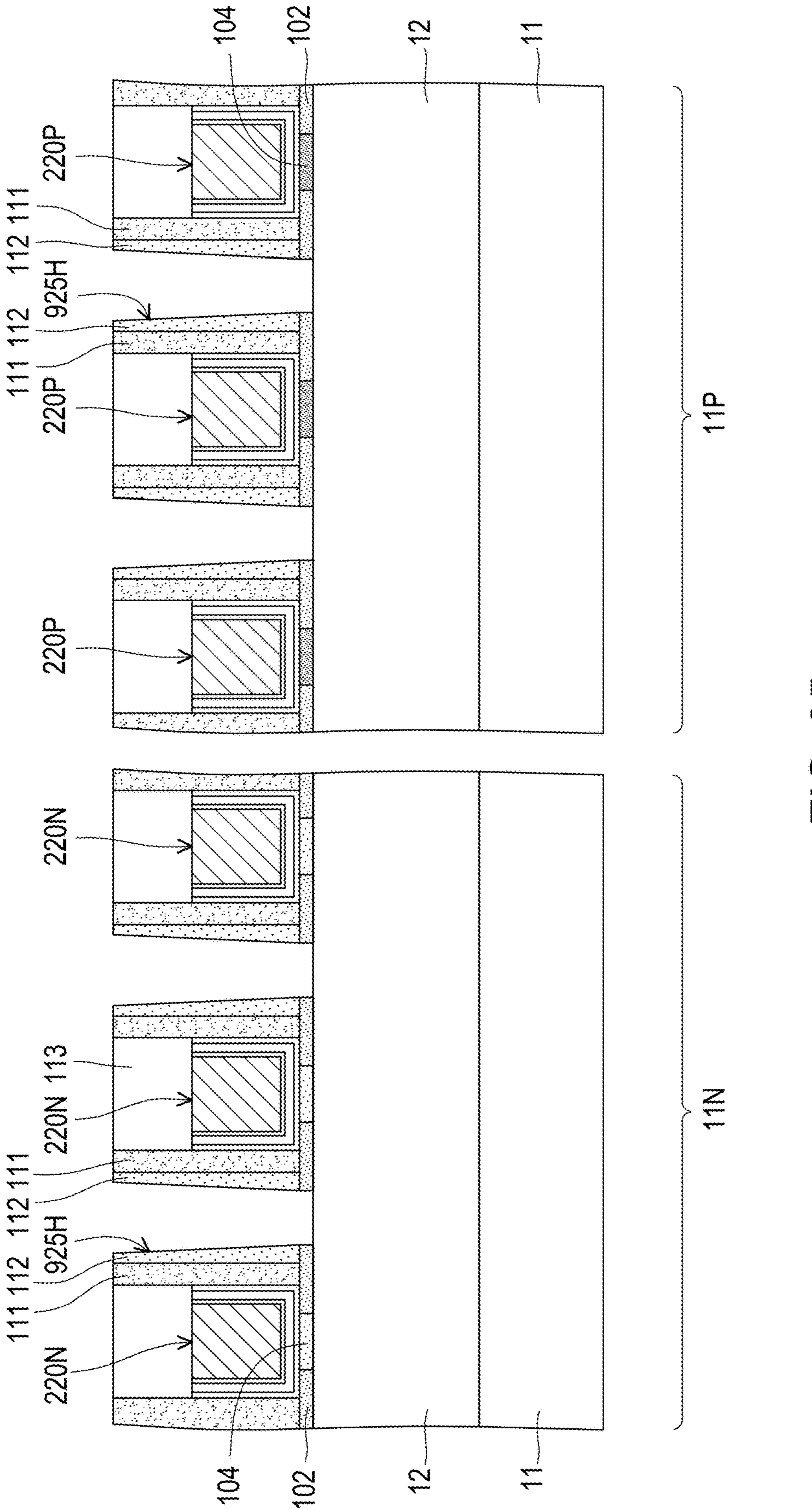

Referring to FIG. 35 and with reference to FIG. 34, the first sacrificial layer 922, a portion of the contact etch stop film 112' underlying the first sacrificial layer 922, and a portion of the intermediate contact material pattern 1022 underlying the portion of the contact etch stop film 112' on both of the first region 11N and the second region 11P may be removed through one or a few etching process to from the contact holes 925H. In some embodiments, the portion of the contact etch stop film 112' is removed during the etching to form the contact etch stop layer 112 having the tilted sidewall. The portion of the intermediate contact material pattern 1022 may be removed during the etching to form the intermediate contact pattern 102 encircling the channel layer 104. The top surface of the bottom dielectric layer 12 may be accessibly revealed after the etching. The formation of the contact holes 925H may be similar to the process described in FIG. 17.

Figure 36:
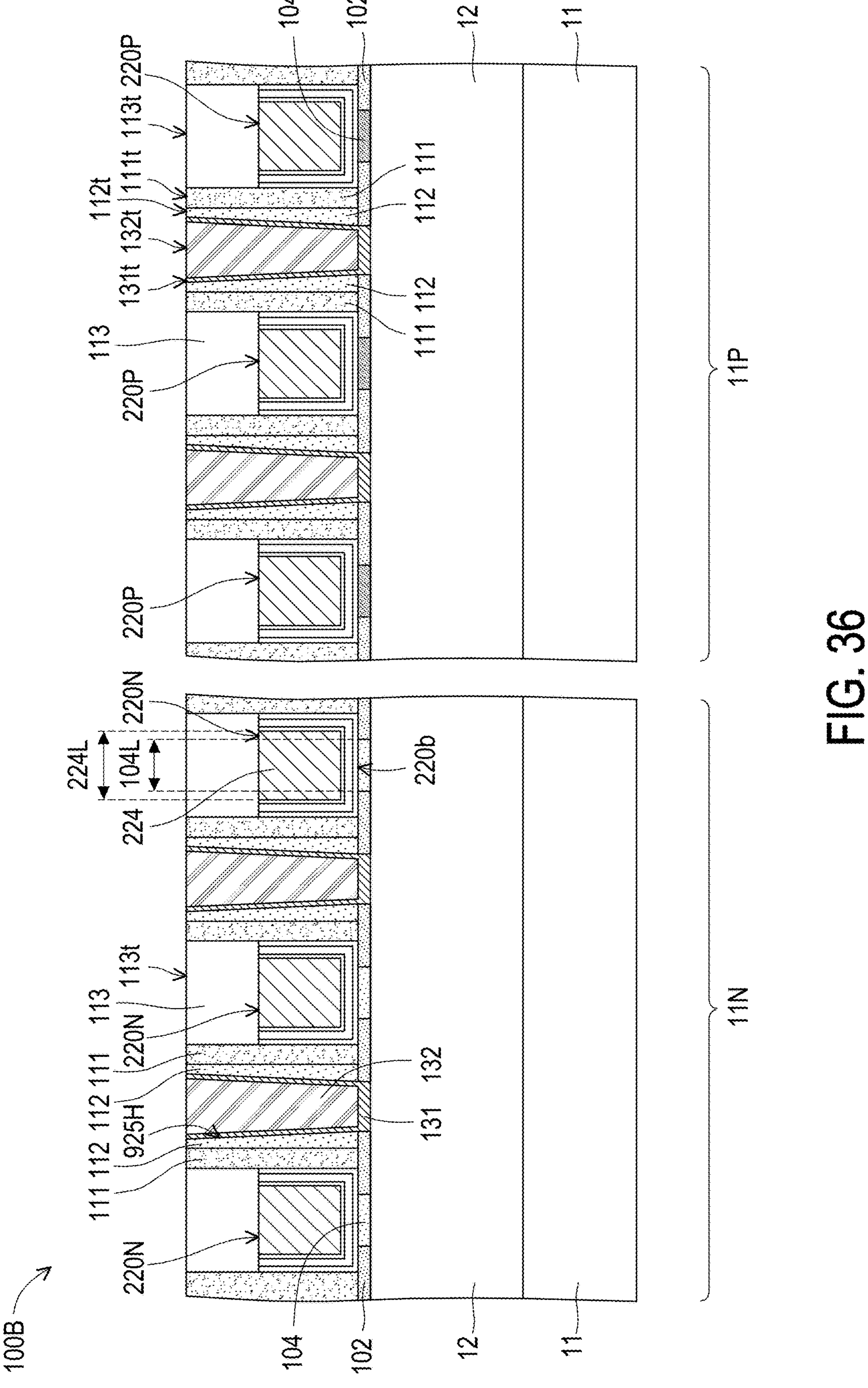

Referring to FIG. 36 and with reference to FIG. 35, the contact metal 131 and the contact plug 132 may be sequentially formed in the respective contact hole 925H on both of the first region 11N and the second region 11P. In some embodiments, the contact metal 131 is conformally formed on the sidewall of the contact etch stop layer 112, the outer sidewall of the intermediate contact pattern 102, and the top surface of the bottom dielectric layer 12. For example, the outer sidewall of the intermediate contact pattern 102 is in direct contact with the contact metal 131, and the inner sidewall of the intermediate contact pattern 102 is in direct contact with the channel layer 104. After forming the contact metal 131, the contact plug 132 may fill the remaining space of the contact hole 925H. The forming processes of the contact metal 131 and the contact plug 132 may be similar to the processes described in FIG. 18. As the process proceeds up to here, a plurality of semiconductor devices (e.g., transistors) 100B is formed over the semiconductor substrate 11.

With continued reference to the cross-sectional view of FIG. 36, the semiconductor device 100B includes the gate structure (220N or 220P) formed between the contact metals 131, where the contact metals 131 may act as source/drain metals. The spacer 111 laterally covering the gate structure (220N or 220P) may have the bottom surface being in direct contact with the intermediate contact pattern 102, and the contact etch stop layer 112 laterally covering the spacer 111 may also have the bottom surface being in direct contact with the intermediate contact pattern 102. In some embodiments, the gate structure (220N or 220P) of the respective semiconductor device 100B may have a maximum lateral dimension greater than the lateral dimension 104L of the channel layer 104. For example, a lateral dimension 224L (e.g., the top width or the bottom width) of the gate metal layer 224 is greater than the lateral dimension 104L of the channel layer 104. In some embodiments, the gate structure (220N or 220P) disposed on the channel layer 104 and the intermediate contact pattern 102 may include a rectangular (or a square) cross section. For example, the gate structure (220N or 220P) has a planar bottom surface 220*b*, where the inner portion of the bottom surface 220*b* overlaps (or is in direct contact with) the channel layer 104, and the outer portion of the bottom surface 220*b* overlaps (or is in direct contact with) the intermediate contact pattern 102 laterally encircling the channel layer 104.

Figure 37:
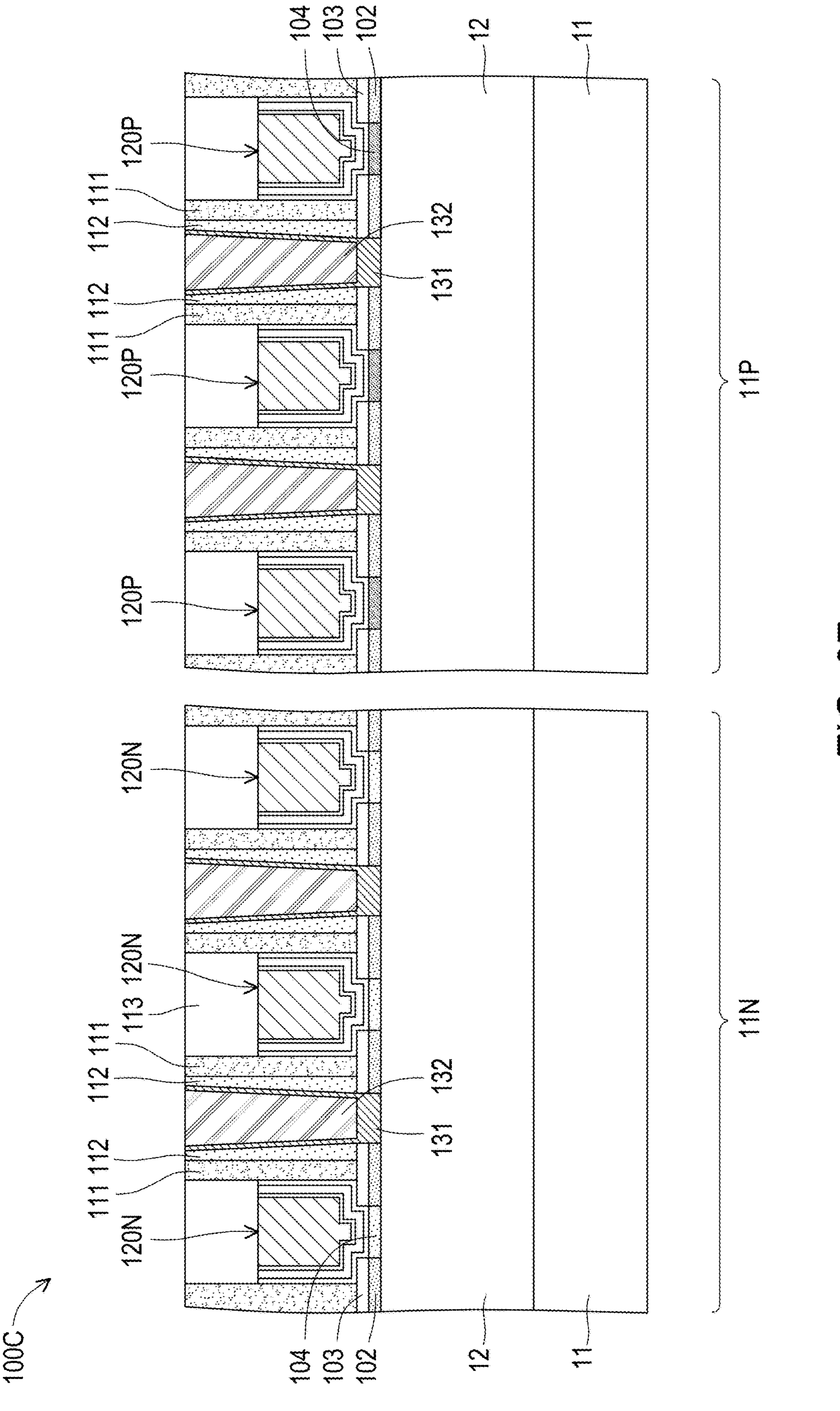
FIGS. 37 and 38 are cross-sectionals view schematically illustrating various semiconductor devices over a semiconductor substrate in accordance with various embodiments.
Figure 38:
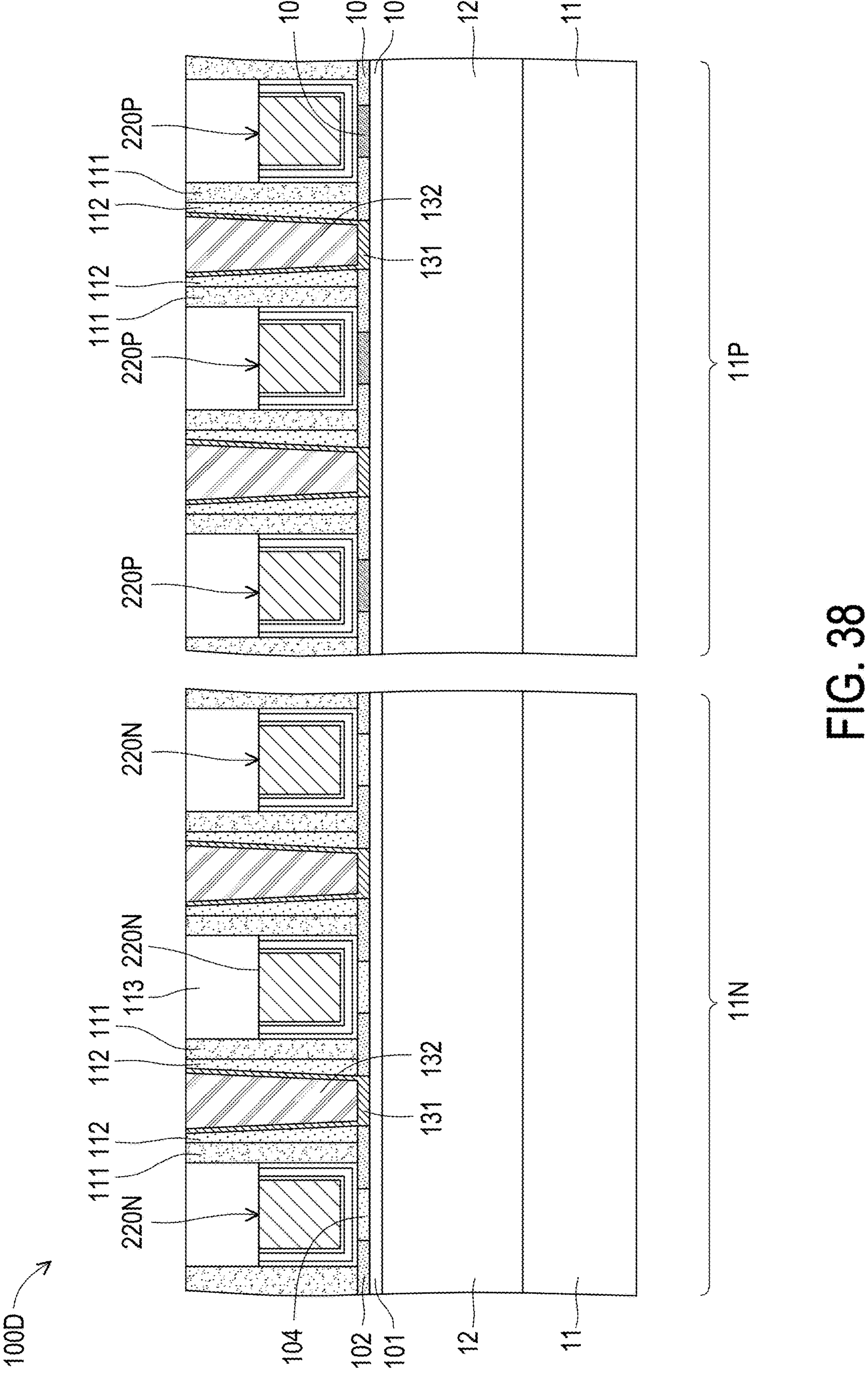

FIGS. 37 and 38 are cross-sectionals view schematically illustrating various semiconductor devices over a semiconductor substrate in accordance with various embodiments. It is noted that like reference numerals refer to like elements as those discussed above with reference to FIGS. 18 and 36.

Referring to FIG. 37 and with reference to FIG. 18, a plurality of semiconductor devices (e.g., transistors) 100C may be formed over the semiconductor substrate 11. The semiconductor devices 100C may be similar to the semiconductor devices 100A shown in FIG. 18, except that the respective semiconductor device 100C may be free of the lower insulating layer 101 interposed between the bottom dielectric layer 12 and the intermediate contact pattern 102. For example, the semiconductor device 100C includes the gate structure (120N or 120P) laterally covered by the spacer 111, the spacer 111 is laterally covered by the contact etch stop layer 112, the contact etch stop layer 112 and the underlying layers of the upper insulating pattern 103 and the intermediate contact pattern 102 are laterally covered by the contact metal 131, where the contact metals 131 may act as source/drain metals. The gate structure (120N or 120P) may have a protruding bottom portion landing on the channel layer 104, and a peripheral bottom portion overlying the upper insulating pattern 103. The upper insulating pattern 103 may cover the top surface of the intermediate contact pattern 102. For example, the intermediate contact pattern 102 of the respective semiconductor device 100C on the first region 11N (or the second region 11P) is in direct contact with the bottom dielectric layer 12, and the channel layer 104 laterally surrounded by the intermediate contact pattern 102 may also be in direct contact with the bottom dielectric layer 12.

Referring to FIG. 38 and with reference to FIGS. 18 and 36, a plurality of semiconductor devices (e.g., transistors) 100D may be formed over the semiconductor substrate 11. The semiconductor devices 100D may be similar to the semiconductor devices 100B shown in FIG. 36, except that the respective semiconductor device 100D may include the lower insulating layer 101 overlying the bottom dielectric layer 12. The channel layer 104 and the intermediate contact pattern 102 laterally encircling the channel layer 104 may be disposed on the top surface of the lower insulating layer 101. For example, the semiconductor device 100D includes the gate structure (220N or 220P) laterally covered by the spacer 111, the spacer 111 is laterally covered by the contact etch stop layer 112, the contact etch stop layer 112 and the underlying layers of the intermediate contact pattern 102 and the lower insulating layer 101 are laterally covered by the contact metal 131, where the contact metals 131 may act as source/drain metals. The bottom surface of the respective gate structure (220N or 220P) may be directly connected to the channel layer 104 and the intermediate contact pattern 102 laterally encircling the channel layer 104.

FIGS. 39-57 are cross-sectional views schematically illustrating various stages of a manufacturing method of a semiconductor device over a semiconductor substrate according to some embodiments. Unless specified otherwise, the materials and the formation methods of the components in these embodiments are essentially the same as the like components, which are denoted by like reference numerals in the embodiments shown in FIGS. 1-38.

Figure 39:
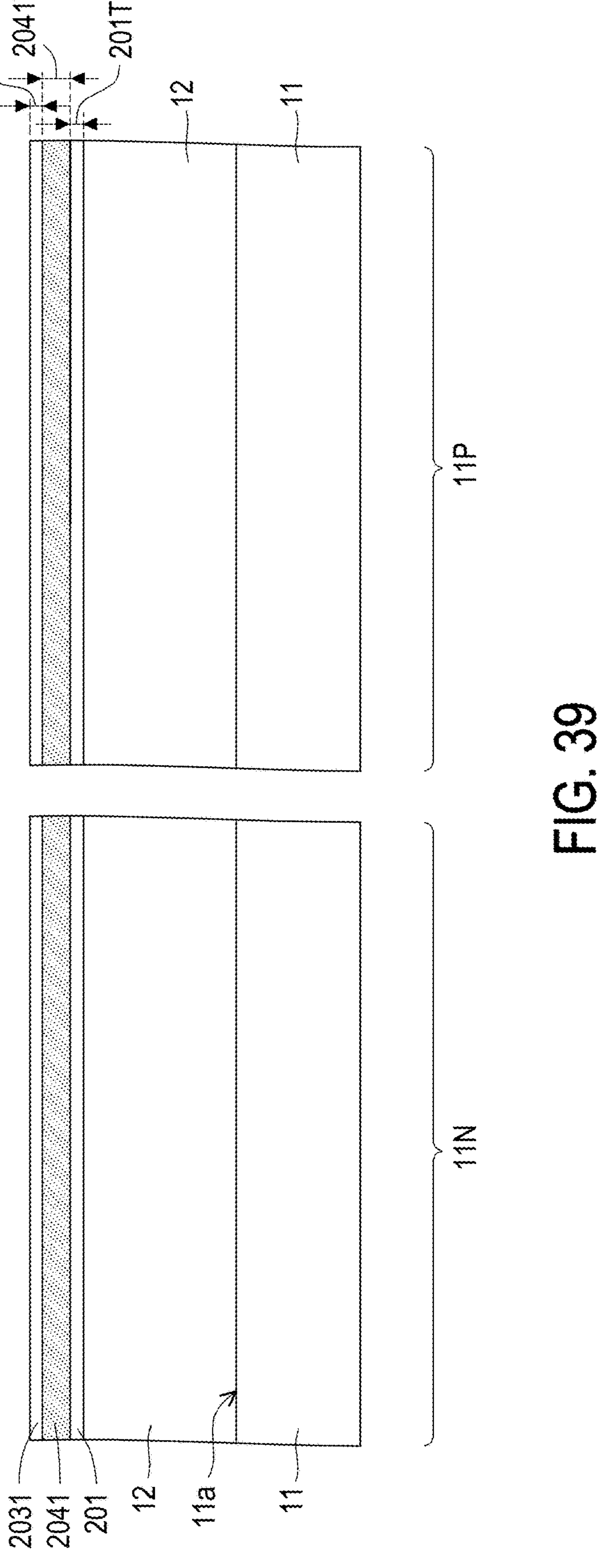
FIGS. 39-57 are cross-sectional views schematically illustrating various stages of a manufacturing method of a semiconductor device over a semiconductor substrate according to some embodiments.

Referring to FIG. 39 and with reference to FIG. 1, the bottom dielectric layer 12 overlies the first surface 11*a* of the semiconductor substrate 11 on both of the first region 11N and the second region 11P. In some embodiments, a lower insulating layer 201, a channel material layer 2041, and an upper insulating material 2031 are sequentially formed on the bottom dielectric layer 12. The formation and materials of the lower insulating layer 201 and the upper insulating material 2031 may be similar to those of the lower insulating material 1011 and the upper insulating material 1031 described in FIG. 1. The lower insulating layer 201 and/or the upper insulating material 2031 may be omitted, in accordance with some embodiments. The channel material layer 2041 may include 2D material(s) and may be disposed on the lower insulating layer 201 through a transfer process. Examples of suitable channel material layer 2041 include a few monolayers of TMD, such as $MoS_2$, $WS_2$, $WSe_2$, or the like. The thickness 201T of the lower insulating layer 201 and the thickness 203T of the upper insulating material 2031 may be in a range of about 0.5 nm to about 50 nm. The thickness 2041T of the channel material layer 2041 may be in a range of about 0.5 nm to about 10 nm. In some embodiments, the thickness 2041T is greater than the thickness 201T (and/or the thickness 203T).

Figure 40:
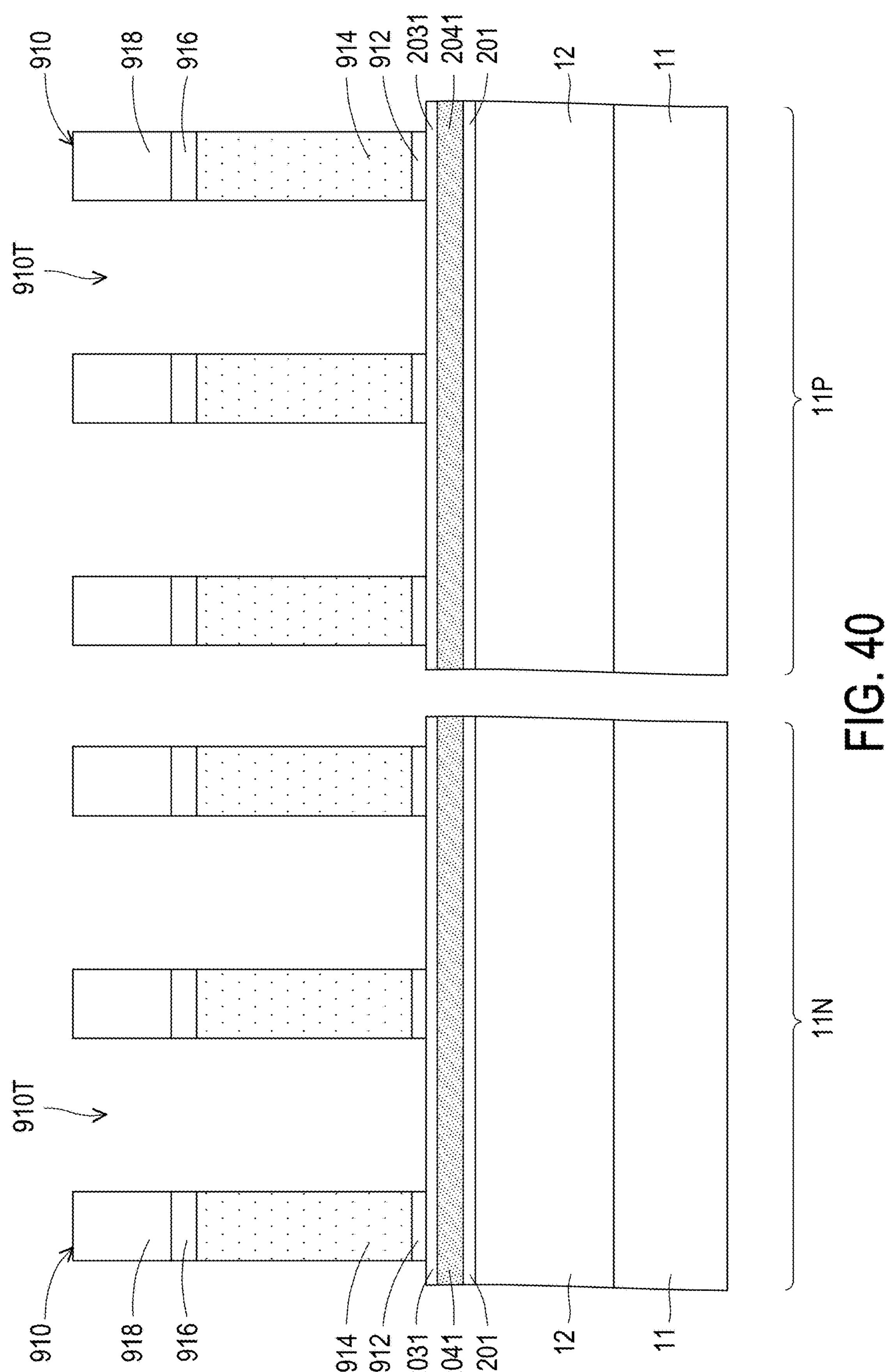

Referring to FIG. 40 and with reference to FIG. 2, the dummy structures 910 may be formed over the semiconductor substrate 11 on both of the first region 11N and the second region 11P, and the first trenches 910T are formed to spatially separate the dummy structures 910 from one another. The dummy structures 910 and the first trenches 910T may be similar to the dummy structures 910 and the first trenches 910T described in FIG. 2. For example, the respective dummy structure 910 includes a stack of the first dielectric layer 912, the semiconductor layer 914, the etch stop layer 916, and the second dielectric layer 918. In some embodiments, the first dielectric layer 912 of the respective dummy structure 910 is in direct contact with the upper insulating material 2031.

Figure 41:
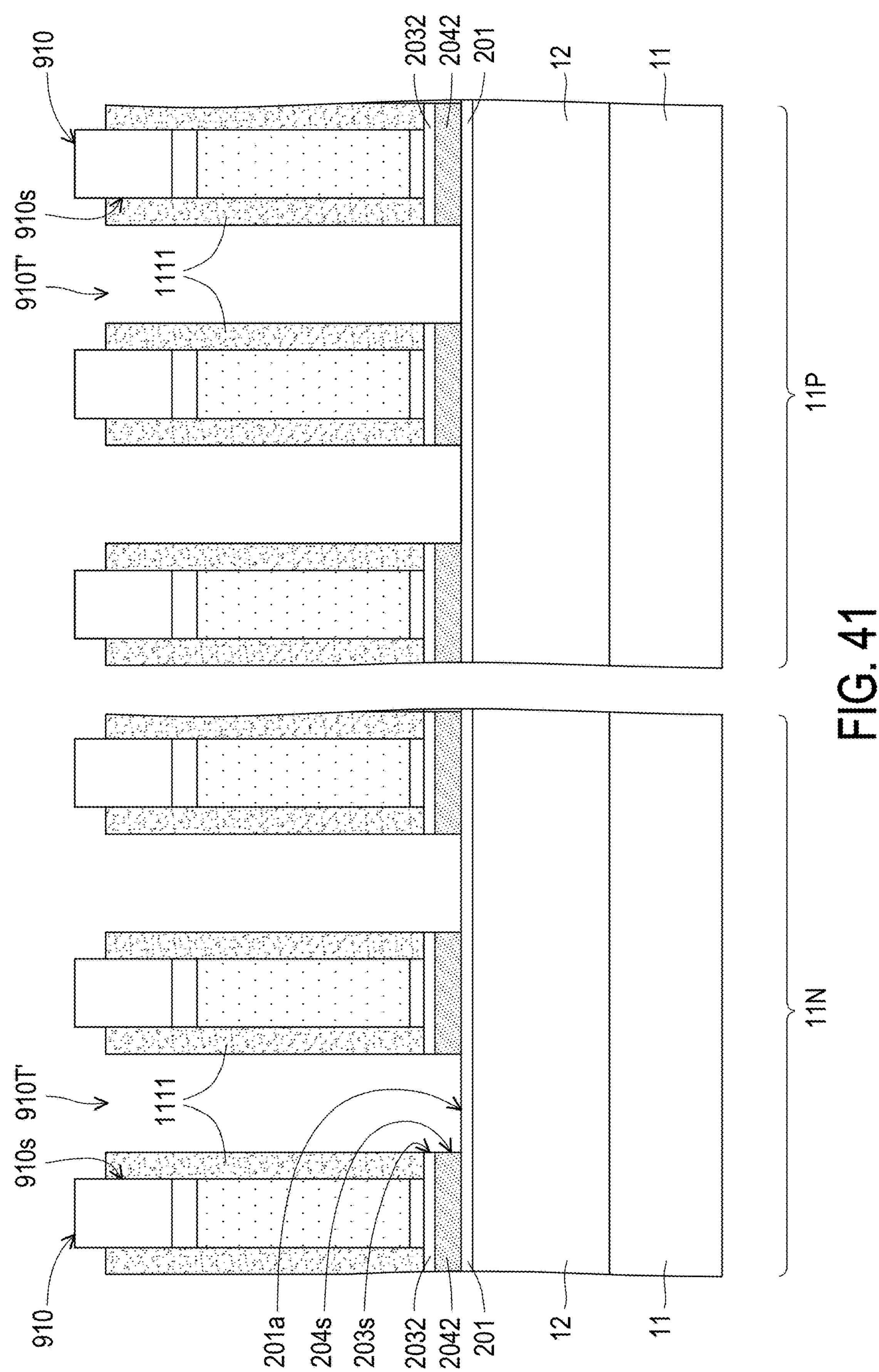

Referring to FIG. 41 and with reference to FIG. 40, the spacer films 1111 may be formed on the sidewalls 910*s* of the dummy structures 910 on both of the first region 11N and the second region 11P. In some embodiments, the material and the forming process of the spacer films 1111 is similar to those of the spacer films 1111 described in FIG. 3. In some embodiments, the spacer films 1111 include metal-based oxide materials such as $WO_x$, $MoO_x$, or the like. Next, a portion of the upper insulating material 2031 in the respective first trench 910T and a portion of the channel material layer 2041 underlying the portion of the upper insulating material 2031 may be removed by an etching process or any suitable technique. Thereafter, the top surface 201*a* of the lower insulating layer 201 are accessibly revealed in the first trenches 910T'. The inner sidewalls 203*s* of the upper insulating material pattern 2032 and the inner sidewalls 204*s* of the channel material pattern 2042 are accessibly revealed and may be substantially leveled with one another.

Figure 42:
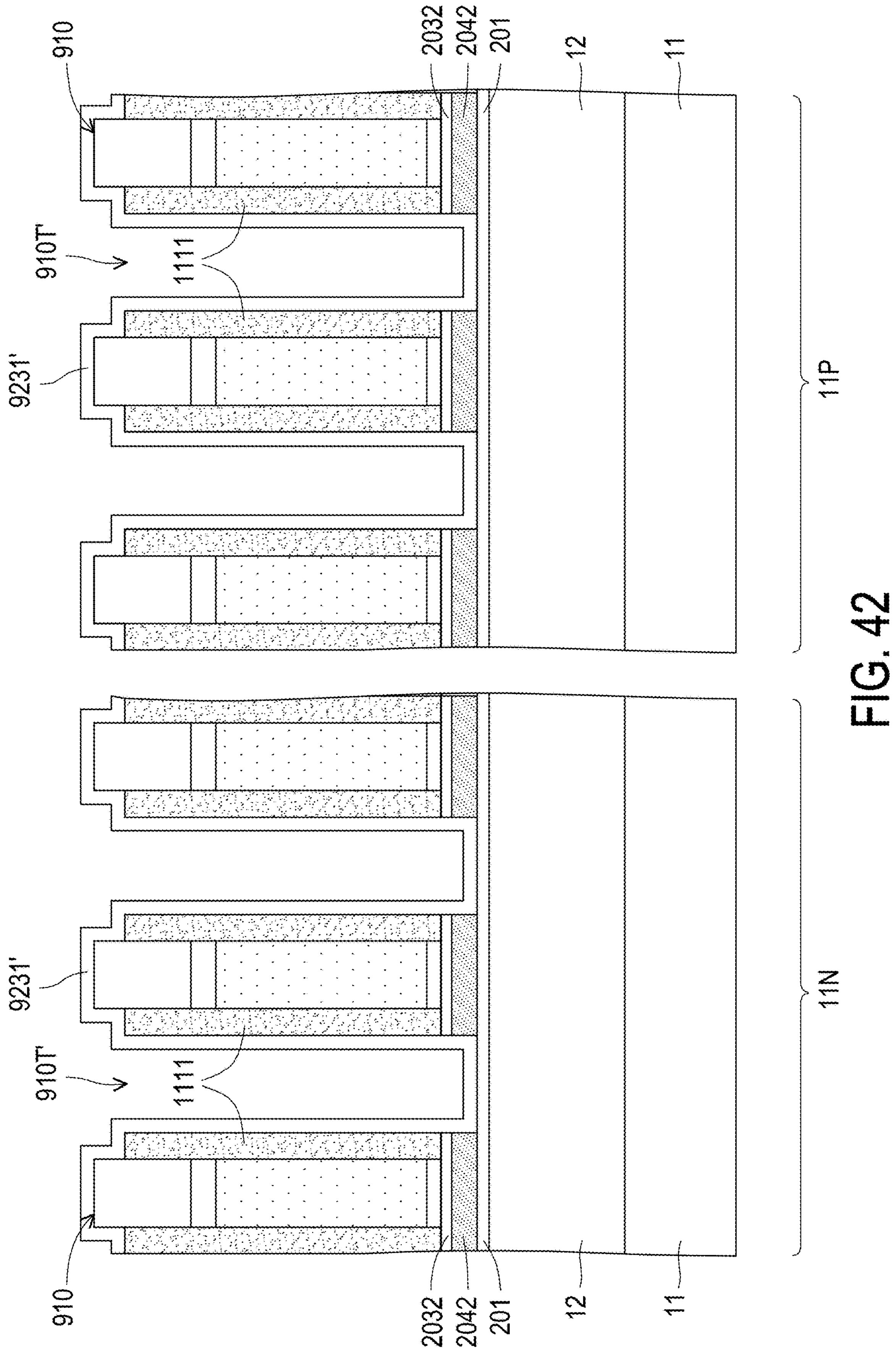
Figure 43:
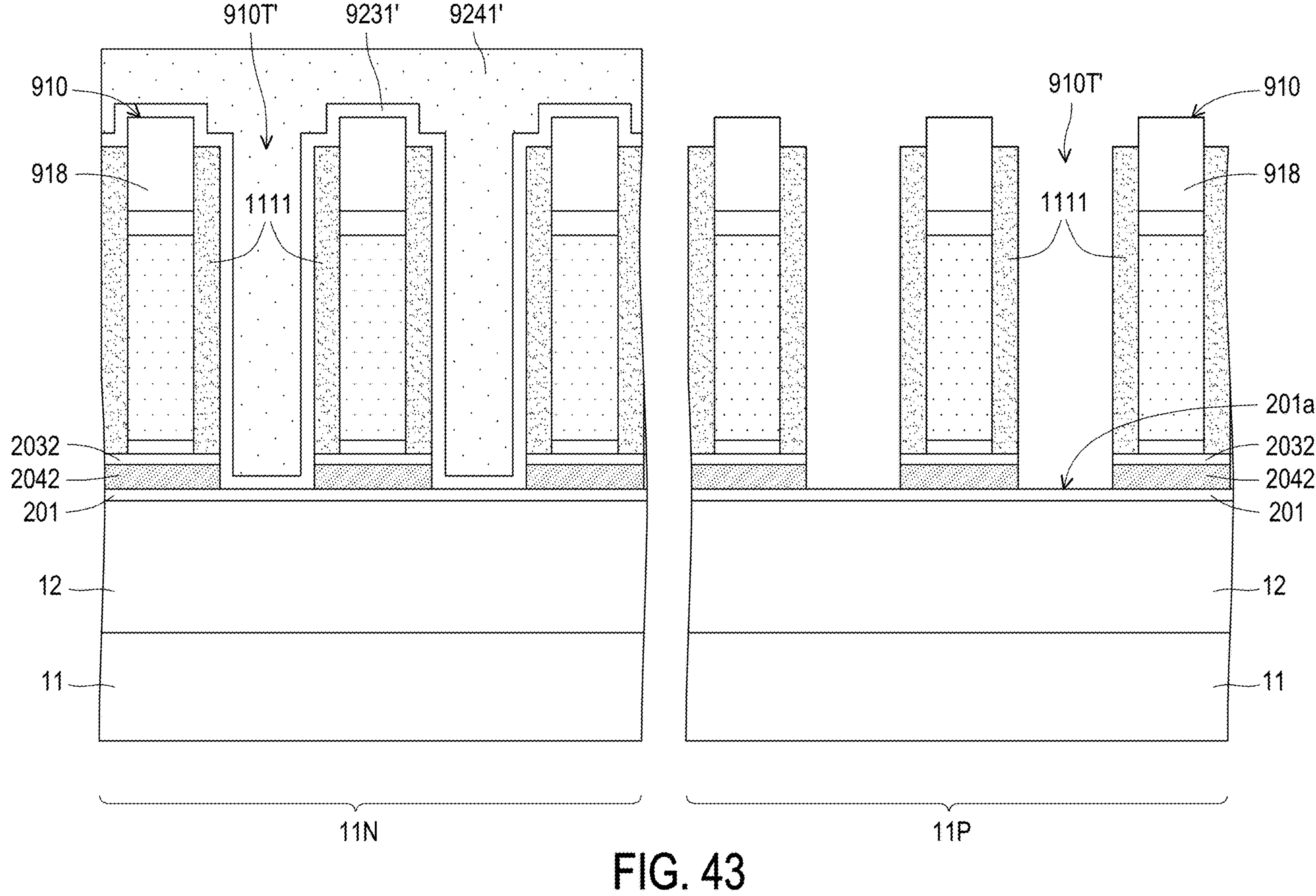

Referring to FIGS. 42-43 and with reference to FIG. 41, a first sacrificial material 9231' may be conformally formed on the remaining structures on the lower insulating layer 201 and also conformally formed in the first trenches 910T' on both of the first region 11N and the second region 11P. The material and the formation of the first sacrificial material 9231' may be similar to those of the second sacrificial material 9231 described in FIG. 7. Next, a second sacrificial mask layer 9241' may be formed to cover a portion of the first sacrificial material 9231' on the first region 11N and fill the first trenches 910T' on the first region 11N. The material and the formation of the second sacrificial mask layer 9241' may be similar to those of the first sacrificial material 9241 described in FIG. 8. Subsequently, a portion of the first sacrificial material 9231' on the second region 11P may be removed by an etching process or any suitable technique. The dummy structures 910 and the top surface 201*a* of the lower insulating layer 201 within the first trenches 910T' on the second region 11P may be accessibly revealed.

Figure 44:
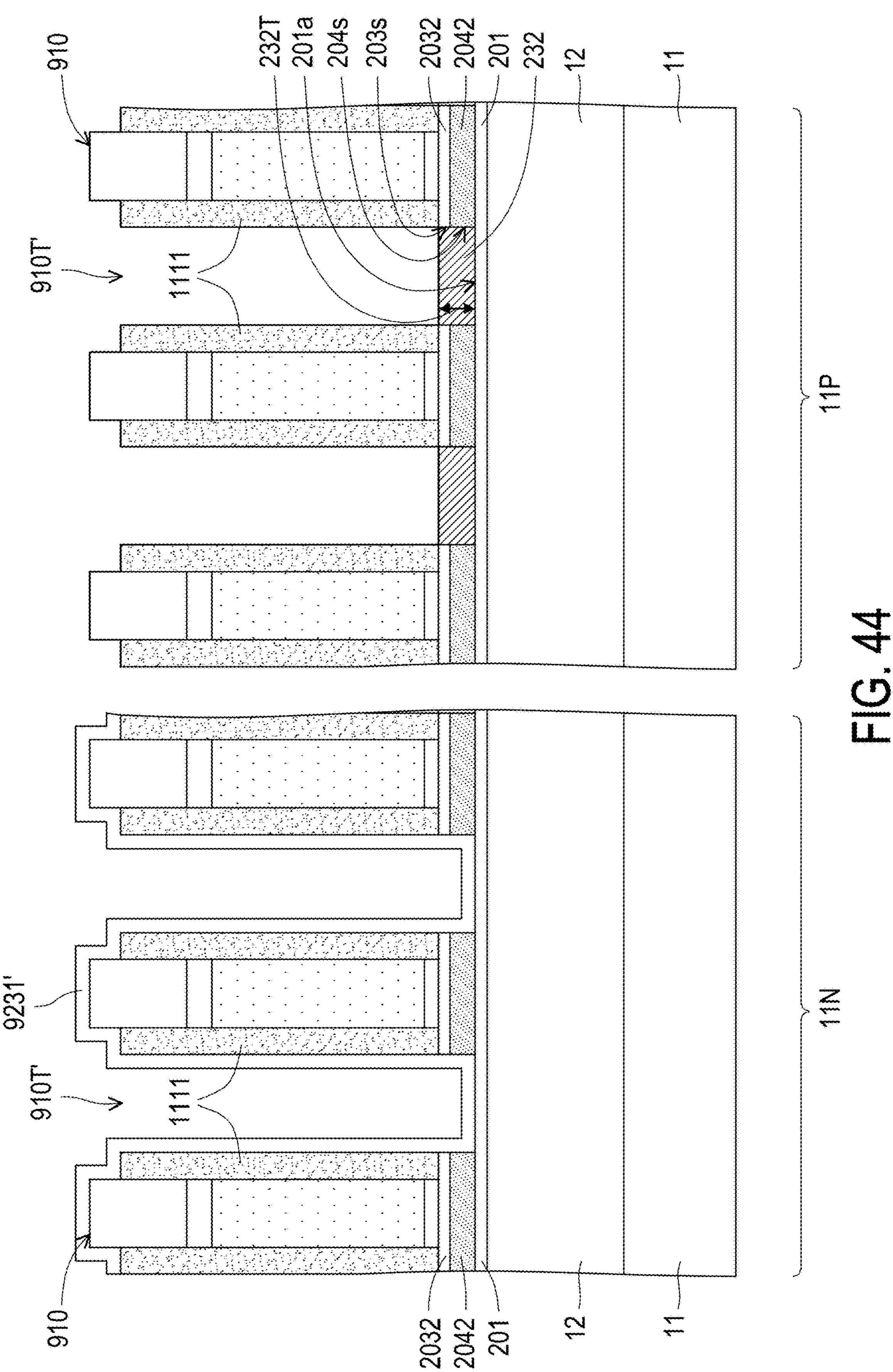

Referring to FIG. 44 and with reference to FIG. 43, first contact material layers 232 are formed on the lower insulating layer 201 within the first trenches 910T' on the second region 11P. For example, the second sacrificial mask layer 9241' formed on the first region 11N is removed, and then an epitaxial growth process is performed to form the first contact material layers 232 within the first trenches 910T' on the second region 11P. The first contact material layers 232 may be or may include semi-metallic TMD material(s) or metallic 2D material(s). Examples of suitable first contact material layers 232 include $MoS_2$, $Mo_xN_y$ (e.g., $Mo_5N_6$), $PtSe_2$, or the like. In some embodiments, the first contact material layers 232 include metal films (Ti, TiN, Pt, etc.) and may be formed by ALD or any suitable deposition process. For example, the first contact material layer 232 in the respective first trench 910T' is in direct contact with the top surface 201*a* of the lower insulating layer 201, the inner sidewalls 203*s* of the upper insulating material pattern 2032, and the inner sidewalls 204*s* of the channel material pattern 2042. The thickness 232T of the respective first contact material layer 232 may be in a range of about 1 nm to about 20 nm.

Figure 45:
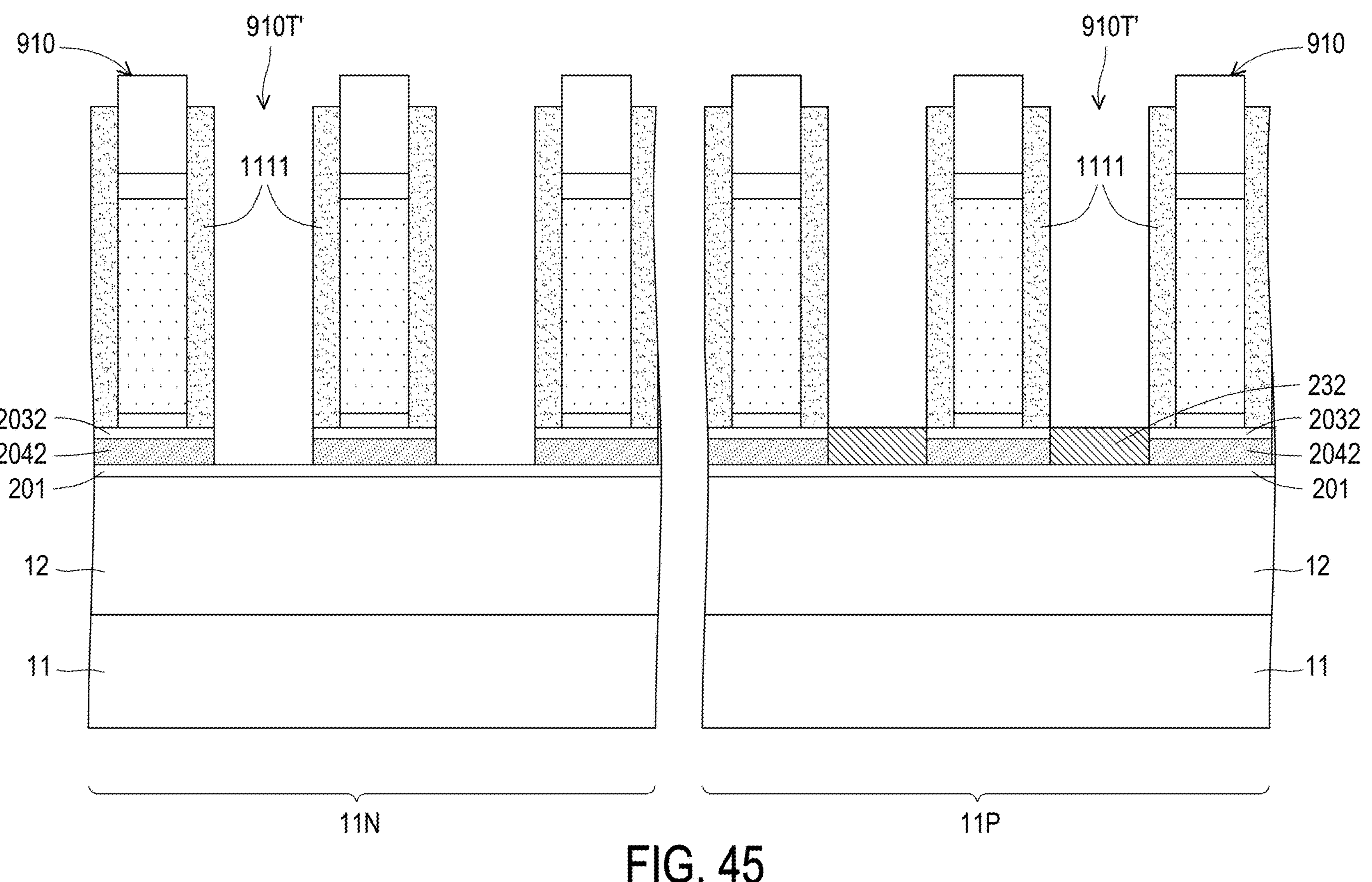
Figure 46:
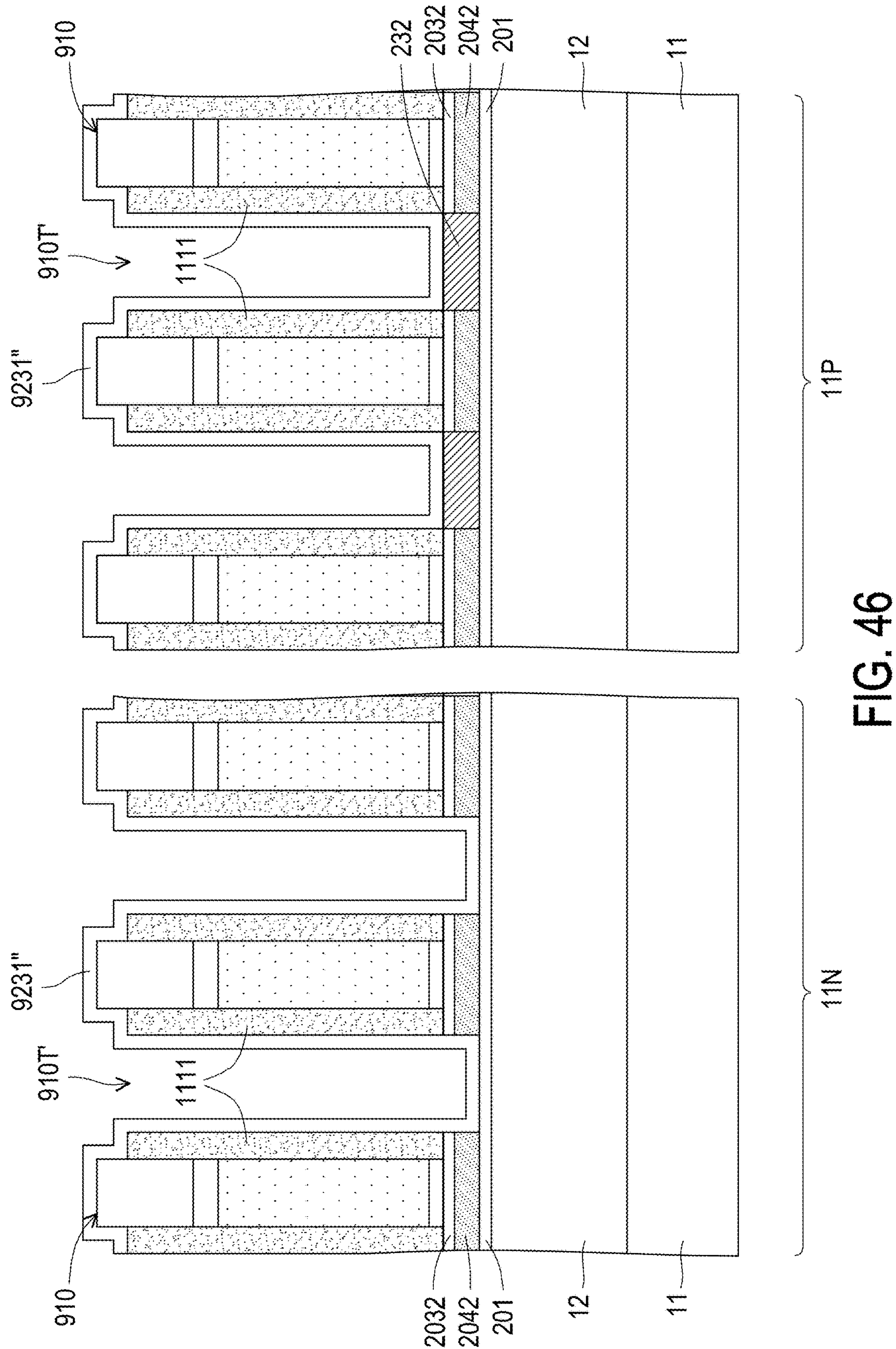

Referring to FIGS. 45-46 and with reference to FIG. 44, after forming the first contact material layers 232 on the second region 11P, the first sacrificial material 9231' left on the first region 11N may be removed by etching or any suitable removal process. Next, a first sacrificial material 9231" may be conformally formed on the remaining structures and within the first trenches 910T' over the semiconductor substrate 11 on both of the first region 11N and the second region 11P. The formation and the material of the first sacrificial material 9231" may be similar to those of the first sacrificial material 9231'. For example, a portion of the first sacrificial material 9231" is formed in the first trenches 910T' on the first region 11N to cover the lower insulating layer 201 and the spacer films 1111, and the other portion of the first sacrificial material 9231" is formed in the first trenches 910T' on the second region 11P to cover the first contact material layers 232 and the spacer films 1111.

Figure 47:
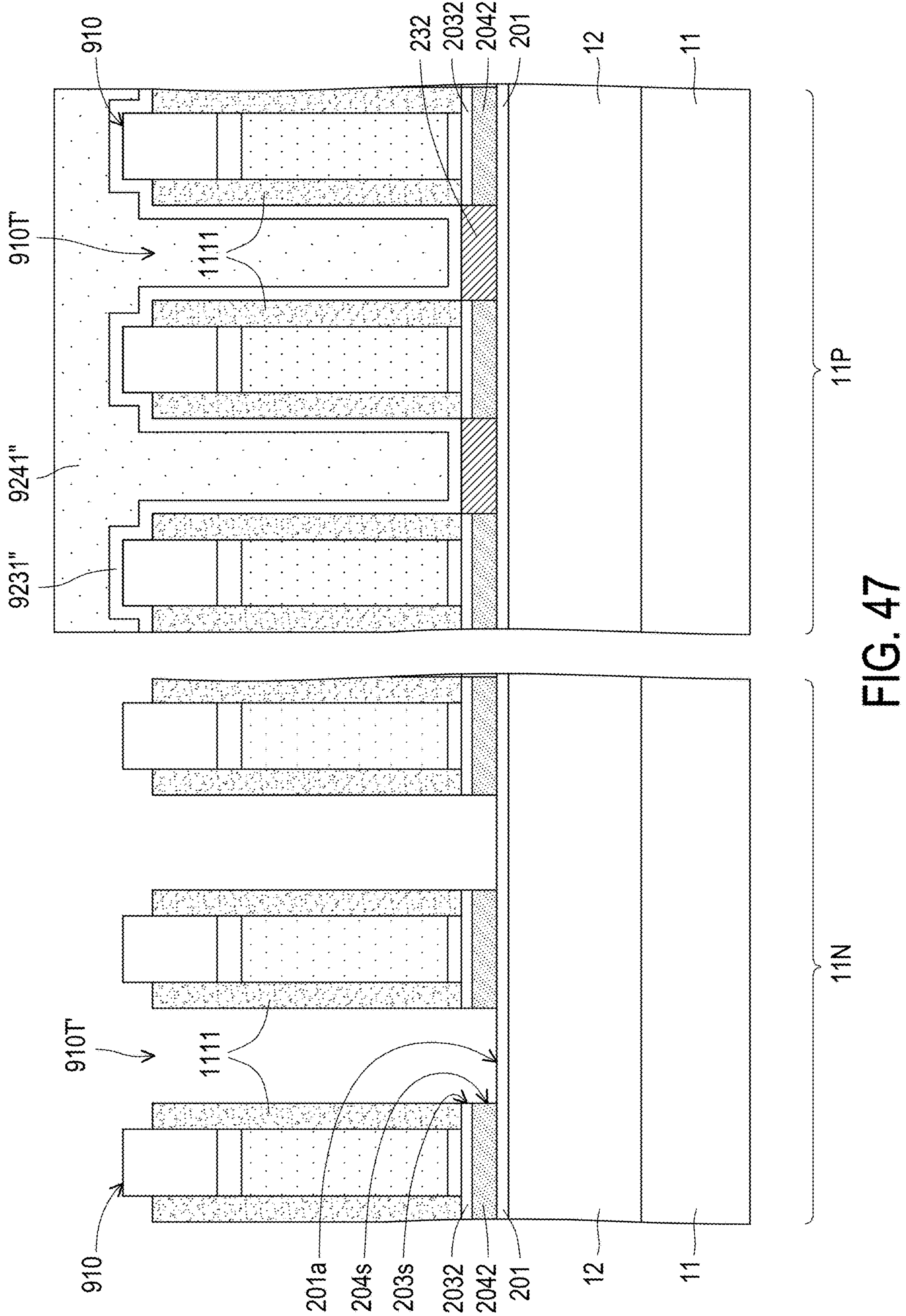

Referring to FIG. 47 and with reference to FIG. 46, a second sacrificial mask layer 9241" may be formed on the second region 11P to cover a portion of the first sacrificial material 9231" and fill the first trenches 910T' on the second region 11P. The material and the formation of the second sacrificial mask layer 9241" may be similar to those of the first sacrificial material 9241 described in FIG. 8. Subsequently, a portion of the first sacrificial material 9231" on the first region 11N may be removed by an etching process or any suitable technique. On the first region 11N, the dummy structures 910, the top surface 201*a* of the lower insulating layer 201 within the first trenches 910T', the inner sidewalls 203*s* of the upper insulating material pattern 2032, and the inner sidewalls 204*s* of the channel material pattern 2042 may be accessibly revealed.

Figure 48:
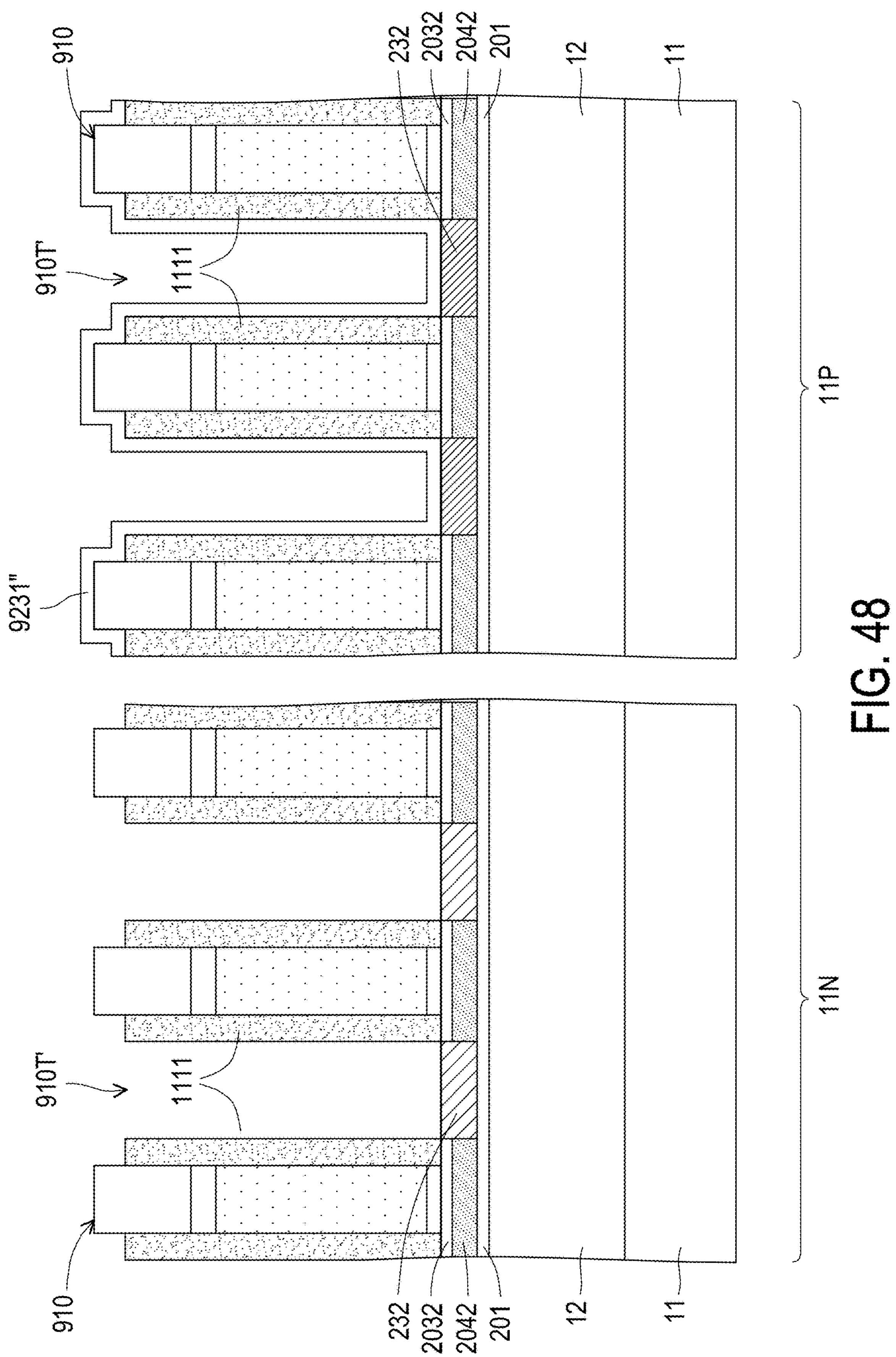
Figure 49:
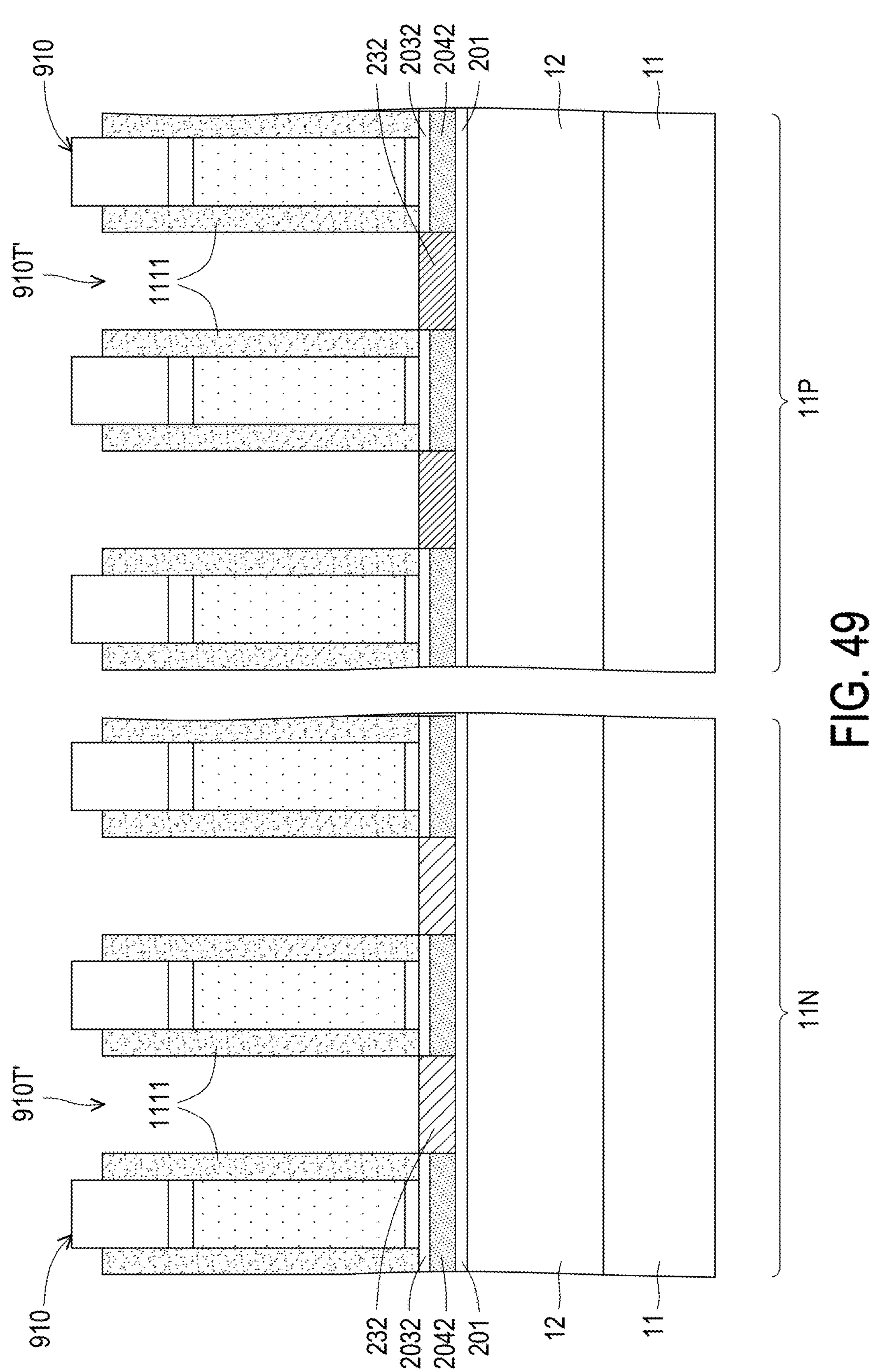

Referring to FIGS. 48-49 and with reference to FIG. 47, the first contact material layers 232 may be formed on the lower insulating layer 201 within the first trenches 910T' on the first region 11N. For example, the second sacrificial mask layer 9241" formed on the second region 11P is removed, and then an epitaxial growth process is performed to form the first contact material layers 232 within the first trenches 910T' on the first region 11N. The first contact material layer 232 on the first region 11N may be in direct contact with the top surface 201*a* of the lower insulating layer 201, the inner sidewalls 203*s* of the upper insulating material pattern 2032, and the inner sidewalls 204*s* of the channel material pattern 2042. The first contact material layers 232 on the first region 11N may be the same as or similar to the first contact material layers 232 on the second region 11P. Examples of suitable first contact material layers 232 on the first region 11N include $MoS_2$, $Mo_4N_5$, or the like. Alternatively, the first contact material layers 232 include metal films (Ti, TiN, Pt, etc.) and may be formed by ALD or any suitable deposition process. In some embodiments, after forming the first contact material layers 232 within the first trenches 910T' on the first region 11N, the first sacrificial material 9231" on the second region 11P may be removed through etching or any suitable removal process, as shown in FIG. 49.

Figure 50:
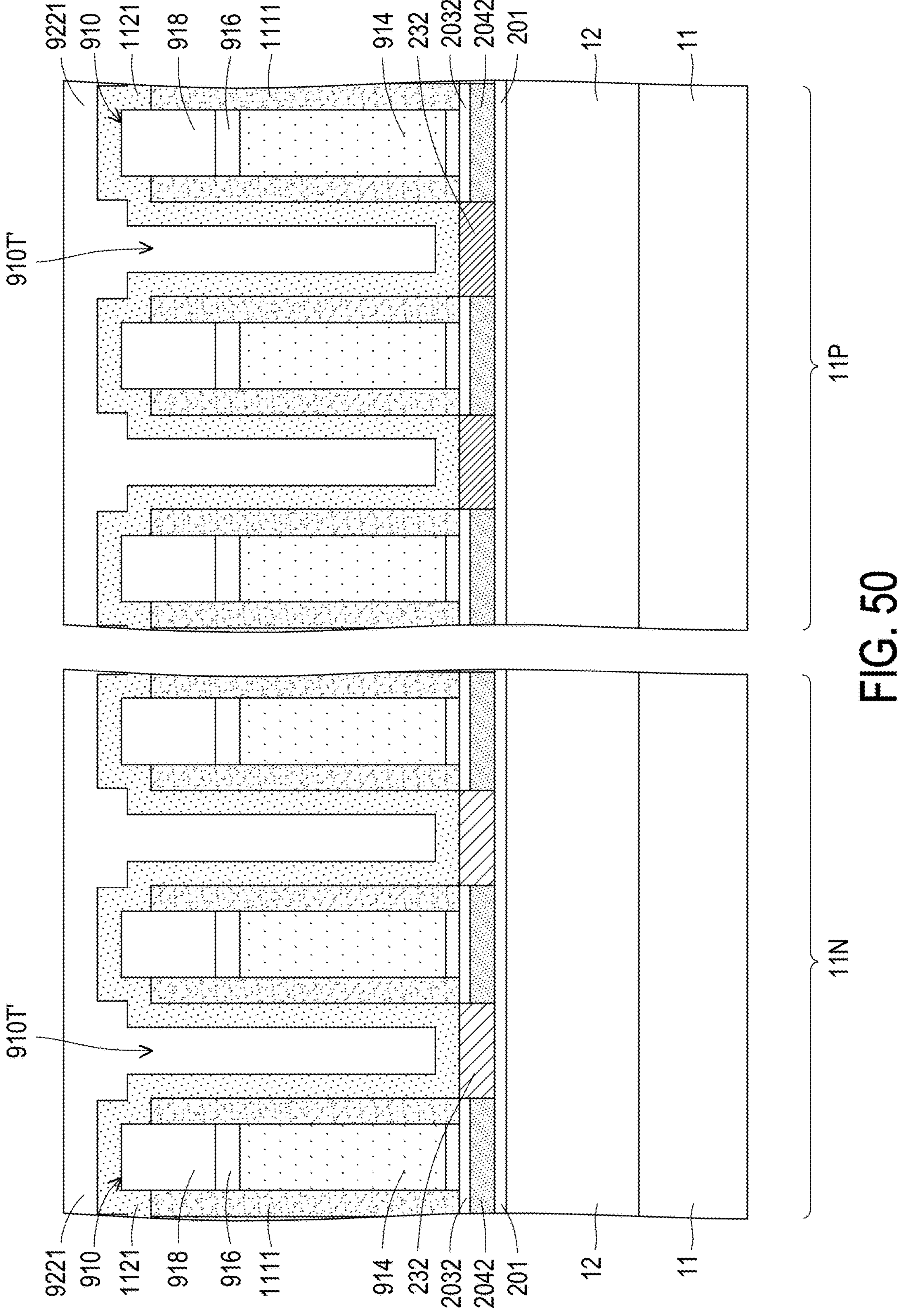

Referring to FIG. 50 and with reference to FIG. 4, the contact etch stop material 1121 may be formed on the remaining structures over the semiconductor substrate 11, and then the first sacrificial material 9221 may be formed on the contact etch stop material 1121. The contact etch stop material 1121 may conformally formed on the dummy structures 910, the spacer films 1111, and the first contact material layers 232 within the first trenches 910T' on both of the first region 11N and the second region 11P. The first sacrificial material 9221 may be formed on the contact etch stop material 1121 and fill the first trenches 910T' on both of the first region 11N and the second region 11P. The formation and materials of the contact etch stop material 1121 and the first sacrificial material 9221 may be similar to those of the contact etch stop material 1121 and the first sacrificial material 9221 described in FIG. 4.

Figure 51:
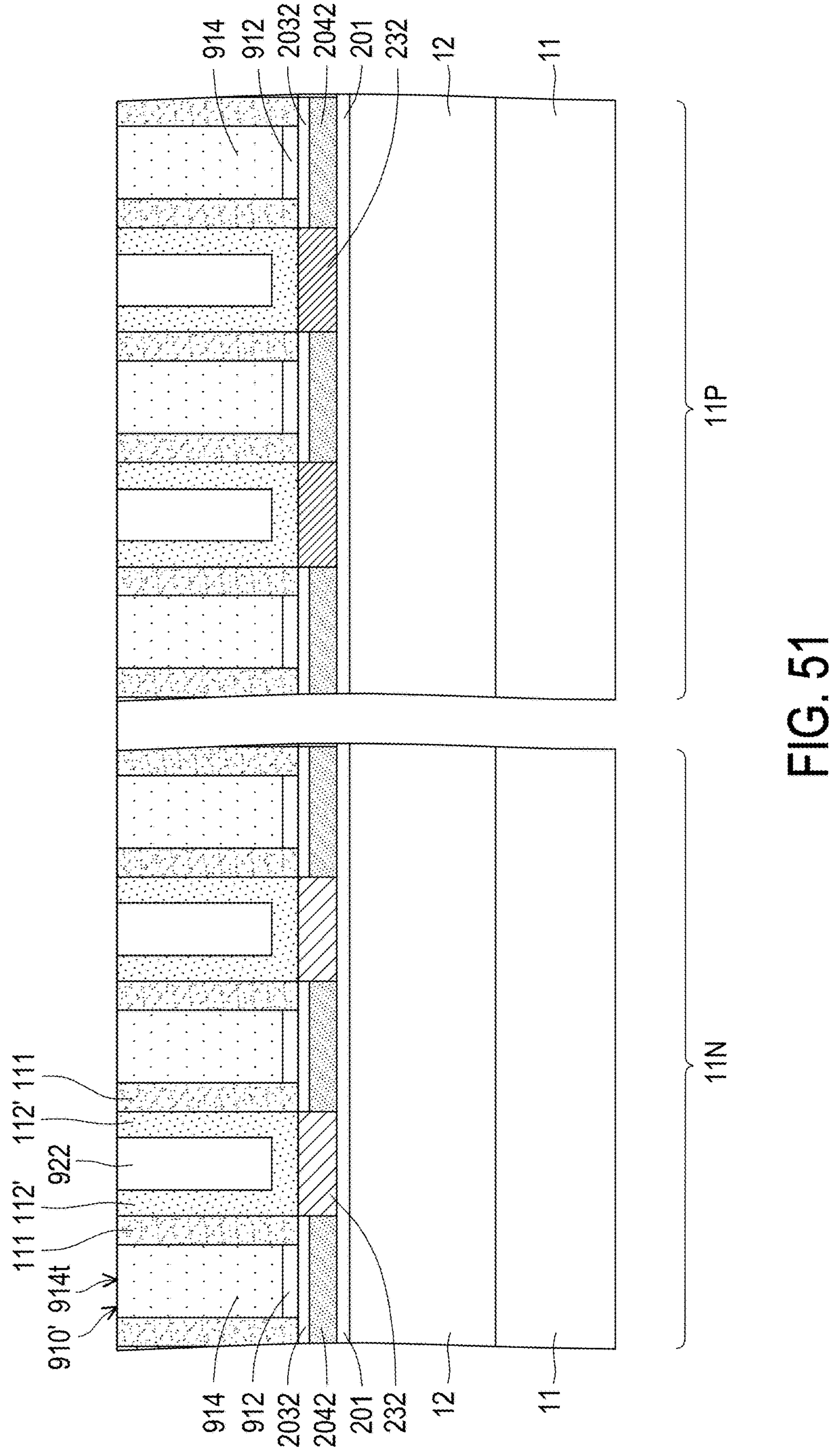
Figure 52:
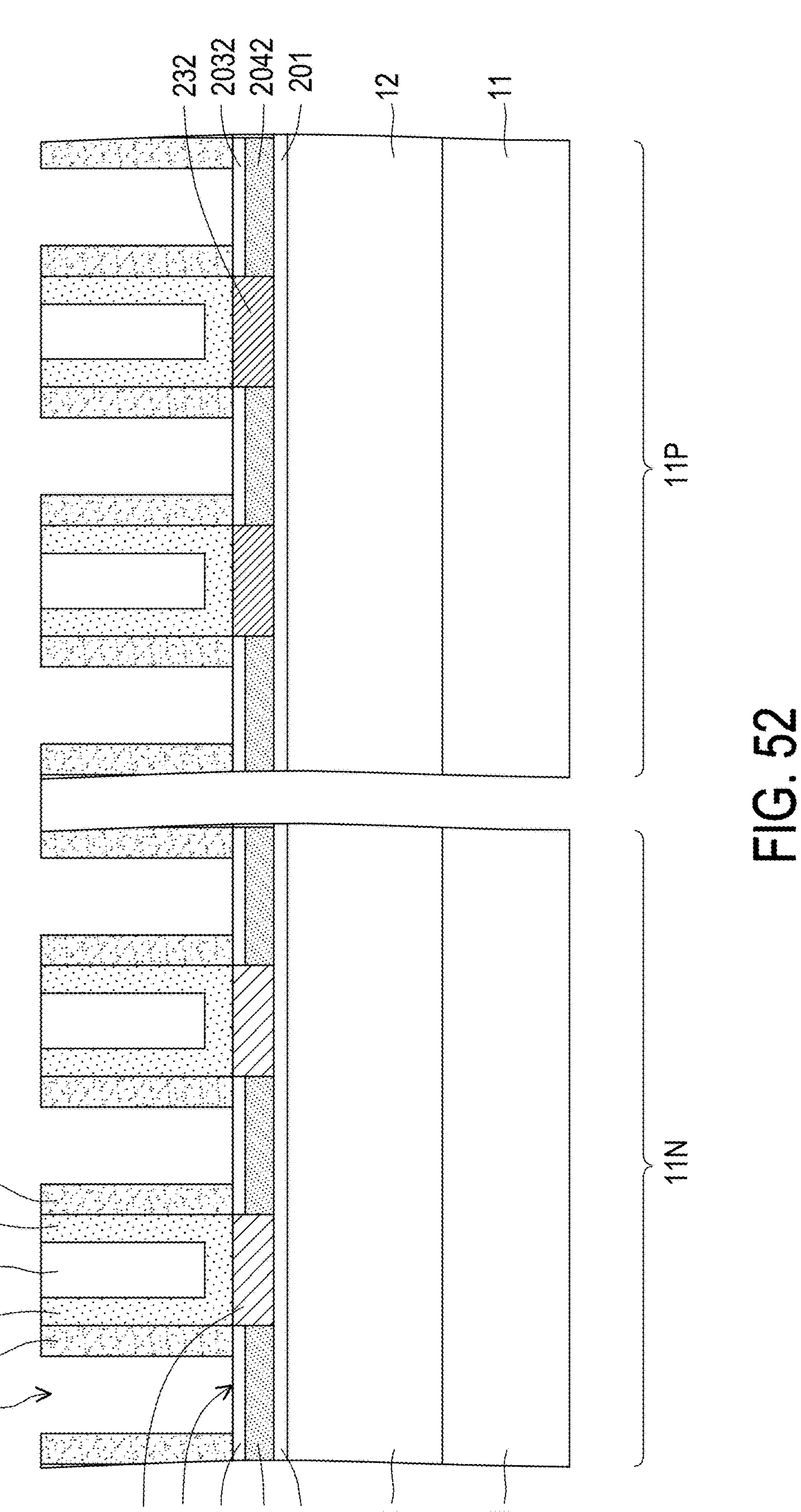

Referring to FIG. 51-52 and with reference to FIG. 50 and FIGS. 5-6, one or a few planarization processes (e.g., CMP, grinding, etching, a combination thereof, etc.) may be performed to form the respective dummy structure 910' having the semiconductor layer 914 with the accessibly exposed top surface 914*t*. The planarization process may be similar to the process described in FIG. 5. In some embodiments, a first planarization process is performed on the first sacrificial material 9221 until the top surface of the etch stop layer 916 is accessibly revealed, and then a second planarization process may be performed on the etch stop layer 916 until the top surface 914*t* of the semiconductor layer 914 of the respective dummy structure 910' is accessibly revealed. The remaining portions of the spacer films 1111, the contact etch stop material 1121, and the first sacrificial material 9221 may be respectively viewed as a spacer 111, a contact etch stop film 112', and a first sacrificial layer 922. In some embodiments, top surfaces of the spacer 111, the contact etch stop film 112', and the first sacrificial layer 922 are substantially leveled (e.g., coplanar) with the top surface 914*t* of the semiconductor layer 914, within process variations. Next, the dummy structures 910' may be removed to form second trenches 920T through one or a few etching processes. The removal of the dummy structures 910' may be similar to the process described in FIG. 6. Thereafter, the top surface of the upper insulating material pattern 2032 within the second trenches 920T on both of the first region 11N and the second region 11P may be accessibly revealed.

Figure 53:
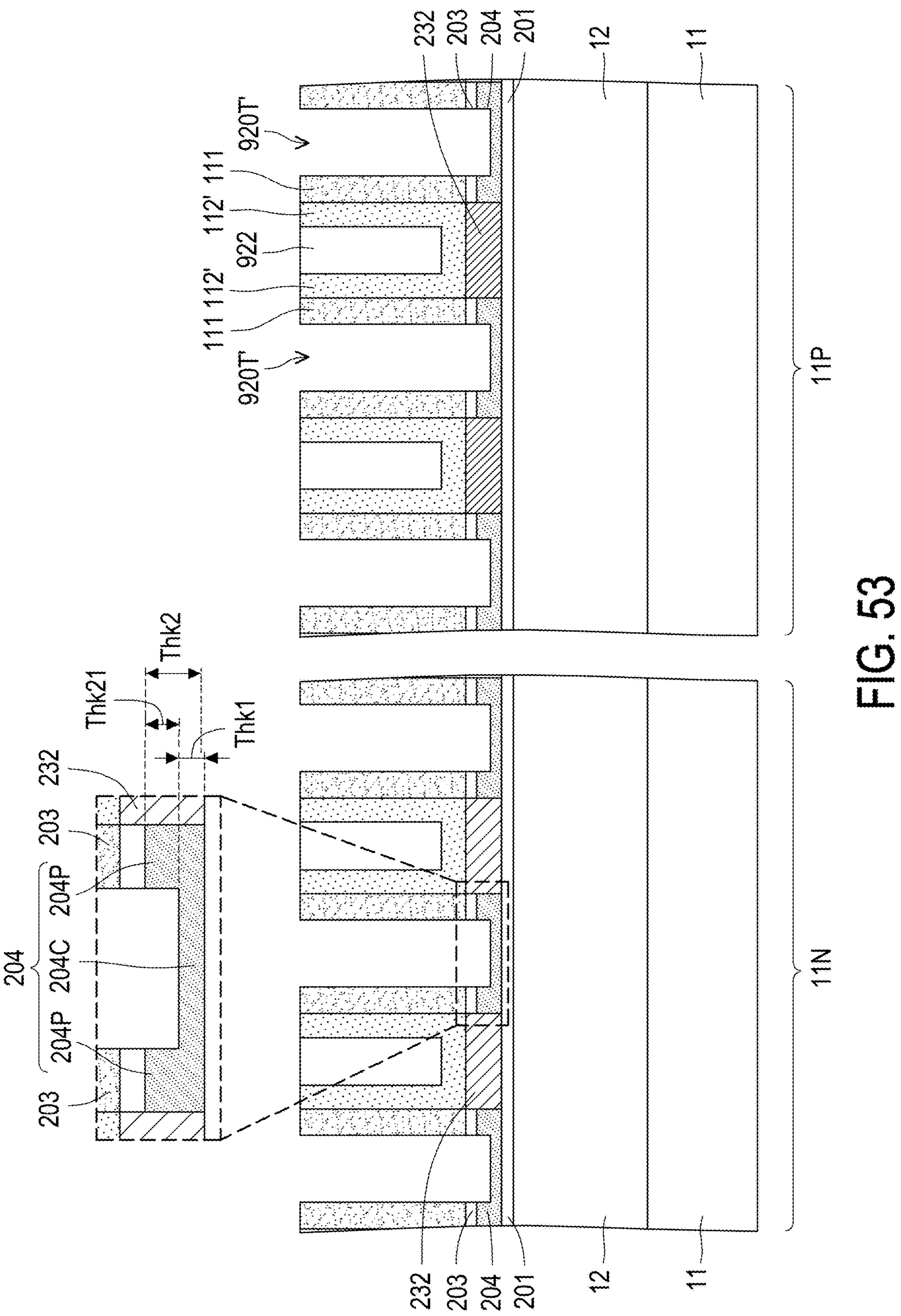

Referring to FIG. 53 and with reference to FIG. 52, a portion of the upper insulating material pattern 2032 within the respective second trench 920T' on both of the first region 11N and the second region 11P may be removed through etching or any suitable process to form an upper insulating pattern 203. In some embodiments, a portion of the channel material pattern 2042 underlying the portion of the upper insulating material pattern 2032 on both of the first region 11N and the second region 11P may be removed through dry etching (e.g., atomic layer etching (ALE) or the like) to recess the top surface of the channel material pattern 2042, thereby forming a channel pattern 204 with a U-shaped cross-section.

In some embodiments, the channel pattern 204 includes a first portion 204C and a second portion 204P connected to the first portion 204C. For example, the first portion 204C is a central portion of the channel pattern 204 and the second portion 204P is a peripheral portion of the channel pattern 204 surrounding the central portion. Given its final structure, the first portion 204C may be viewed as an under-gate portion and the second portion 204P may be viewed as an under-spacer portion. As shown in FIG. 53, the inner sidewalls of the second portion 204P and the planar top surface of the first portion 204C are accessibly exposed. The first portion 204C has a first thickness Thk1 ranging from about 0.5 nm to about 50 nm. The second portion 204P directly underlying the upper insulating pattern 203 has a second thickness Thk2 greater than a first thickness Thk1 of the first portion 204C. For example, the second thickness Thk2 ranges from about 0.5 nm to about 50 nm. In some embodiments, the first portion 204C includes at least one monolayer and the first thickness Thk1 is non-zero. The difference Thk21 between the second thickness Thk2 and the first thickness Thk1 may be the thickness of at least one monolayer. Depending on the product requirements, the thicknesses of the first portion 204C and the second portion 204P of the channel pattern 204 may vary.

Figure 54:
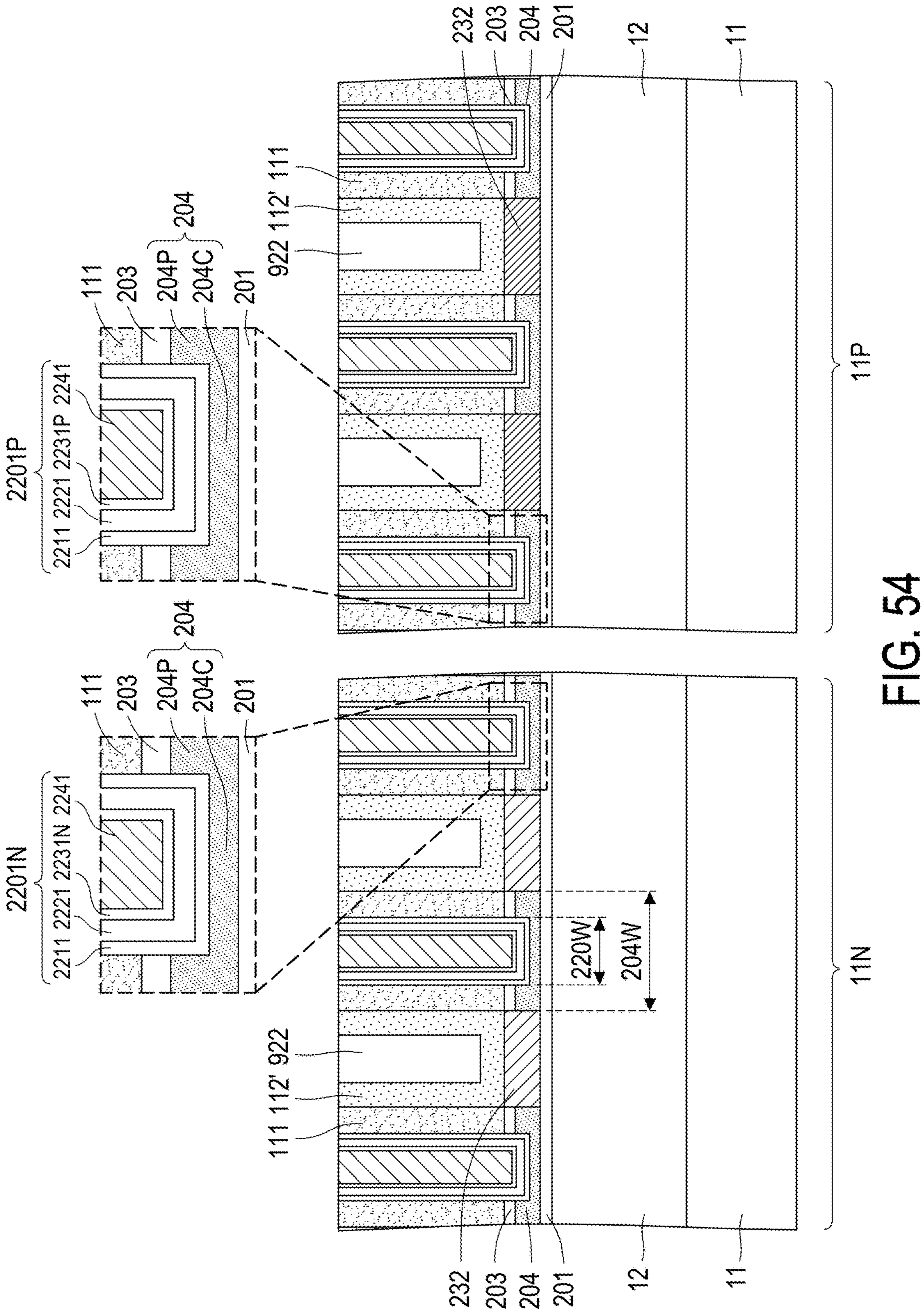

Referring to FIG. 54 and with reference to FIG. 53, the gate material structures (2201N and 2201P) may be formed in the second trenches 920T' on the first region 11N and the second region 11P, respectively. The respective gate material structure (2201N or 2201P) may be directly on the first portion 204C of the channel pattern 204 and laterally covering by the second portion 204P of the channel pattern 204. The maximum width (or bottom width) 204W of the channel pattern 204 may be greater than the maximum width (or bottom width) 220W of the overlying gate material structure (2201N or 2201P). For example, the respective gate material structure 2201N on the first region 11N includes the interfacial material 2211, the gate dielectric material 2221 blanketly formed on the interfacial material 2211, the first work function material 2231N blanketly formed on the gate dielectric material 2221, and the gate material 2241 formed on the first work function material 2231N and filling the corresponding second trench 920T'. The respective gate material structure 2201P on the second region 11P may be similar to the gate material structure 2201N on the first region 11N, except that the first work function material 2231N is replaced with the second work function material 2231P which is different from the first work function material 2231N. The materials and the formation of the gate material structures (2201N and 2201P) may be similar to the materials and the formation of the gate material structures described in FIG. 33.

Figure 55:
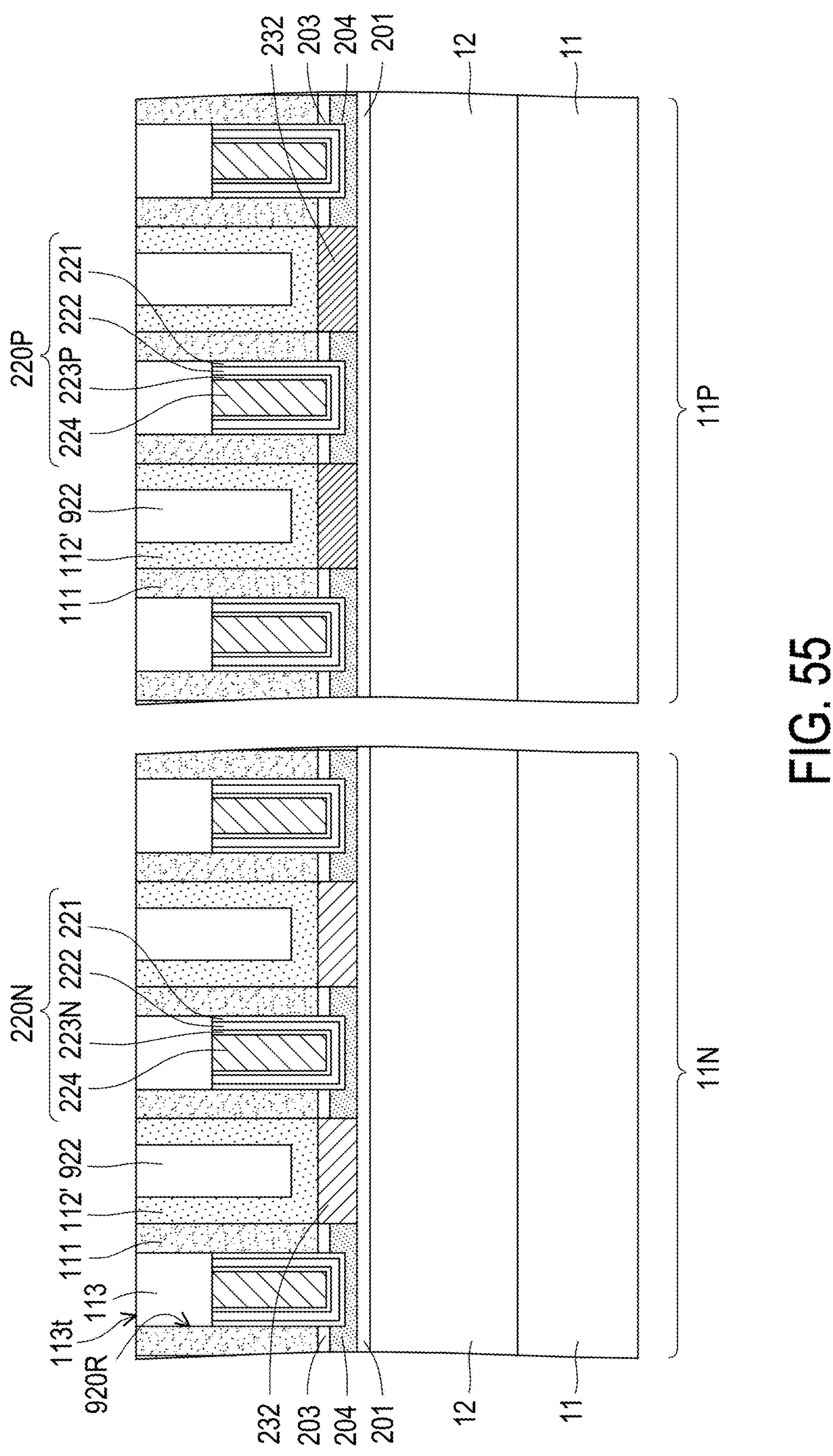

Referring to FIG. 55 and with reference to FIG. 54, the top portion of the respective gate material structure (2201N and 2201P) may be partially removed to form a gate structure (220N and 220P), and the removed region may become the recess 920R surrounded by the spacer 111. The respective gate structure 220N on the first region 11N may include the interfacial layer 221 lining the inner sidewalls of the upper insulating pattern 203, the inner sidewalls of the second portion 204P of the channel pattern 204, and the top surface of the first portion 204C of the channel pattern 204. The gate dielectric layer 222 of the gate structure 220N may be formed on the interfacial layer 221, the first work function layer 223N may be formed on the gate dielectric layer 222, and the gate metal layer 224 may be formed on the first work function layer 223N. The respective gate structure 220P on the second region 11P may be similar to the gate structure 220N on the first region 11N, except that the first work function layer 223N is replaced with the second work function layer 223P. Next, the dielectric layer 113 may be formed on the top surface of the respective gate structure (220N and 220P) and fill the recess 920R. A planarization process may be performed to remove excess materials. The top surface 113*t* of the dielectric layer 113 may be substantially leveled (e.g., coplanar) with the top surfaces of the spacer 111, the contact etch stop film 112', and the first sacrificial layer 922. The formation of the gate structures (220N and 220P) and the formation of the dielectric layer 113 may be similar to the processes described in FIG. 34.

Figure 56:
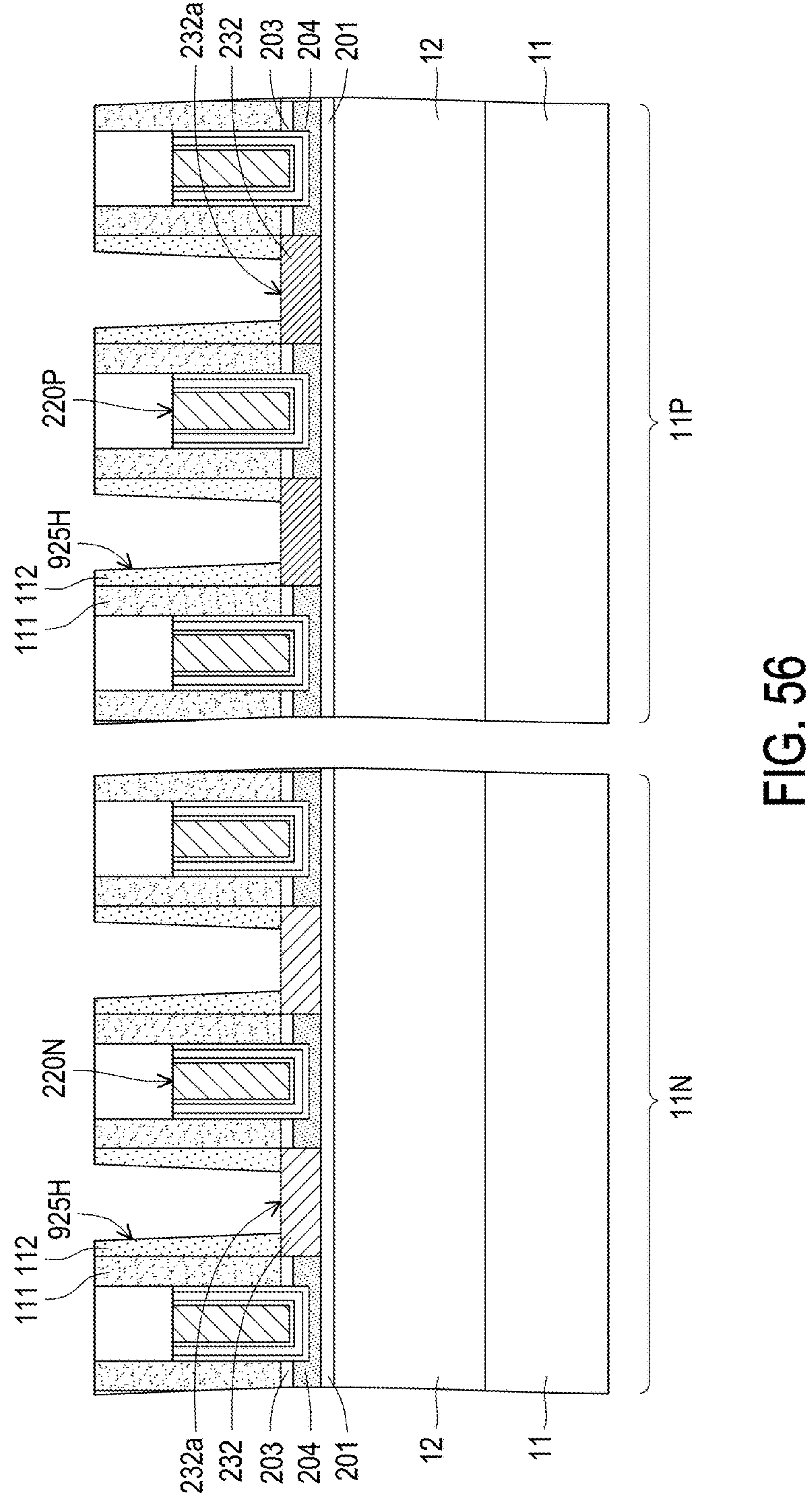

Referring to FIG. 56 and with reference to FIG. 55, the first sacrificial layer 922 and a portion of the contact etch stop film 112' connected to the first sacrificial layer 922 may be removed through one or a few etching process to from the contact holes 925H on both of the first region 11N and the second region 11P. For example, the portion of the contact etch stop film 112' is removed during the etching to form the contact etch stop layer 112 having the tilted sidewalls. The top surface 232*a* of the first contact material layer 232 in the respective contact hole 925H may be accessibly revealed after the etching. The formation of the contact holes 925H may be similar to the process described in FIG. 35.

Figure 57:
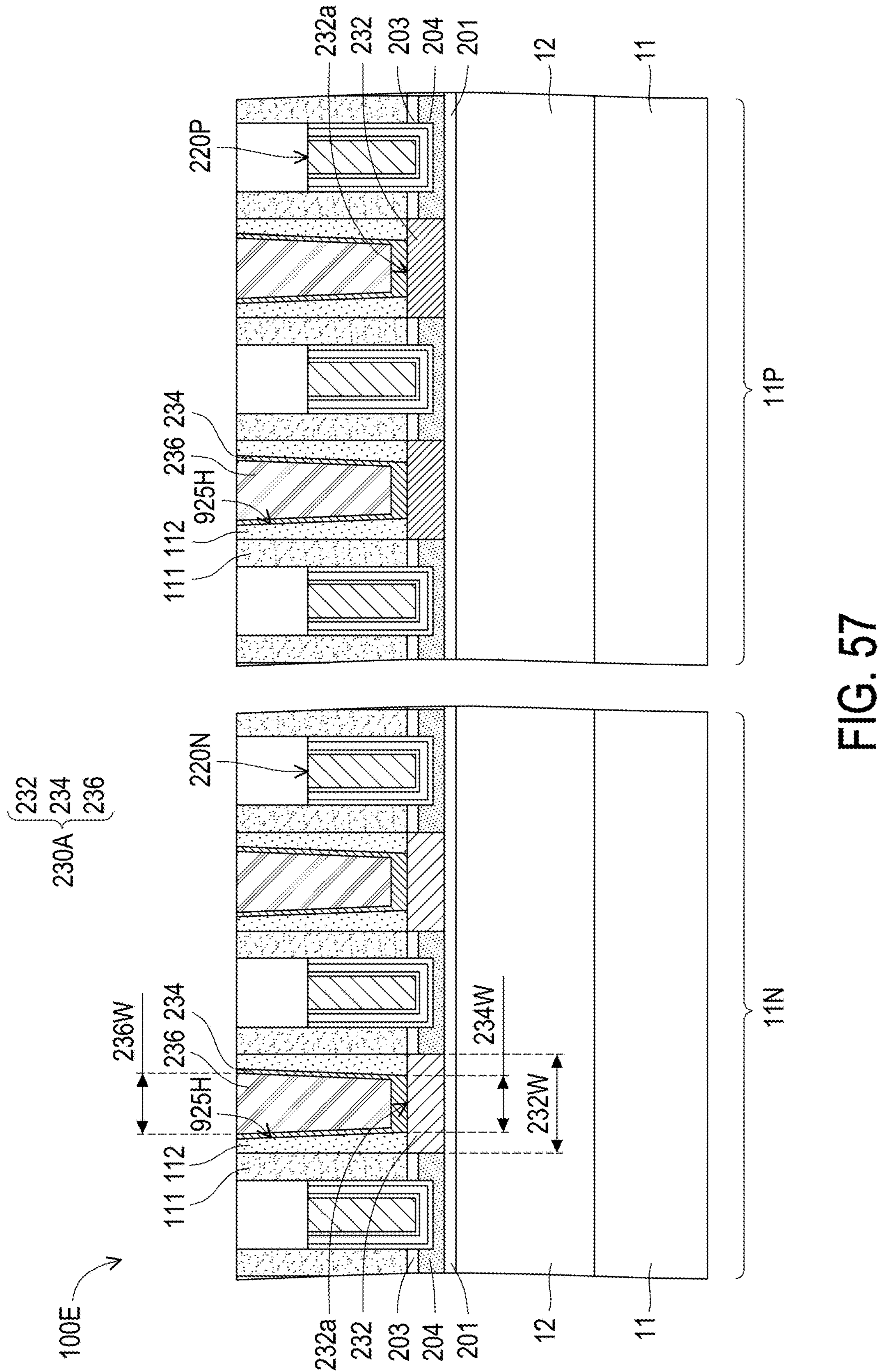

Referring to FIG. 57 and with reference to FIG. 56, a second contact material layer 234 and a contact plug 236 may be sequentially formed in the respective contact hole 925H on both of the first region 11N and the second region 11P. In some embodiments, the second contact material layer 234 is conformally formed on the sidewalls of the contact etch stop layer 112 and the top surfaces 232*a* of the first contact material layer 232. The second contact material layer 234 may be similar to the contact metal as mentioned in the preceding paragraphs. In some embodiments, the second contact material layer 234 acts as a barrier metal. Examples of suitable second contact material layer 234 include Ni, Ti, TiN, $TaS_x$, Ru, a combination thereof, etc. The contact plug 236 may fill the remaining space of the contact hole 925H after forming the second contact material layer 131. Examples of suitable contact plug 236 include W, Ru, Cu, a combination thereof, etc.

The forming processes of the second contact material layer 234 and the contact plug 236 may be similar to the processes described in FIG. 36. A planarization process may be performed to remove excess materials. The maximum width (or the top/bottom width) 232W of the first contact material layer 232 may be greater than the maximum width (or the bottom width) 234W of the second contact material layer 234. The maximum width 232W of the first contact material layer 232 may be greater than the maximum width (or the top width) 236W of the contact plug 236. In some embodiments, the first contact material layer 232, the second contact material layer 234 overlying the first contact material layer 232, and the contact plug 236 formed on the second contact material layer 234 are collectively viewed as a contact structure 230A. As the process proceeds up to here, a plurality of semiconductor devices (e.g., transistors) 100E is formed over the semiconductor substrate 11.

The semiconductor device 100E includes the gate structure (220N or 220P) formed between the two adjacent contact structures 230A, where these two adjacent contact structures 230A may act as source/drain contacts, and the first contact material layer 232 are in lateral and direct contact with the channel pattern 204. The channel pattern 204 of the semiconductor device 100E includes the second portion 204P formed by multi-layered 2D material which facilitates enlarging the process window of avoiding damage on the channel region, lowering the under-spacer resistance, and increasing the contact area in the semiconductor device. The first contact material layer 232 of the contact structure

230A of the semiconductor device 100E is in direct contact with the second portion 204P of the channel pattern 204, where the first contact material layer 232 includes metallic (or semi-metallic) 2D material which facilitates better bonding between the channel region and the contact region and provides improved electrical performance.

Figure 58:
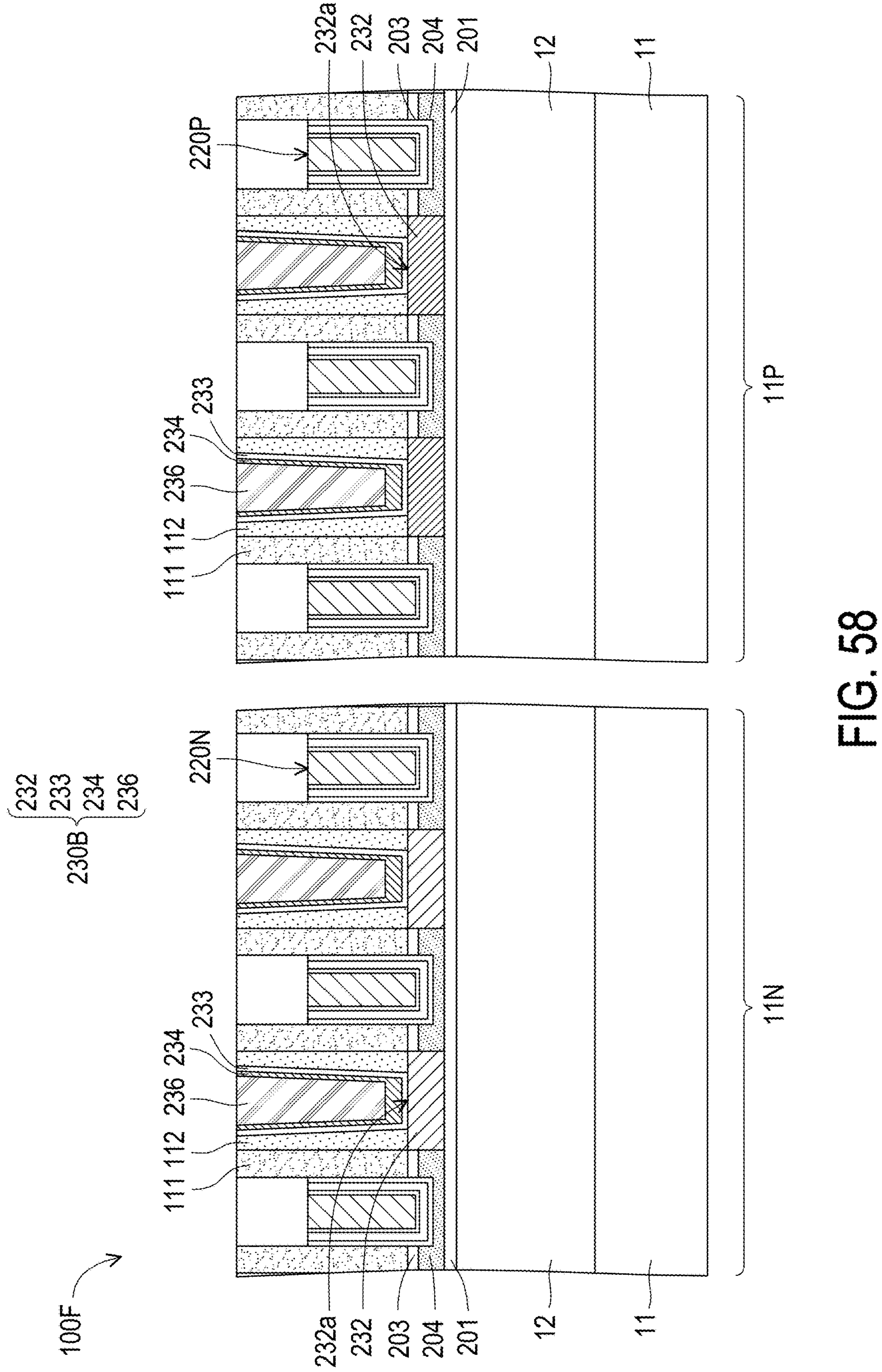
FIGS. 58, 59, and 60 are cross-sectionals view schematically illustrating various semiconductor devices over a semiconductor substrate in accordance with various embodiments.
Figure 59:
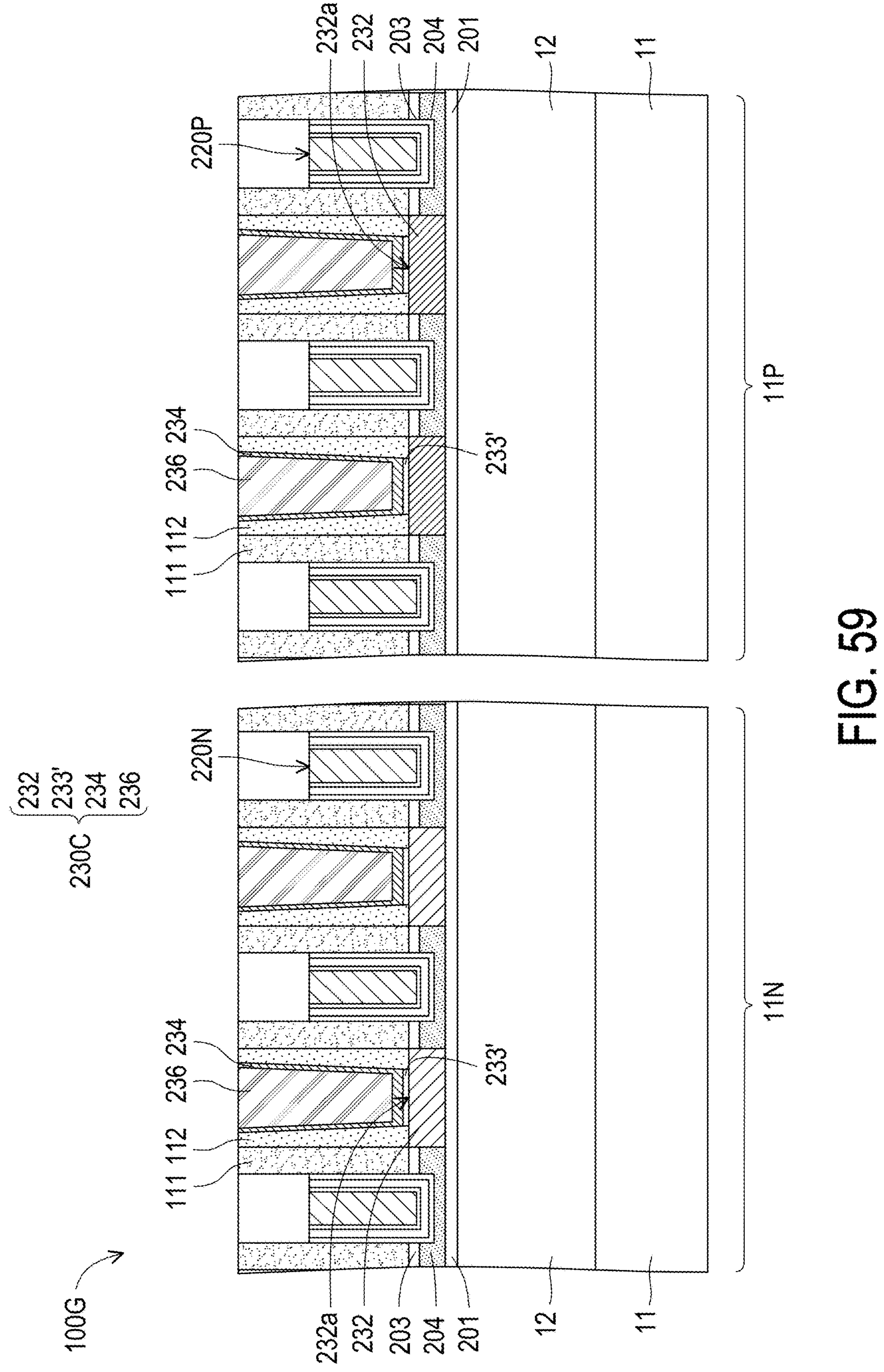
Figure 60:
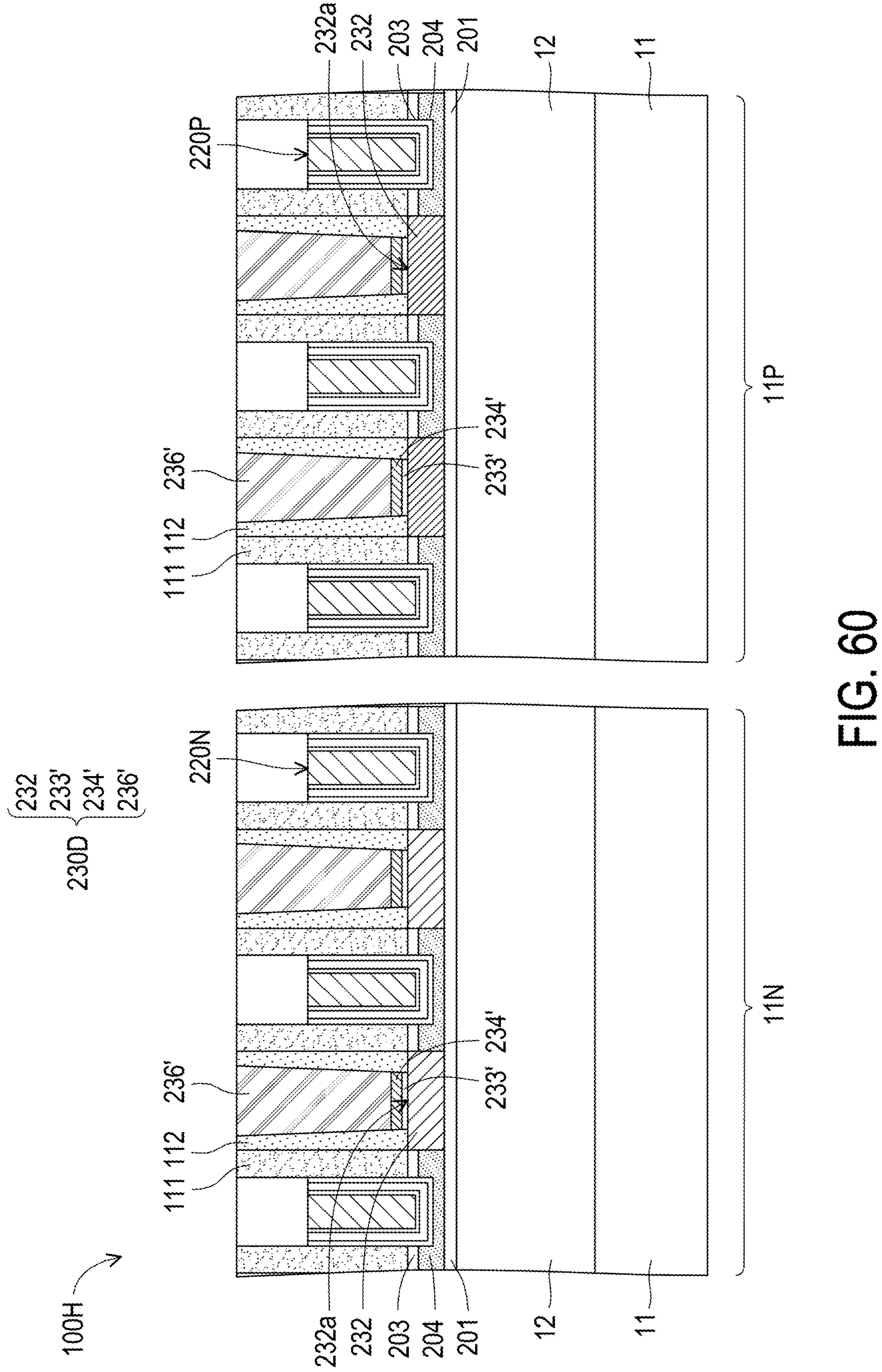

FIGS. 58, 59, and 60 are cross-sectionals view schematically illustrating various semiconductor devices over a semiconductor substrate in accordance with various embodiments. It is noted that like reference numerals refer to like elements as those discussed above with reference to FIG. 57, and the details of the semiconductor device are not repeated for the sake of brevity.

Referring to FIG. 58 and with reference to FIG. 57, a plurality of semiconductor devices (e.g., transistors) 100F may be formed over the semiconductor substrate 11. The semiconductor devices 100F may be similar to the semiconductor devices 100E shown in FIG. 57, except that the respective contact structure 230B includes a third contact material layer 233 underlying the second contact material layer 234. The third contact material layer 233 may be interposed between the first contact material layer 232 and the second contact material layer 234 and may also be interposed between the contact etch stop layer 112 and the second contact material layer 234. For example, the third contact material layer 233 is formed on the top surface 232*a* of the first contact material layer 232 and the sidewalls of the contact etch stop layer 112. In some embodiments, the first contact material layer 232, the second contact material layer 234, and the third contact material layer 233 are of different materials. Examples of suitable third contact material layer 233 include graphene or other suitable material(s) that facilitates reducing the contact resistance. For example, a global growth of graphene is performed on the contact holes to form the third contact material layer 233, and then the second contact material layer 234 may be conformally formed on the third contact material layer 233. Subsequently, the contact plug 236 may be formed on the second contact material layer 234 to fill the rest space of the contact hole.

Referring to FIG. 59 and with reference to FIG. 58, a plurality of semiconductor devices (e.g., transistors) 100G may be formed over the semiconductor substrate 11. The semiconductor devices 100G may be similar to the semiconductor devices 100F shown in FIG. 58, except that the respective contact structure 230C includes a third contact material layer 233' only interposed between the second contact material layer 234 and the first contact material layer 232. For example, a selective growth of graphene is performed on the contact holes to form the third contact material layer 233' on the top surface of the first contact material layer 232, and then the second contact material layer 234 may be conformally formed in the contact hole to cover the sidewalls of the contact etch stop layer 112 and the top surface of the third contact material layer 233'. Subsequently, the contact plug 236 may be formed on the second contact material layer 234 to fill the rest space of the contact hole.

Referring to FIG. 60 and with reference to FIG. 57, a plurality of semiconductor devices (e.g., transistors) 100H may be formed over the semiconductor substrate 11. The semiconductor devices 100H may be similar to the semiconductor devices 100G shown in FIG. 59, except that the second contact material layer 234' of the respective contact structure 230D is disposed between the third contact material layer 233' and the contact plug 236'. The bottom surface of the contact plug 236' may be in direct contact with the second contact material layer 234', and the sidewalls of the contact plug 236' may be in direct contact with the contact etch stop layer 112. For example, a selective growth of graphene is performed on the contact holes to form the third contact material layer 233' on the top surface of the first contact material layer 232, and then the second contact material layer 234' may be deposited on the top surface of the third contact material layer 233'. Subsequently, the contact plug 236' may be formed to fill the contact hole.

Figure 61:
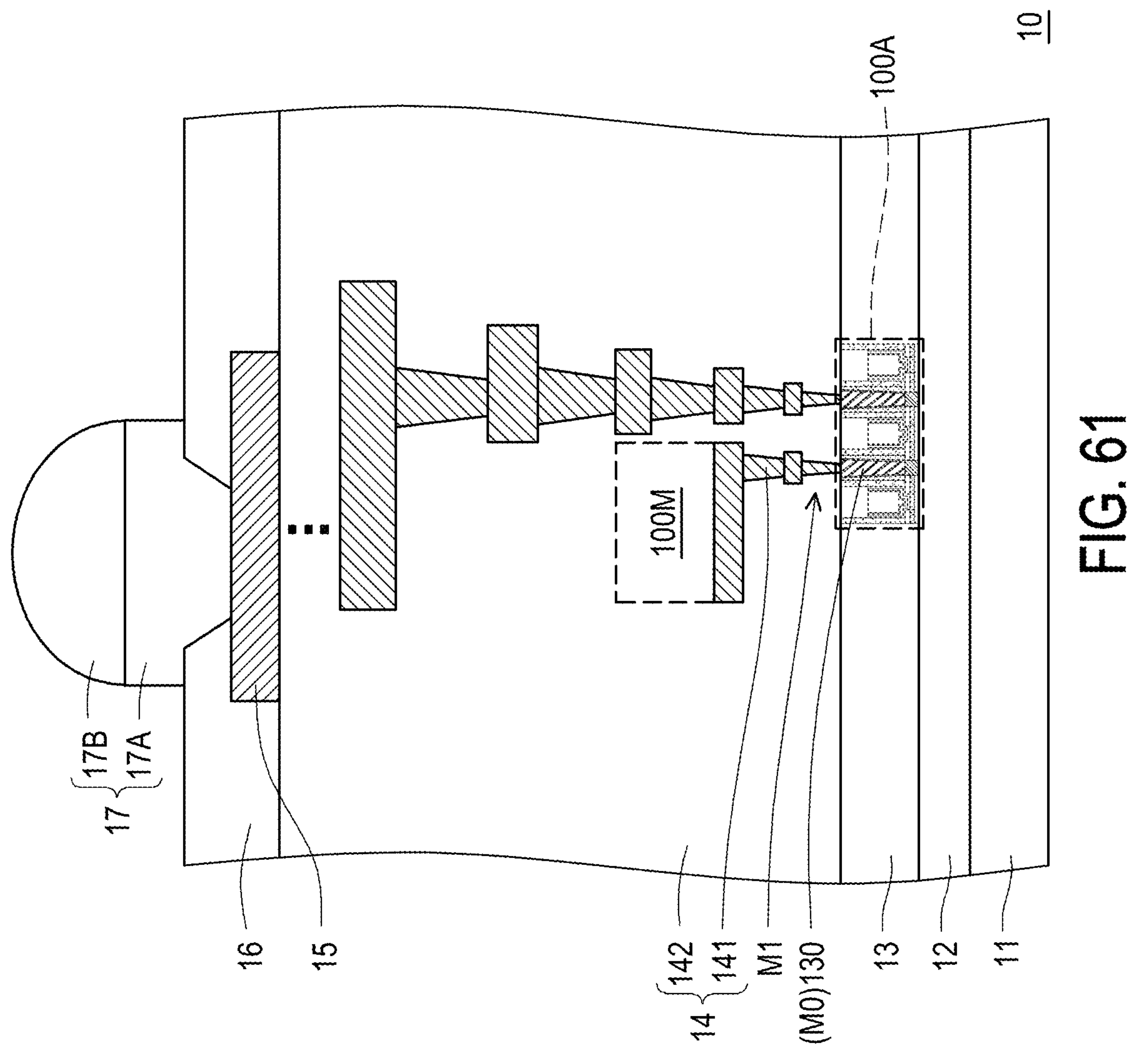
FIG. 61 is a cross-sectional view schematically illustrating a semiconductor structure according to some embodiments.

FIG. 61 is a cross-sectional view schematically illustrating a semiconductor structure according to some embodiments. It is noted that like reference numerals refer to like elements as those discussed above.

Referring to FIG. 61, a semiconductor structure 10 includes the semiconductor devices 100A formed on the bottom dielectric layer 12 which overlies the semiconductor substrate 11. In some embodiments, the semiconductor substrate 11 is free of active/passive device(s), and the semiconductor devices 100A are the bottommost level of devices in the semiconductor structure 10. Alternatively, the semiconductor substrate 11 includes active/passive device(s) formed therein and electrically coupled to the semiconductor devices 100A. In some embodiments, the semiconductor structure 10 includes an inter-layer dielectric (ILD) layer 13 formed on the bottom dielectric layer 12 and covering the semiconductor devices 100A. The ILD layer 13 may include one or more dielectric sublayers formed of materials such as Phospho-Silicate Glass (PSG), Boro-Silicate Glass (BSG), Boron-Doped Phospho-Silicate Glass (BPSG), undoped Silicate Glass (USG), the like, or combinations thereof. Contact structures (or conductive plugs) 130 including the contact metals 131 and contact plug 132 may extend through the ILD layer 13 to electrically and physically couple the transistors 100A. It should be understood that a portion of the contact structures 130 serving as gate contacts may penetrate through the dielectric layer 113 to land on the gate structure (120N or 120P); however, these gate contacts are not illustrated in the cross-sectional view of FIG. 61.

The semiconductor structure 10 may include an interconnect structure 14 formed on the ILD layer 13 and the contact structures 130. The interconnect structure 14 interconnects the semiconductor devices 100A to form an integrated circuit. The interconnect structure 14 may be formed by metallization patterns 141 embedded in one or more dielectric layers 142 on the ILD layer 13. The metallization patterns 141 include metal lines and metal vias formed in the dielectric layers 142, where upper metallization patterns have the thicknesses and widths equal to or greater than the thicknesses and widths, respectively, of lower metallization patterns. In some embodiments, the interconnect structure 14 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). The metallization patterns 141 of the interconnect structure 14 are electrically coupled to the semiconductor devices 100A by the contact structures 130. For example, the symbol "M1" may be used to refer to the metal features in a metal layer M1, while the symbol "M0" may be used to refer to the metal features under metal layer M1. In some embodiments, the contact structures 130 serve as the bottommost metal features M0.

In some embodiments, the semiconductor structure 10 includes a memory cell structure 100M embedded in the dielectric layers 142 of the interconnect structure 14 and electrically connected to the metallization patterns 141 of the interconnect structure 14. In some embodiments, the memory cell structure 100M is electrically coupled to the semiconductor devices 100A through the metallization patterns 141. The semiconductor devices 100A and the memory cell structure 100M may be collectively referred to as a memory device, where the semiconductor devices 100A may act as selective transistors for the memory device. The memory device may be or may include Resistive Random Access Memory (RRAM) device, Dynamic Random Access Memory (DRAM) device, Static Random Access Memory (SRAM) device, Magnetoresistive Random Access Memory (MRAM), or the like. Alternatively, the memory cell structure 100M is omitted or may be replaced with other types of electrical device, and thus the memory cell structure 100M herein is illustrated in dashed lines to indicate it may be (or may not be) present in the semiconductor structure 10.

The semiconductor structure 10 may include at least one contact pad 15, such as aluminum pads, to which external connections are made. The semiconductor structure 10 may include a passivation layer 16 formed on portions of the interconnect structure 14 and the contact pad 15. The passivation layer 16 may include one or more layers of silicon oxide, silicon nitride, silicon oxynitride, the like, or a combination thereof. In some embodiments, the semiconductor structure 10 includes a conductive terminal 17 landing on the contact pad 15 for further electrical connection. For example, a bottom portion 17A of the conductive terminal 17, such as a conductive pillar formed of a metal (e.g., copper) or a metal alloy, extends through the passivation layer 16 to be in contact with the contact pad 15. The conductive terminal 17 optionally includes a cap portion 17B disposed on the bottom portion 17A and including a different material (e.g., solder material) than the underlying bottom portion 17A.

It should be noted that the semiconductor devices 100A may be replaced with other semiconductor devices (e.g., 100B in FIG. 36, 100C in FIG. 37, 100D in FIG. 38, 100E in FIG. 57, 100F in FIG. 58, 100G in FIG. 59, 100H in FIG. 60, combinations thereof) discussed elsewhere in the disclosure. In some embodiments, the semiconductor structure 10 is implemented as an integrated circuit die such as a logic die (e.g., central processing unit (CPU), graphics processing unit (GPU), system-on-a-chip (SoC), application processor (AP), microcontroller, etc.), a memory die (e.g., DRAM die, SRAM die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor structure 10 is a part of an interposer, a part of an integrated circuit package, etc.

According to some embodiments, a transistor includes a gate structure, a channel layer underlying the gate structure and comprising a 2D material, source/drain contacts laterally spaced apart from the gate structure and disposed laterally next to the channel layer, and a spacer laterally interposed between the gate structure and the source/drain contacts. In some embodiments, the transistor further includes an intermediate contact pattern laterally adjoining the channel layer and disposed below the spacer and the gate structure, the source/drain contacts are laterally adjoining the intermediate contact pattern, and the intermediate contact pattern includes another 2D material. In some embodiments, the channel layer includes a first portion and a second portion connected to the first portion, and the first portion underlying the gate structure has a first thickness less than a second thickness of the second portion below the spacer. In some embodiments, each of the source/drain contacts includes a first contact material layer laterally adjoining the channel layer and a second contact material layer disposed on the first contact material layer, wherein the first contact material layer includes semi-metallic 2D material. In some embodiments, the first contact material layer includes a maximum width greater than a maximum width of the second contact material layer. In some embodiments, each of the source/drain contacts further includes a third contact material layer interposed between the first contact material layer and the second contact material layer, and a material of the third contact material layer is different from that of the first contact material layer and the second contact material layer.

According to some embodiments, a semiconductor device includes a gate structure, source/drain contacts laterally spaced apart from the gate structure, a channel layer underlying an inner portion of the gate structure, and an intermediate contact pattern underlying an outer portion of the gate structure and adjoining the channel layer. An inner sidewall of the intermediate contact pattern is in contact with the channel layer, an outer sidewall of the intermediate contact pattern is in contact with the source/drain contacts, and the intermediate contact pattern includes a first 2D material.

In some embodiments, the channel layer includes a second 2D material that is different from the first 2D material. In some embodiments, a maximum lateral dimension of the gate structure is greater than that of the channel layer. In some embodiments, the gate structure includes a T-shaped cross section with a protruding bottom portion landing on the channel layer. In some embodiments, the semiconductor device further includes an upper insulating pattern interposed between the intermediate contact pattern and the outer portion of the gate structure. In some embodiments, the semiconductor device further includes a lower insulating layer underlying the intermediate contact pattern and the channel layer, and a sidewall of the lower insulating layer is in contact with the source/drain contacts. In some embodiments, the outer portion of the gate structure is in direct contact with a top surface of the intermediate contact pattern.

According to some alternative embodiments, a semiconductor structure includes a semiconductor substrate, a transistor disposed over the semiconductor substrate, and a bottom dielectric layer overlying the semiconductor substrate. The transistor includes a gate structure, a channel layer underlying the gate structure, an intermediate contact pattern underlying the gate structure and laterally adjoining the channel layer, and source/drain contacts laterally coupled to the intermediate contact pattern. The intermediate contact pattern includes a first 2D material, and the bottom dielectric layer separates the channel layer and the intermediate contact pattern from the semiconductor substrate.

In some embodiments, an inner portion of the gate structure overlaps the channel layer and an outer portion of the gate structure overlaps the intermediate contact pattern. In some embodiments, a top width of a gate metal layer of the gate structure is greater than a top width of the channel layer. In some embodiments, the channel layer includes a second 2D material that is different from the first 2D material. In some embodiments, the transistor further includes an upper insulating pattern overlying the intermediate contact pattern and laterally covering a protruding bottom portion of the gate structure. In some embodiments, a bottom surface of the gate structure is substantially planar and is in direct contact with the channel layer and the intermediate contact pattern. In some embodiments, the semiconductor structure further includes an interconnect structure disposed over the semiconductor substrate, a dielectric layer of the interconnect structure covers the transistor, and a metallization pattern of the interconnect structure is electrically coupled to the transistor.

According to some alternative embodiments, a manufacturing method of a semiconductor structure includes at least the following steps. An intermediate contact pattern with a gap is formed on a bottom dielectric layer overlying a semiconductor substrate, where the intermediate contact pattern includes a first 2D material. A channel layer is formed in the gap of the intermediate contact pattern. A gate structure is formed on the channel layer and the intermediate contact pattern, and source/drain contacts are formed on the bottom dielectric layer to be laterally coupled to the intermediate contact pattern.

In some embodiments, the manufacturing method further includes forming a layer of the first 2D material on the bottom dielectric layer; forming a spacer on a sidewall of a dummy structure on the layer of the first 2D material; removing the dummy structure after forming the spacer; and removing a portion of the layer of the first 2D material to form the intermediate contact pattern with the gap, where the portion of the layer of the first 2D material is accessibly exposed after removing the dummy structure. In some embodiments, forming the channel layer includes performing a selective growth process to form a second 2D material in the gap of the intermediate contact pattern, where the second 2D material is different from the first 2D material. In some embodiments, the manufacturing method further includes forming a layer of the first 2D material on the bottom dielectric layer; forming a layer of an upper insulating material on the layer of the first 2D material; and removing a portion of the upper insulating material and a portion of the layer of the first 2D material underlying the portion of the upper insulating material to respectively form an upper insulating pattern and the intermediate contact pattern underlying the upper insulating pattern.

In some embodiments, forming the gate structure includes sequentially forming layers of gate material structure on the upper insulating pattern and the channel layer, wherein a bottom portion of the layers of gate material structure lands on the channel layer and is laterally surrounded by the upper insulating pattern. In some embodiments, forming the gate structure includes forming an interfacial layer directly on top surfaces of the intermediate contact pattern and the channel layer; and sequentially forming a gate dielectric layer, a work function layer, and a gate metal layer on the interfacial layer. In some embodiments, the semiconductor substrate includes an n-type field-effect transistor (FET) region and a p-type FET region, and forming the intermediate contact pattern and the channel layer includes forming a layer of the first 2D material on the n-type FET region and the p-type FET region; removing a portion of the layer of the first 2D material to form the intermediate contact pattern with the gap on the p-type FET region; forming a second 2D material in the gap of the intermediate contact pattern on the p-type FET region, while the n-type FET region remains covered by the layer of the first 2D material; removing another portion of the layer of the first 2D material to form the intermediate contact pattern with the gap on the n-type FET region; and forming the second 2D material in the gap of the intermediate contact pattern on the n-type FET region, where an inner sidewall of the intermediate contact pattern is in contact with the second 2D material, and after forming the source/drain contacts, an outer sidewall of the intermediate contact pattern is in contact with the source/drain contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:

a gate structure;

a spacer laterally surrounding the gate structure;

a channel layer underlying the gate structure and comprising a two-dimensional (2D) material;

a source/drain (S/D) contact laterally separated from the gate structure by the spacer and laterally coupled to the channel layer; and an intermediate contact pattern laterally adjoining the channel layer and disposed below the spacer and the gate structure, wherein the S/D contact is laterally coupled to the channel layer through the intermediate contact pattern, and the intermediate contact pattern comprises a different 2D material than the 2D material of the channel layer.

2. The transistor of claim 1, further comprising:

a capping dielectric layer disposed on the gate structure, wherein the spacer extends along the gate structure and the capping dielectric layer.

3. The transistor of claim 1, wherein the gate structure is in direct contact with the intermediate contact pattern and the channel layer.

4. The transistor of claim 1, wherein an interface of the channel layer and the intermediate contact pattern is disposed below the gate structure.

5. The transistor of claim 1, wherein the S/D contact comprises a first contact material layer laterally adjoining the intermediate contact pattern and a second contact material layer disposed on the first contact material layer.

6. The transistor of claim 5, wherein the first contact material layer of the S/D contact is thicker than the intermediate contact pattern.

7. The transistor of claim 5, wherein the second contact material is laterally surrounded by the first contact material layer.

8. The transistor of claim 5, further comprising:

a contact etch stop layer laterally surrounding the first contact material layer of the S/D contact.

9. The transistor of claim 1, further comprising:

an insulating pattern interposed between the gate structure and the intermediate contact pattern.

10. A semiconductor structure, comprising:

a semiconductor substrate;

a transistor disposed over the semiconductor substrate and comprising:

a gate structure;

a channel layer underlying the gate structure and comprising a first 2D material;

a S/D contact laterally coupled to the channel layer;

an intermediate contact pattern underlying the gate structure and laterally coupling the channel layer to the S/D contact, and the intermediate contact pattern comprising a second 2D material different from the first 2D material; and a bottom dielectric layer overlying the semiconductor substrate and separating the channel layer from the semiconductor substrate.

11. The semiconductor device of claim 10, wherein a bottom surface of the gate structure is substantially planar and is in direct contact with the channel layer.

12. The semiconductor device of claim 10, further comprising:

an interconnect structure disposed over the semiconductor substrate, a dielectric layer of the interconnect structure covering the transistor, and a metallization pattern of the interconnect structure being electrically coupled to the transistor.

13. The semiconductor device of claim 10, wherein the transistor further comprises:

a spacer disposed on the intermediate contact pattern and extending along a sidewall of the gate structure.

14. The semiconductor structure of claim 10, wherein an inner portion of the gate structure overlaps the channel layer and an outer portion of the gate structure overlaps the intermediate contact pattern.

15. The semiconductor structure of claim 10, wherein the transistor further comprises:

an insulating pattern interposed between the gate structure and the intermediate contact pattern.

16. The semiconductor structure of claim 10, wherein the S/D contact comprises a first contact material layer laterally coupled to the channel layer intermediate contact pattern and a second contact material layer overlying the first contact material layer, and the first contact material layer is wider than the second contact material layer.

17. A semiconductor device, comprising:

a gate structure;

a S/D contact laterally spaced apart from the gate structure;

a channel layer underlying an inner portion of the gate structure; and an intermediate contact pattern underlying an outer portion of the gate structure and laterally encircling the channel layer, wherein the intermediate contact pattern is laterally connected to the S/D contact and comprises a first 2D material, and an interface is present between the channel layer and the intermediate contact pattern.

18. The semiconductor device of claim 17, wherein the channel layer comprises a second 2D material different from the first 2D material.

19. The semiconductor device of claim 17, wherein a maximum lateral dimension of the gate structure is greater than that of the channel layer.

20. The semiconductor device of claim 17, wherein the outer portion of the gate structure is in direct contact with the intermediate contact pattern.

* * * * *